(12) United States Patent
Matsumoto et al.

(10) Patent No.: US 9,860,960 B2
(45) Date of Patent: Jan. 2, 2018

(54) ORGANIC EL DISPLAY DEVICE AND METHOD FOR PRODUCTION OF THE SAME

(75) Inventors: Toshiki Matsumoto, Kanagawa (JP); Tadahiko Yoshinaga, Kanagawa (JP)

(73) Assignee: JOLED INC., Tokyo (JP)

( * ) Notice: Subject to any disclaimer, the term of this patent is extended or adjusted under 35 U.S.C. 154(b) by 98 days.

(21) Appl. No.: 13/282,772

(22) Filed: Oct. 27, 2011

(65) Prior Publication Data
US 2012/0112173 A1    May 10, 2012

(30) Foreign Application Priority Data
Nov. 5, 2010 (JP) ................................ 2010-249205

(51) Int. Cl.
*H01L 51/54* (2006.01)
*H01L 51/56* (2006.01)
*H05B 33/10* (2006.01)
*H01L 27/32* (2006.01)
*H01L 51/00* (2006.01)
*H01L 51/50* (2006.01)

(52) U.S. Cl.
CPC .......... *H05B 33/10* (2013.01); *H01L 27/3211* (2013.01); *H01L 51/0052* (2013.01); *H01L 51/0058* (2013.01); *H01L 51/0059* (2013.01); *H01L 51/5012* (2013.01); *H01L 27/3246* (2013.01); *H01L 51/5096* (2013.01)

(58) Field of Classification Search
None
See application file for complete search history.

(56) References Cited

U.S. PATENT DOCUMENTS

| | | | |
|---|---|---|---|
| 2006/0029828 A1* | 2/2006 | Kanno et al. | 428/690 |
| 2006/0040137 A1* | 2/2006 | Kambe et al. | 428/690 |
| 2006/0134459 A1* | 6/2006 | Huo et al. | 428/690 |

(Continued)

FOREIGN PATENT DOCUMENTS

| | | |
|---|---|---|
| JP | 2004-281086 | 10/2004 |
| JP | 2006-344869 | 12/2006 |

(Continued)

OTHER PUBLICATIONS

Japanese Office Action dated Jul. 15, 2014 for co-pending JP Application 2010249205.

*Primary Examiner* — J. L. Yang
(74) *Attorney, Agent, or Firm* — Dentons US LLP

(57) ABSTRACT

Disclosed herein is an organic electroluminescence display device including: a substrate; a plurality of lower electrodes formed thereon for each of a plurality of organic electroluminescence elements; a plurality of hole injecting/transporting layers capable of either hole injection or hole transportation which are formed on the lower electrodes for each of the organic electroluminescence elements; a plurality of organic light emitting layers containing a low-molecular weight material which are formed on the hole injecting/transporting layers for each of the organic electroluminescence elements; an electron injecting/transporting layer capable of either electron injection or electron transportation which is formed over the entire surface of the organic light emitting layers; and an upper electrode formed on the electron injecting/transporting layer.

21 Claims, 11 Drawing Sheets

(56) References Cited

U.S. PATENT DOCUMENTS

| | | | | |
|---|---|---|---|---|
| 2007/0164278 A1* | 7/2007 | Lee et al. | ................ | 257/40 |
| 2009/0134789 A1* | 5/2009 | Ise | ................ | 313/504 |
| 2010/0164842 A1* | 7/2010 | Ishihara et al. | ................ | 345/32 |
| 2011/0315965 A1* | 12/2011 | Takashima | ................ | C07D 307/91 |
| | | | | 257/40 |

FOREIGN PATENT DOCUMENTS

| | | | | |
|---|---|---|---|---|
| JP | 2007-250201 | 9/2007 | | |
| JP | 2008-078181 | 4/2008 | | |
| JP | 2010-192587 | 9/2010 | | |
| WO | WO 2010/074087 A1 * | 7/2010 | ............ | H01L 51/50 |

* cited by examiner

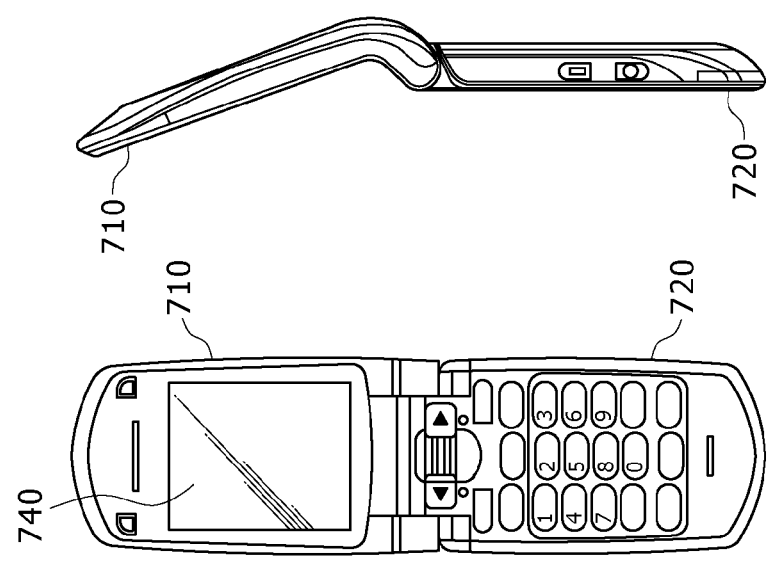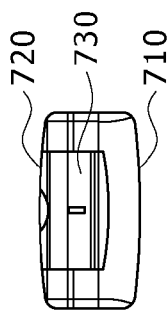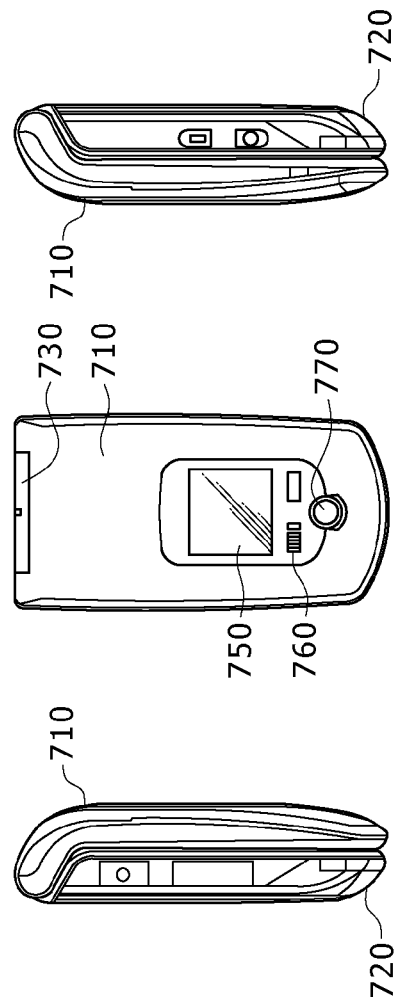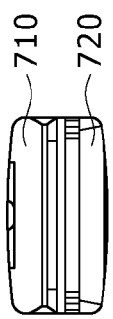
FIG.13A  FIG.13B  FIG.13C  FIG.13D  FIG.13E  FIG.13F  FIG.13G

ORGANIC EL DISPLAY DEVICE AND METHOD FOR PRODUCTION OF THE SAME

BACKGROUND

The present disclosure relates to an organic EL (electroluminescence) display device and a method for production thereof, the organic EL display device emitting light based on the principle of organic electroluminescence.

The recent rapid development in the information communications industry has aroused the need for high-performance display devices of next generation. One product expected to meet this need is an organic EL element of spontaneous emission type, which has a wide view angle, a high contrast, and a short response time.

The organic EL element has emitting layers and other layers which are made of either low-molecular weight materials or polymeric materials (high-molecular weight materials). The former is known to exhibit a higher emission efficiency and a longer life than the latter in most cases.

The organic film as a constituent of the organic EL element is formed by dry process or wet process. The dry process, which is applicable to low-molecular weight materials, includes vacuum vapor deposition or the like. The wet process, which is applicable to polymeric materials, include coating, such as spin coating, ink jet coating, and nozzle coating, and printing, such as flexographic printing and offset printing.

The vacuum vapor deposition has the advantage of requiring no step for dissolving the material for organic thin films in a solvent and also requiring no step for solvent removal after film formation. Unfortunately, this advantage is offset by difficulties involved in patterning through a metal mask and by high cost for production equipment. Such difficulties and high production cost are detrimental to large-sized panels. In other words, the vacuum vapor deposition presents difficulties in application to large substrates for mass production. One promising way to tackle this problem is the coating method which is easily applied to the production of large display panels.

The coating method typified by the ink jet coating was originally intended to form a laminate structure composed of a hole-injecting layer, an emitting layer, and a cathode electrode which are placed one over another. The hole-injecting layer is formed from such materials as poly-3,4-ethylenedioxythiophene (PEDOP) and polystyrenesulfonic acid (PSS). The emitting layer is formed by coating from materials capable of emitting light in various colors. The cathode electrode is formed from aluminum or the like, with alkali metal interposed thereunder. This original laminate structure has subsequently been improved by inserting an additional layer (called interlayer) made of a polymeric material. The interlayer in general use is intended to keep out deleterious factors from PEDOT and PSS and to control hole injection. In other words, this improved laminate structure is composed of anode electrode, hole transporting layer, interlayer, light-emitting layer, electron injecting layer, and cathode electrode. The first four layers were formed ordinarily by coating and the last two layers, by vapor deposition.

The existing laminate structure mentioned above has problems arising from injecting electrons into the emitting layer from the cathode electrode directly through the electron injecting layer. The first problem is quenching due to direct contact between the emitting layer and the cathode electrode. To avoid quenching, it is necessary to make the emitting layer thick so that the actual emitting position is a certain distance away from the cathode electrode. This results in an increase in drive voltage. The second problem is lack of uniformity in emission efficiency and life for all the colors. (This harms the device characteristic properties.) The reason for this is explained below. Direct injection of electrons from the cathode electrode into the emitting layer is controlled by the electron injecting layer which is made mainly of any of alkali metals and alkaline earth metals and inorganic compounds thereof, such as LiF, $MgF_2$, NaF, MgAg, MgO, $Li_2O_2$, $SrF_2$, Ca, Ba, BaO, and Cs. In the case of a display producing three colors (red, green, and blue), one of the foregoing materials is selected to form the layer in common for all the three colors because it is difficult to form the electron injecting layers separately with different colors. Unfortunately, the optimal material differs depending on the color to which it is applied, and this makes it impossible for one material to perform best for all the three colors.

An organic EL element was developed to address this problem, as disclosed in Japanese Patent Laid-Open No. 2006-344869 (hereinafter referred to as Patent Document 1). It is composed of a cathode electrode, an electron injecting layer, an electron transporting layer, and a light emitting layer. The electron transporting layer is formed by vacuum deposition from a material capable of transporting electrons. New to this organic EL element is the addition of the electron injecting layer made of one of the above-mentioned materials placed between the electron transporting layer and the cathode electrode.

SUMMARY

The organic EL element disclosed in Patent Document 1, however, suffers the disadvantage of being low in emission efficiency and short in life owing to insufficient injection of electrons into the emitting layer.

The present disclosure was completed in view of the foregoing. It is desirable to provide an organic EL display device and a method for production thereof, the organic EL display device exhibiting an improved emission efficiency and an extended life despite its reduced drive voltage.

The organic EL display device according to an embodiment of the present disclosure is composed of the following constituents (A) to (E).
(A) A substrate and lower electrodes formed thereon for individual organic EL elements.
(B) Hole injecting/transporting layers formed on the lower electrodes for the individual organic EL elements. They are capable of either hole injection or hole transportation.
(C) Organic light emitting layers containing a low-molecular weight material which are formed on the hole injecting/transporting layers for the individual organic EL elements.
(D) An electron injecting/transporting layer formed over the entire surface of the organic light emitting layers, which is capable of either electron injection or electron transportation.
(E) An upper electrode which is formed on the electron injecting/transporting layer.

The organic EL display device according to an embodiment of the present disclosure is produced by the method including the following (A) to (E).
(A) forming on a substrate lower electrodes for individual organic EL elements.
(B) forming hole injecting/transporting layers on the lower electrode by coating method for the individual organic EL elements, the hole injecting/transporting layers being capable of either hole injection or hole transportation.

(C) forming organic light emitting layers containing a low-molecular weight material by coating method on the hole injecting/transporting layers for the individual organic EL elements.

(D) forming an electron injecting/transporting layer over the entire surface of the organic light emitting layers by vapor deposition method, the electron injecting/transporting layer being capable of either electron injection or electron transportation.

(E) forming an upper electrode over the entire surface of the electron injecting/transporting layer.

The organic EL display device and the method for production thereof according to an embodiment of the present disclosure enjoy an improved efficiency of electron injection into the organic light emitting layers from the upper electrode thanks to the low-molecular weight material incorporated into the organic light emitting layers for individual colors.

In the organic EL display device and the method for production thereof according to an embodiment of the present disclosure, the light emitting layers for individual colors are incorporated with a low-molecular weight material for the purpose of efficient electron injection from the upper electrode into the organic light emitting layers. The result is an increased amount of electrons injected into the light emitting layers, which leads to an improved emission efficiency and an extended life.

BRIEF DESCRIPTION OF THE DRAWINGS

FIGS. 13A to 13G are diagrams depicting the appearance of the apparatus as the fifth example of application, with FIG. 13A being a front view in the open state, FIG. 13B being a front view in the open state, FIG. 13C being a front view in the closed state, FIG. 13D being a left side view, FIG. 13E being a right side view, FIG. 13F being a top view, and FIG. 13G being a bottom view.

DETAILED DESCRIPTION OF THE PREFERRED EMBODIMENTS

The following is a detailed description of the embodiments of the present disclosure, which will be given with reference to the accompanying drawings.

1. First embodiment (covering the organic EL display device having the electron injecting/transporting layer formed on the light emitting layers for individual colors)

2. Second embodiment (covering the organic EL display device having the hole blocking layer formed between the light emitting layers for individual colors and the electron injecting/transporting layer)

First Embodiment

Figure 1:
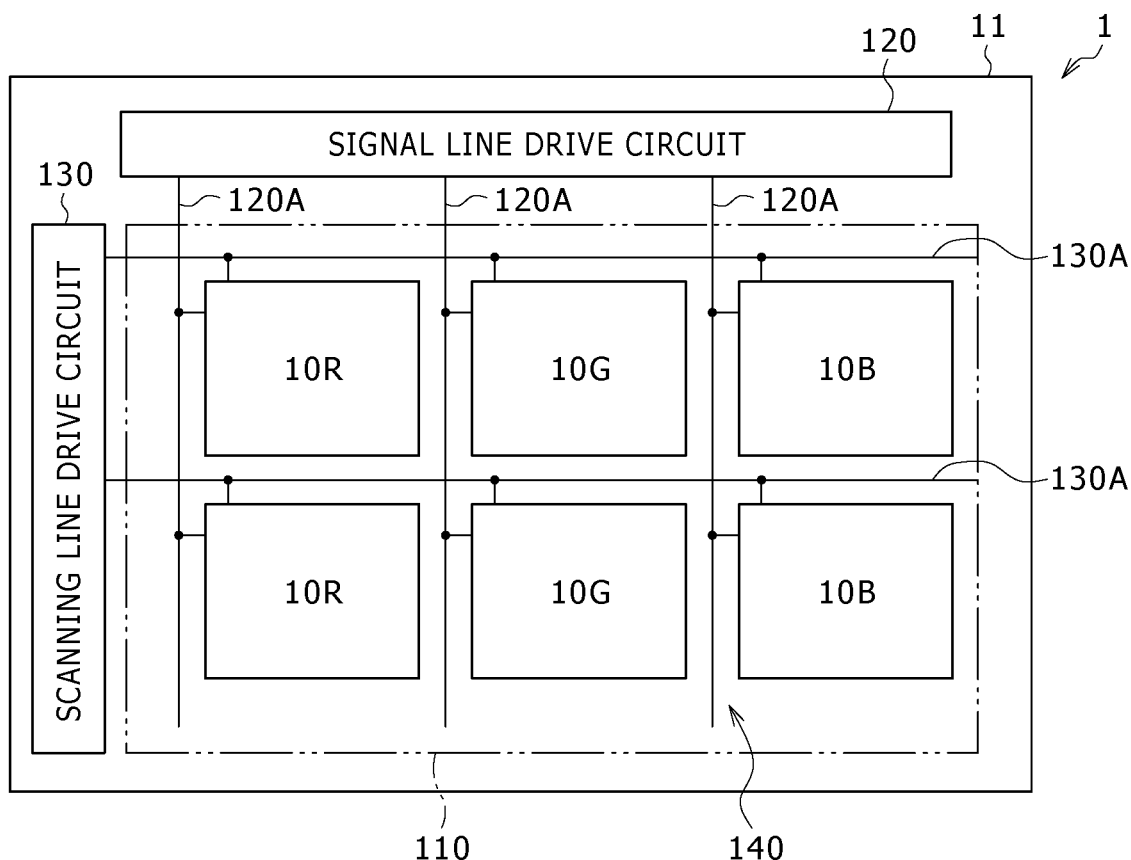
FIG. 1 is a diagram depicting the structure of the organic EL display device according to the first embodiment of the present disclosure.

Shown in FIG. 1 is the structure of the organic EL display device 1 according to the first embodiment of the present disclosure. The organic EL display device 1 is designed for use as the organic EL television set. It is composed of the substrate 11 and the display region 110 formed thereon. The display region 110 includes the red organic EL elements 10R, the green organic EL elements 10G, and the blue organic EL elements 10B, which are arranged in a matrix pattern. A detailed description of these organic EL elements will be given later. Along the two sides of the display region 110 are the signal line drive circuit 120 and the scanning line drive circuit 130, both functioning as the driver for video display.

Figure 2:
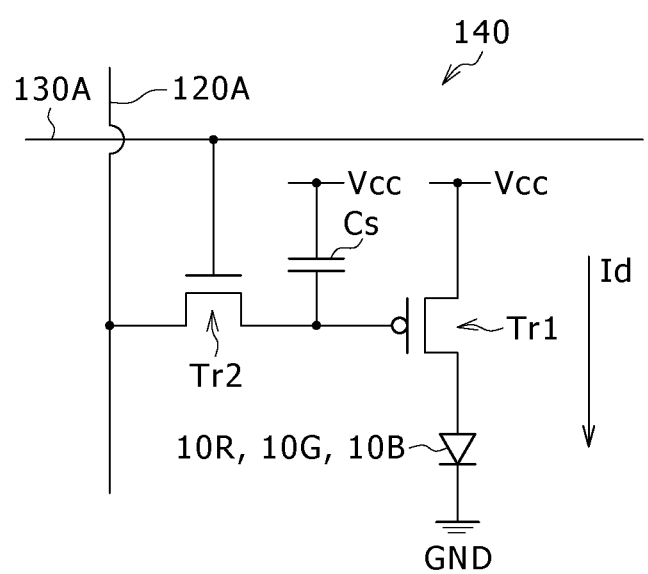
FIG. 2 is a diagram depicting one example of the pixel drive circuit shown in FIG. 1.

In the display region 110 are the pixel drive circuits 140, one of which is shown in FIG. 2. The pixel drive circuits 140 are drive circuits of active type formed on the layer under the lower electrode 14 which will be mentioned later. Each of the pixel drive circuits 140 is composed of the drive transistor Tr1, the writing transistor Tr2, the capacitor (storage capacity) Cs placed between these transistors Tr1 and Tr2, and the red organic EL element 10R (or the green organic EL element 10G or the blue organic EL element 10B) which is placed between the first source line (Vcc) and the second source line (GND) and is serially connected to the drive transistor Tr1. The drive transistor Tr1 and the writing transistor Tr2 are ordinary thin film transistors (TFT). These transistors may be arranged unrestrictedly in the inverted stagger type (bottom gate type) or in the stagger type (top gate type).

The pixel drive circuit 140 has the signal lines 120A arranged in the column direction and the scanning lines 130A arranged in the row direction. Each of the signal lines 120A and each of the scanning lines 130A cross each other at the intersection which corresponds to one of the red organic EL element 10R, the green organic EL element 10G, or the blue organic EL element 10B, which serves as a subpixel. Each of the signal lines 120A is connected to the signal line drive circuit 120, so that the signal line drive circuit 120 supplies image signals to the source electrode of the writing transistor Tr2 through the signal line 120A. Likewise, each of the scanning lines 130A is connected to the scanning line drive circuit 130, so that the scanning line drive circuit 130 supplies scanning signals to the gate electrode of the writing transistor Tr2 through the scanning line 130A.

The display region 110 also has the red organic EL element 10R for red color emission, the green organic EL element 10G for green color emission, and the blue organic EL element 10B for blue color emission, which are arranged side by side in a matrix pattern. One combination of these adjoining three elements constitutes one pixel.

Figure 3:
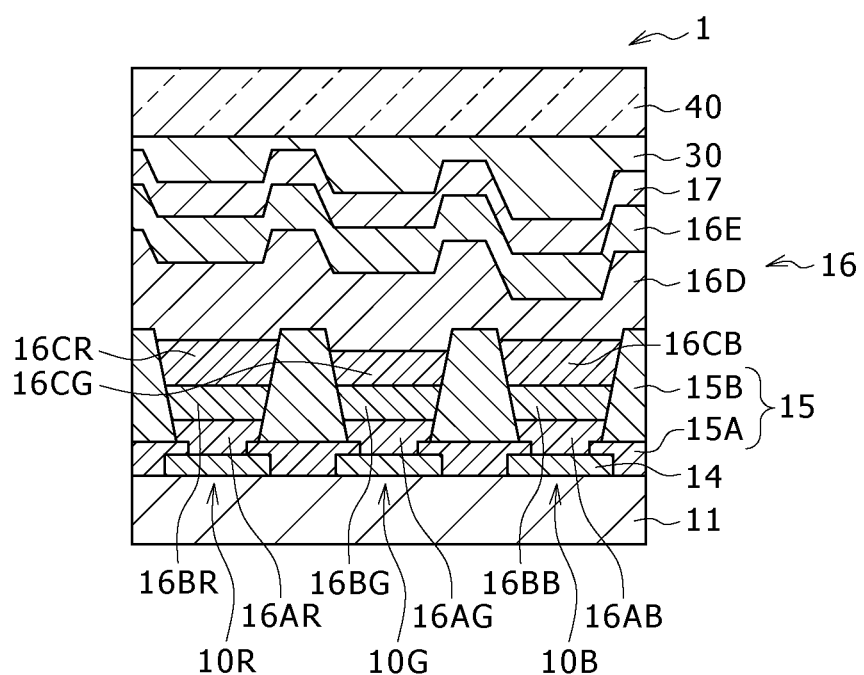
FIG. 3 is a sectional view showing the structure of the display region shown in FIG. 1.

The display region 110 is constructed as shown in FIG. 3 which is a sectional view. Each of the red organic EL element 10R, the green organic EL element 10G, and the blue organic EL element 10B is composed of the substrate 11, the drive transistor Tr1 of the pixel drive circuit 140 (not shown), the planarized insulating film (not shown), the lower electrode 14 as the anode, the partition wall 15, the organic layer 16, and the upper electrode 17 as the cathode, which are sequentially arranged upward. The organic layer 16 includes light emitting layers 16C (the red emitting layer 16CR, the green emitting layer 16CG, and the blue emitting layer 16CB), which will be described later.

The red organic EL element 10R, the green organic EL element 10G, and the blue organic EL element 10B are covered with the protective layer 30. The protective layer 30 is entirely covered with the sealing substrate 40, with a bonding layer (not shown) interposed between them. The bonding layer is formed from a thermosetting resin or a UV (ultra violet) curable resin. In this way the entire assembly is completely sealed.

The substrate 11 is a support on one surface of which are arranged and formed the red organic EL element 10R, the green organic EL element 10G, and the blue organic EL element 10B. It may be any known one made of quartz, glass, metal foil, or plastics in the form of film or sheet. A substrate of quarts or glass is preferable. Adequate materials for plastic substrates include methacrylic resin, such as polymethyl methacrylate (PMMA), polyesters, such as polyethylene terephthalate (PET), polyethylene naphthalate (PEN), and polybutylene naphthalate (PBN), and polycarbonate resin. These plastics need surface coating or surface treatment to eliminate their water and gas permeability.

The lower electrode 14 is formed on the substrate 11 for each of the red organic EL element 10R, the green organic EL element 10G, and the blue organic EL element 10B. In addition, the lower electrode 14 has a thickness of 10 nm to 1,000 nm (measured in the direction of layer arrangement). It is formed from any one of such metals (or alloys thereof) as chromium (Cr), gold (Au), platinum (Pt), nickel (Ni), copper (Cu), tungsten (W), and silver (Ag). Moreover, the lower electrode 14 may have a laminate structure composed of a film of the metal or alloy and a transparent conductive film of indium-tin oxide (ITO), indium-zinc oxide (InZnO), or alloy of zinc oxide (ZnO) and aluminum. Incidentally, in the case where the lower electrode 14 is used as the anode, it should preferably be formed from a material highly capable of hole injection. However, it may also be formed from any material such as aluminum alloy which has a surface oxide film or which poses a problem with hole injection barrier due to its small work function, so long as the hole injecting layers 16A are adequately provided.

The partition wall 15 ensures insulation between the lower electrode 14 and the upper electrode 17, and it also demarcates the emission region in a desired shape. In addition, the partition wall 15 also functions as a separator for individual layers at the time of ink jet coating or nozzle coating in the fabricating process mentioned later. The partition wall 15 is composed of the lower partition wall 15A and the upper partition wall 15B, the former being made of inorganic insulating material such as $SiO_2$ and the latter being made of photosensitive resin such as polybenzoxazole or polyimide (both being of positive photosensitive type). The partition wall 15 has an opening corresponding to the emission region. Incidentally, the organic layer 16 and the upper electrode 17 may be formed not only on the opening but also on the partition wall 15; however, it is only the opening of the partition wall 15 that produces emission.

The organic layer 16 of the red organic EL element 10R is composed of the hole injecting layer 16AR, the hole transporting layer 16BR, the red emitting layer 16CR, the electron transporting layer 16D, and the electron injecting layer 16E, which are sequentially arranged upward from the lower electrode 14. The organic layer 16 of the green organic EL element 10G is composed of the hole injecting layer 16AG, the hole transporting layer 16BG, the green emitting layer 16CG, the electron transporting layer 16D, and the electron injecting layer 16E, which are sequentially arranged upward from the lower electrode 14. The organic layer 16 of the blue organic EL element 10B is composed of the hole injecting layer 16AB, the hole transporting layer 16BB, the blue emitting layer 16CB, the electron transporting layer 16D, and the electron injecting layer 16E, which are sequentially arranged upward from the lower electrode 14. The electron transporting layer 16D and the electron injecting layer 16E of the foregoing layers is formed as a common layer for the red organic EL element 10R, the green organic EL element 10G, and the blue organic EL element 10B.

The hole injecting layers 16AR, 16AG, and 16AB are intended to improve the efficiency of hole injection into the emitting layers 16CR, 16CG, and 16CB. They function also as a buffer layer to prevent leakage. They are provided on the lower electrode 14 for the red organic EL element 10R, the green organic EL element 10G, and the blue organic EL element 10B individually.

The hole injecting layers 16AR, 16AG, and 16AB should preferably have a thickness of 5 nm to 10 nm, more preferably 8 nm to 50 nm. They may be formed from any material compatible with their adjoining electrodes and layers. Typical examples of such materials include polyaniline, polythiophene, polypyrrole, polyphenylenevinylene, polythienylenevinylene, polyquinoline, and polyquinoxaline, and derivatives thereof; conductive polymers such as those having the aromatic amine structure in the main chain or side chain; and metal phthalocyanine (such as copper phthalocyanine) and carbon.

The polymeric material used for the hole injecting layers 16AR, 16AG, and 16AB should have a weight-average molecular weight (Mw) of 10,000 to 300,000, preferably 50,000 to 200,000. The polymeric material may be replaced by an oligomer having a molecular weight of 2,000 to 10,000. If the hole injecting layer is formed from a polymeric material having a molecular weight lower than 50,000, it will dissolve when the hole transporting layer and its ensuing layers are formed. On the other hand, any polymeric material having a molecular weight higher than 300,000 will undergo gelling, which presents difficulties in film formation.

The conductive polymeric material used for the hole injecting layers 16AR, 16AG, and 16AB typically includes polyaniline, oligoaniline, and polydioxythiophene such as poly(3,4-ethylenedioxythiophene) (PEDOT). Additional examples include Nafion (trademark) and Liquion (trademark) (in solution form) from H.C. Starck Inc., EL-Source (trademark) from Nissan Chemical Industries, Ltd., and Berazol (trademark) which is a conductive polymer from Soken Chemical & Engineering Co., Ltd.

The red organic EL element 10R, the green organic EL element 10G, and the blue organic EL element 10B adjoin respectively to the hole transporting layers 16BR, 16BG, and 16BB, which improve the efficiency of hole transportation to the red emitting layer 16CR, the green emitting layer 16CG, and the blue emitting layer 16CB. The hole transporting layers 16BR, 16BG, and 16BB are formed respectively on the hole injecting layers 16AR, 16AG, and 16AB for the red organic EL element 10R, the green organic EL element 10G, and the blue organic EL element 10B.

The hole transporting layers 16BR, 16BG, and 16BB should have a thickness ranging from 10 nm to 200 nm, preferably from 15 nm to 150 nm, depending on the entire structure of the element. They may be formed from a variety of solvent-soluble light-emitting polymeric materials, such as polyvinylcarbazole, polyfluorene, polyaniline, and polysilane, and derivatives thereof; polysiloxane derivatives having an aromatic amine in the main chain or side chain; polythiophene and derivatives thereof; and polypyrrole.

Other preferable polymeric materials are those which are represented by the formula (1) below and soluble in organic solvents. They provide the hole transporting layers 16BR, 16BG, and 16BB with good adhesion to the hole injecting layers 16AR, 16AG, and 16AB and the light emitting layers 16CR, 16CG, and 16CB placed thereunder and thereon, respectively.

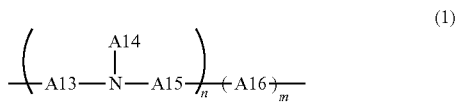

(where A13 to A16 each denotes a group having 1 to 10 aromatic hydrocarbon groups or a derivative thereof, or a group having 1 to 15 heterocyclic groups or a derivative thereof; n and m each denotes an integer of 0 to 10,000, with n+m being an integer of 10 to 20,000.)

The polymeric material may be any of random polymer, alternating copolymer, periodic copolymer, or block copolymer, with the moieties denoted by n and m being arranged in any order. In addition, the values of n and m should preferably be an integer of 5 to 5,000, more preferably 10 to 3,000, with their sum (n+m) being an integer of 10 to 10,000, more preferably 20 to 6,000.

In the compound represented by the formula (1) above, the aromatic hydrocarbon groups represented by A13 to A16 are exemplified by benzene, fluorene, naphthalene, and anthracene, and derivatives thereof; phenylenevinylene derivatives; and styryl derivatives. The heterocyclic groups are exemplified by thiophene, pyridine, pyrrole, and carbazole, and derivatives thereof.

The groups A13 to A16 in the compound represented by the formula (1) above may have substituent groups. In this case, such substituent groups should be $C_{1-12}$ straight or branched alkyl groups or alkenyl groups, whose typical examples include methyl group, ethyl group, propyl group, isopropyl group, butyl group, isobutyl group, sec-butyl group, tert-butyl group, pentyl group, hexyl group, heptyl group, octyl group, nonyl group decyl group, undecyl group, dodecyl group, vinyl group, and allyl group.

Typical but nonrestrictive examples of the compound represented by the formula (1) above include those compounds represented by the formulas (1-1) to (1-3) below. Their chemical names are listed below.

Formula (1-1): poly[(9,9-dioctylfluorenyl-2,7-diyl)-co-(4,4'-(N-(4-sec-butylphenyl))diphenylamine)] (TFB)

Formula (1-2): poly[(9,9-dioctylfluorenyl-2,7-diyl)-alt-co-(N,N'-bis{4-butylphenyl}-benzidine-N,N'-{1,4-diphenylene})]

Formula (1-3): poly[(9,9-dioctylfluorenyl-2,7-diyl)](PFO)

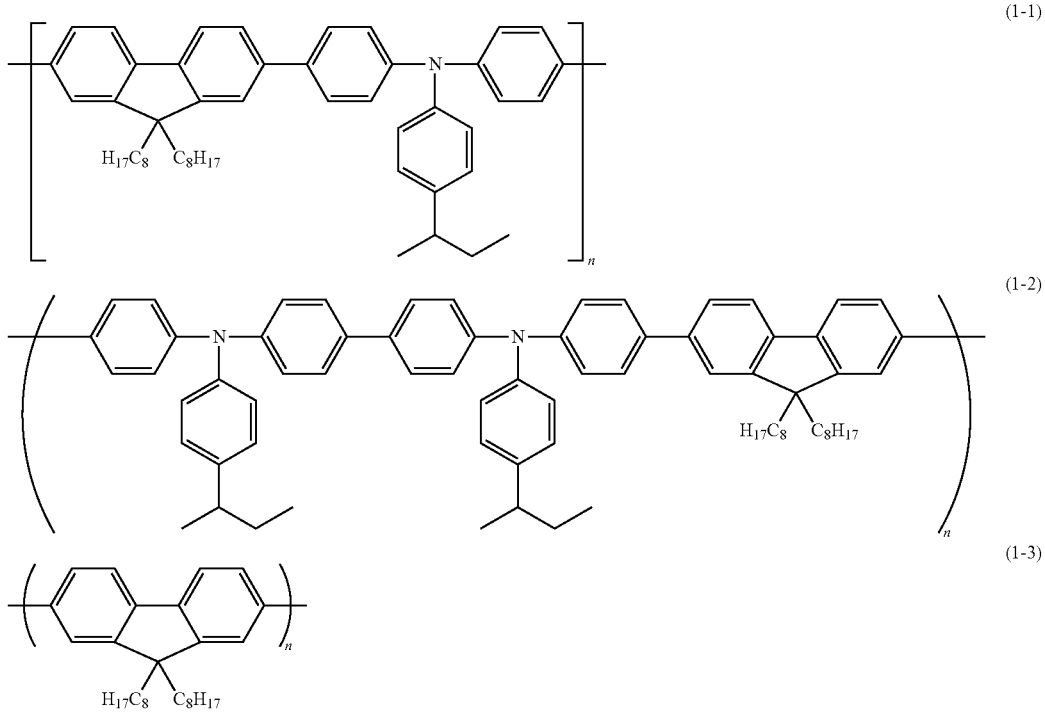

The red, green, and blue emitting layers 16CR, 16CG, and 16CB are the sites where electrons and holes undergo recombination in the presence of electric field, thereby emitting light. Each of them should have a thickness ranging from 10 nm to 200 nm, preferably 15 nm to 150 nm, depending on the entire structure of the element. They are formed from a light-emitting polymeric material incorporated with a low-molecular weight material, which should preferably be a monomer or an oligomer composed of 2 to 10 monomers and have a weight-average molecular weight not higher than 10,000. (This molecular weight is not an index for discrimination of materials.)

The red, green, and blue emitting layers 16CR, 16CG, and 16CB may be formed by coating method, such as ink jet technology which will be detailed later. This coating is accomplished by using a solution of the polymeric material and the low-molecular weight material dissolved in at least one organic solvents, such as toluene, xylene, anisole, cyclohexanone, mesitylene (1,3,5-trimethylbenzene), pseudocumene (1,2,4-trimethylbeznene), dihydrobenzofuran, 1,2,3,4-tetramethylbenzene, tetralin, cyclohexylbenzene, 1-methylnaphthalene, p-anisyl alcohol, dimethylnaphthalene, 3-methylbiphenyl, 4-methylbiphenyl, 3-isopropylbiphenyl, and monoisopropylnaphthalene.

The polymeric materials (for light emission) constituting the red, green, and blue emitting layers 16CR, 16CG, and 16CB include, for example, polyfluorene derivatives, polyphenylenevinylene derivatives, polyphenylene derivatives, polyvinylcarbazole derivatives, and polythiophene derivatives, which are capable of light emission. According to this embodiment, the red emitting layer 16CR is formed from ADS111RE (trademark) represented by the formula (2-1) below, the green emitting layer 16CG is formed from ADS109GE (trademark) represented by the formula (2-2) below, and the blue emitting layer 16CB is formed from ADS136BE (trademark) represented by the formula (2-3) below, all of these products being available from American Dye Source Inc. These emitting layers rely on singlet excitons for light emission. The polymeric material used in this embodiment includes not only conjugated polymers but also non-conjugated polymer of pendant type or non-conjugated polymer mixed with a dye. It also includes the recently developed light-emitting material of dendrimer type, which is composed of a core molecule and side chains called dendron. The foregoing polymeric material may have any unrestricted substituent groups, which transport electrons and/or holes, when necessary, to the main skeleton shown in the formulas (2-1), (2-2), and (2-3) below. The red, green, and blue emitting layers 16CR, 16CG, and 16CB according to this embodiment may emit light from single excitons or triplet excitons or both.

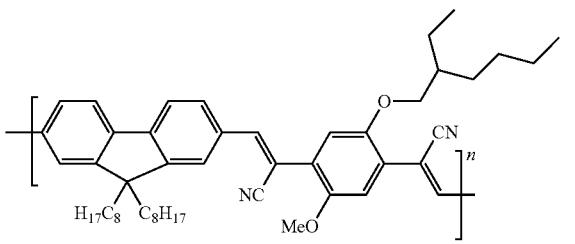

(2-2)

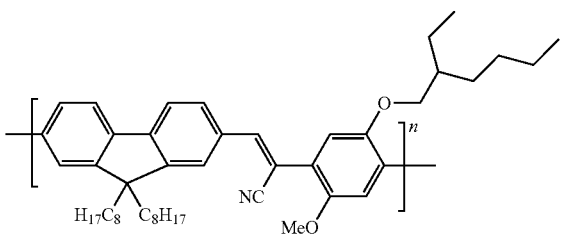

(2-3)

Other light-emitting materials than those mentioned above include aromatic hydrocarbon compounds and heterocyclic compounds exemplified below. Anthracene, naphthalene, phenanthrene, pyrene, tetracene, coronene, chrysene, fluorecein, perylene, phthaloperylene, naphthaloperylene, perinone, phthaloperinone, naphthaloperinone, diphenylbutadiene, tetraphenylbutadiene, coumarinoxadiazole, aldazine, bisbenzoxazolin, bisstyryl, pyrazine, cyclopentadiene, quinoline metal complex, aminoquinoline metal complex, benzoquinoline metal complex, imine, diphenylethylene, vinylanthracene, diaminocarbazole, pyran, thiopyran, polymethine, merocyanine, imidazole-chelated oxinoid compound, quinacridone, and rubrene. Additional examples include those compounds involving the triplet excited state which contain iridium metal complex or the like. The foregoing examples are not limitative ones. The light-emitting polymeric material capable of light emission in the triplet excited state include, for example, RPP, GPP, and BPP represented respectively by the formulas (3-1), (3-2), and (3-3) below. These compounds emit red, green, and blue light by phosphorescence, respectively.

(3-1)

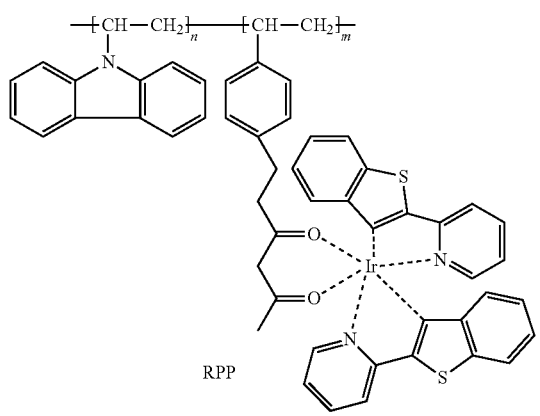

RPP (2-1)

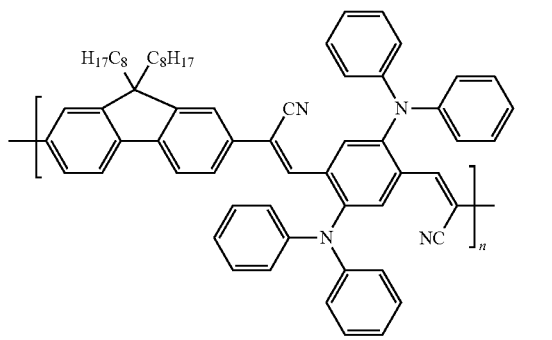

(3-2)

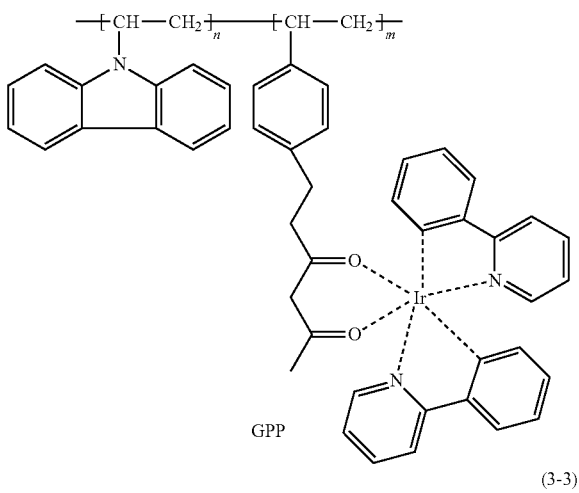

GPP (3-3)

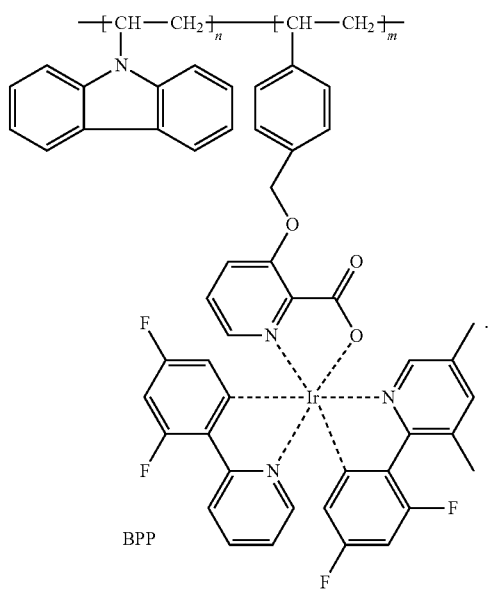

BPP

The polymeric material that constitutes the red, green, and blue emitting layers 16CR, 16CG, and 16CB should preferably be incorporated with a low-molecular weight material, which improves the efficiency of hole and electron injection into the red, green, and blue emitting layers 16CR, 16CG, and 16CB from the electron transporting layer 16D. This is based on the principle explained below.

If the red, green, and blue emitting layers 16CR, 16CG, and 16CB are formed only from polymeric materials suitable for them and they are coated with the electron transporting layer 16D formed from a low-molecular weight material, there will be a large difference in energy level between the red, green, and blue emitting layers 16CR, 16CG, and 16CB and the electron transporting layer 16D. This leads to an extremely low efficiency in hole or electron injection from the electron transporting layer 16D into the red, green, and blue emitting layers 16CR, 16CG, and 16CB, with the result that the emitting layers formed from the polymeric materials do not exhibit their inherent characteristic properties. It is desirable to improve the efficiency in hole or electron injection by incorporation of the red, green, and blue emitting layers 16CR, 16CG, and 16CB with a low-molecular weight material (monomer or oligomer) which reduces the difference in energy level between the red, green, and blue emitting layers 16CR, 16CG, and 16CB and the electron transporting layer 16D. Here, attention is paid to the relation between (A) the highest occupied molecular orbital (HOMO) level and the lowest unoccupied molecular orbital (LUMO) level of the red, green, and blue emitting layers 16CR, 16CG, and 16CB and the HOMO level and LUMO level of the electron transporting layer 16D and (B) the HOMO level and LUMO level of the low-molecular weight material to be incorporated into the red, green, and blue emitting layers 16CR, 16CG, and 16CB. To be more specific, the low-molecular weight material is selected from those compounds which have a value deeper than the LUMO of the red emitting layer 16CR or the green emitting layer 16CG and also have a value shallower than the LUMO of the electron transporting layer 16D and which further have a value deeper than the HOMO of the red emitting layer 16CR, the green emitting layer 16CG, and the blue emitting layer 16CB and also have a value shallower than the HOMO of the electron transporting layer 16D.

However, the materials to be used for the red, green, and blue emitting layers 16CR, 16CG, and 16CB are not necessarily restricted by the values of HOMO and LUMO mentioned above. This holds true in the case where the hole blocking layer 26F (mentioned later) is placed between the red, green, and blue emitting layers 26CR, 26CG, and 26CB and the electron transporting layer 26D. To be more specific, the hole blocking layer 26F capable of electron transportation may have a LUMO which is shallower than that of the low-molecular weight material for the red, green, and blue emitting layers 26CR, 26CG, and 26CB. Also, the low-molecular weight material to be incorporated into the light emitting layers 26C is not restricted to one kind; materials differing in energy level may be used in combination in order to ensure smooth hole or electron transportation.

The low-molecular weight material to be incorporated into the red, green, and blue emitting layers 16CR, 16CG, and 16CB denotes any compound having substantially a single value of molecular weight but excludes any polymers and condensates having a high molecular weight which result from low-molecular weight compounds by continuous repetition of identical or similar reactions. In addition, such low-molecular weight materials remain in the form of substantially separate molecules (free of intermolecular linking) even when they are heated. Such low-molecular weight materials should preferably have a weight-average molecular weight (Mw) not higher than 10,000, such that the ratio of molecular weight is not lower than 10 between the polymeric material and the low-molecular weight material. The material having a molecular weight lower than 10,000 is more desirable than the material having a higher molecular weight, for example 50,000, because the former has varied characteristic properties and is easily adjustable for the mobility of holes or electrons, the band gap, and the solubility in solvents. The low-molecular weight material should be added in such an amount that the mixing ratio of the polymeric material for the red, green, and blue emitting layers 16CR, 16CG, and 16CB and the low-molecular weight material is from 20:1 to 1:1 by weight. With a mixing ratio lower than 20:1, the low-molecular weight material does not fully produce its effect. With a mixing ratio higher than 1:1, the polymeric material does not produce its effect as the light-emitting material.

As mentioned above, the incorporation of a low-molecular weight material into the red, green, and blue emitting layers 16CR, 16CG, and 16CB permits easy adjustment of the carrier balance for holes and electrons. Without this effect, electron injection (into the red, green, and blue emitting layers 16CR, 16CG, and 16CB) and hole transportation will be deteriorated as the result of formation of the electron transporting layer 16D which will be mentioned later. The foregoing contributes to high emitting efficiency and extended life and reduced drive voltage of the red, green, and blue organic EL elements 10R, 10G, and 10B.

The low-molecular weight compound includes, for example, benzidine, styrylamine, triphenylamine, porphyrin, triphenylene, azatriphenylene, teteracyanoquinodimethane, triazole, imidazole, oxadiazole, polyarylalkane, phenylenediamine, arylamine, oxazole, anthracene, fluorenone, hydrazone, and stilbene, and derivatives thereof. Additional examples include heterocyclic conjugate monomer or oligomer such as polysilane compounds, vinylcarbazole compounds, thiophene compounds, and aniline compounds.

They are exemplified specifically but unrestrictedly by α-naphthylphenylphenylenediamine, metal tetraphenylporphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tri(3-methylphenylphenylamino)triphenylamine, N,N,N'N'-tetrakis(p-tolyl) p-phenylenediamine, N,N,N'N'-tetraphenyl-4,4'-diaminobiphenyl, N-phenylcarbazole, 4-di-p-tolylaminostilben, poly(paraphenylenevinylene), poly(thiophenevinylene), and poly(2,2'-thienylpyrrol).

More preferable examples of the low-molecular weight materials are those represented by the formulas (4) to (6) below.

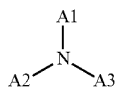
(4)

(where A1 to A3 denote aromatic hydrocarbon groups, heterocyclic groups, or derivatives thereof.)

$$Z-L1-N\begin{matrix}A4\\A5\end{matrix}$$ (5)

(where Z denotes a nitrogen-containing hydrocarbon group or a derivative thereof; L1 denotes a divalent group formed from one to four aromatic rings joined together or a derivative thereof; and A4 and A5 each denotes an aromatic hydrocarbon group or an aromatic heterocyclic group or a derivative thereof, provided that A4 and A5 may form a cyclic structure as they join together.)

$$\begin{matrix}A6\\A7\end{matrix}N-L2-N\begin{matrix}A8\\A9\end{matrix}$$ (6)

(where L2 denotes a divalent group formed from two to six aromatic rings joined together, or a derivative thereof; and A6 to A9 each denotes an aromatic hydrocarbon group or a heterocyclic group or a group formed from one to ten derivatives thereof joined together.)

The compounds represented by the formula (4) are exemplified by those represented by the formulas (4-1) to (4-48) below.

-continued
(4-7) 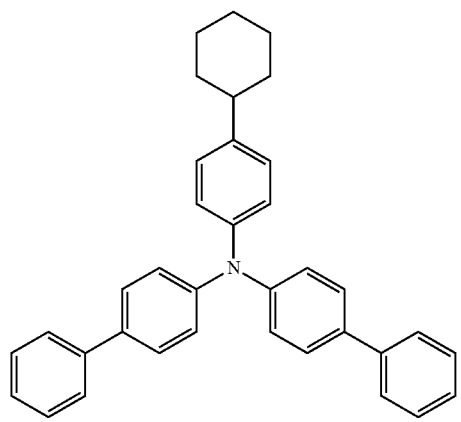
(4-8) 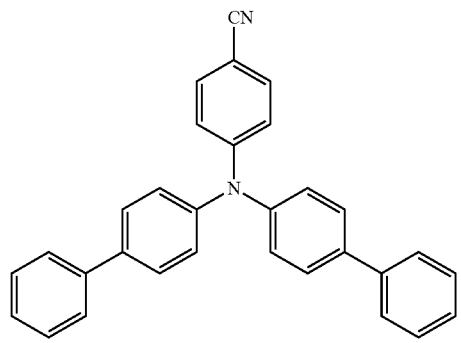
(4-9) 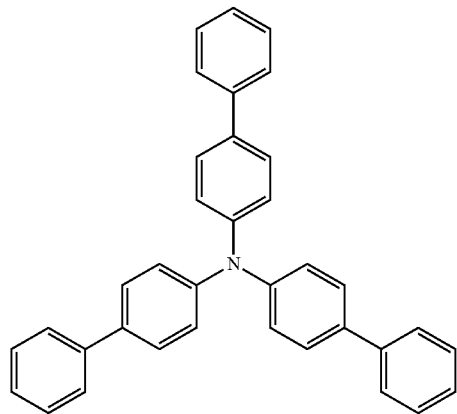
(4-10) 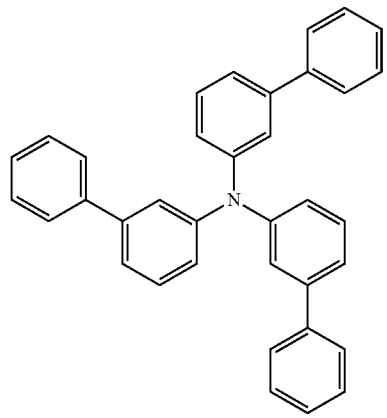
(4-11) 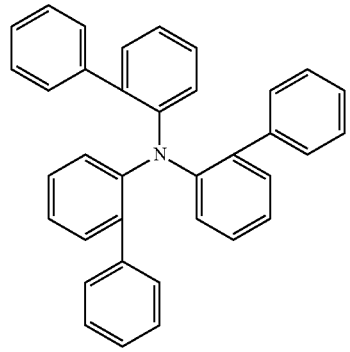
(4-12) 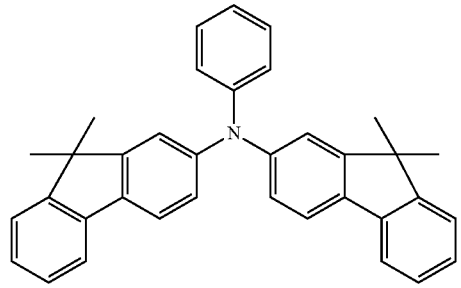
(4-13) 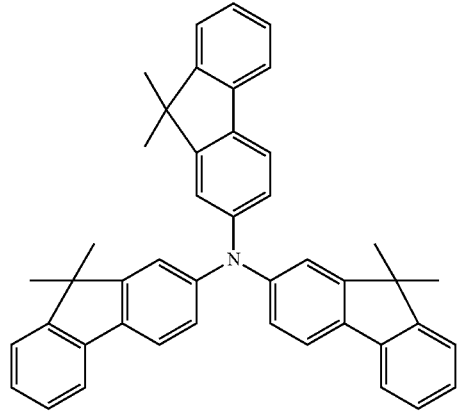
(4-14) 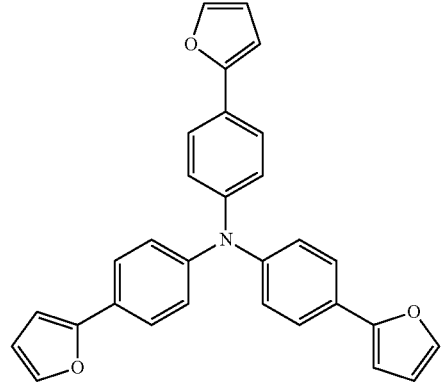

-continued
(4-15)
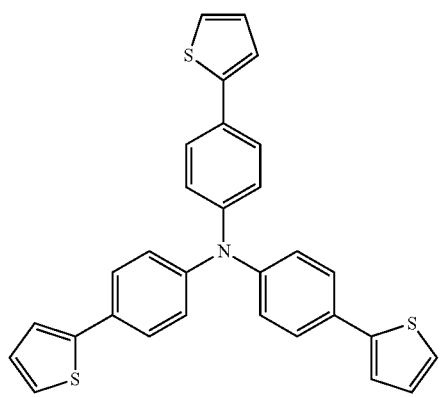
(4-16)
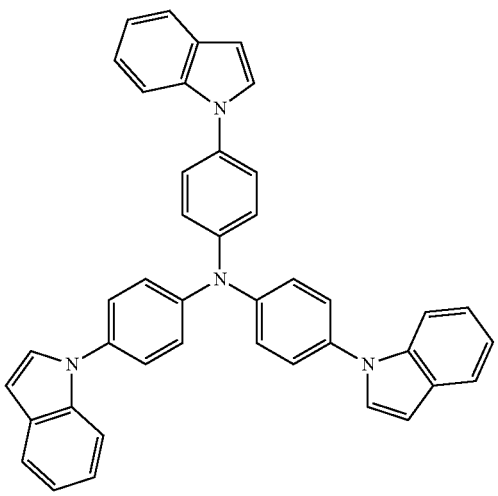
(4-17)
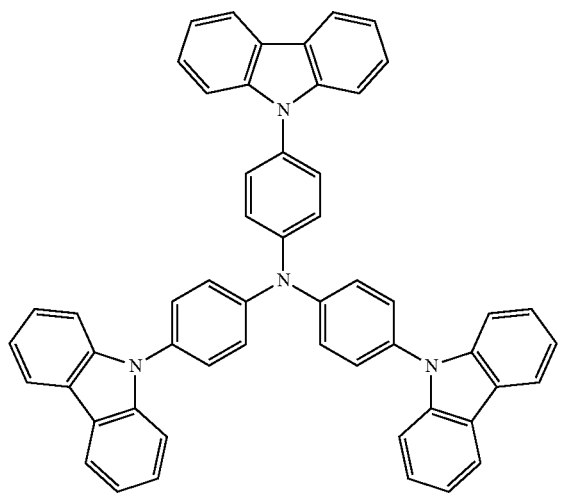
(4-18)
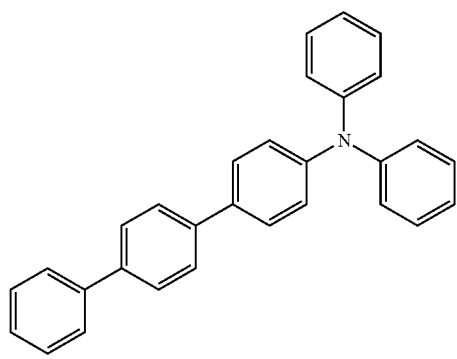
(4-19)
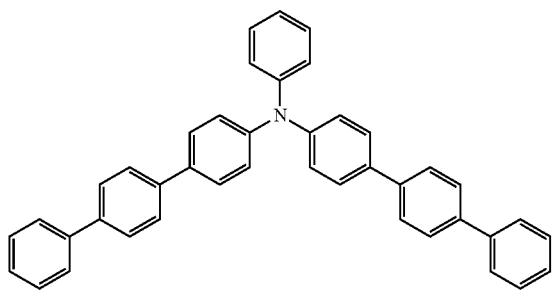
(4-20)
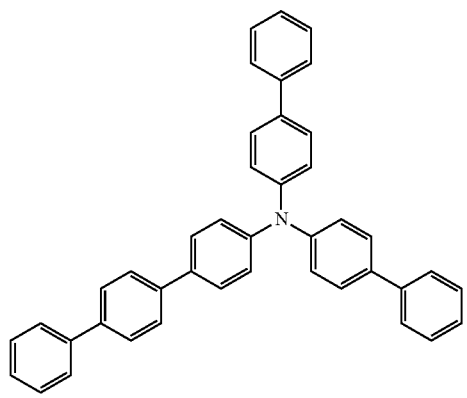

-continued
(4-21)
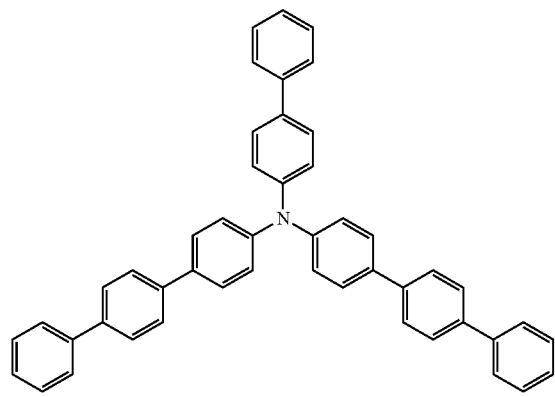
(4-22)
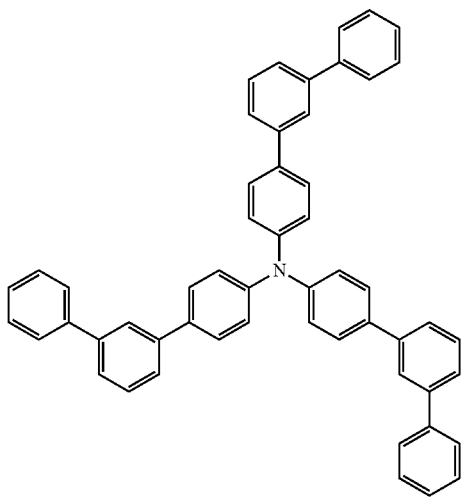
(4-23)
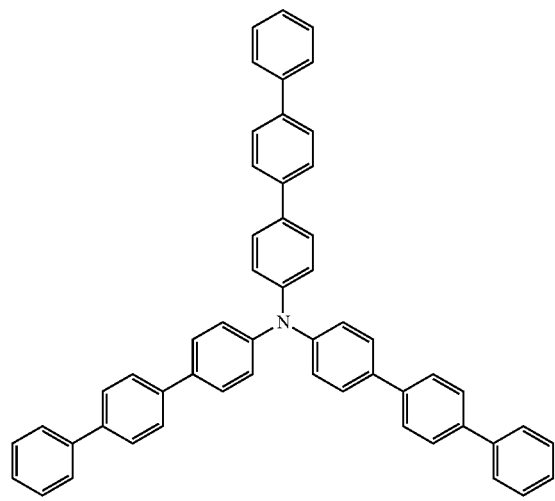
(4-24)
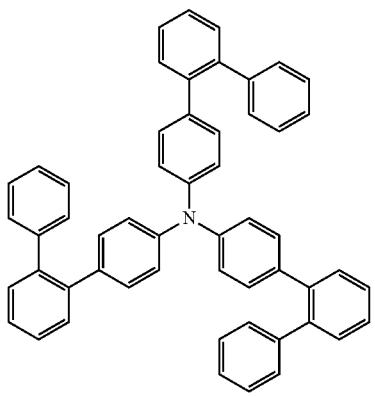
(4-25)
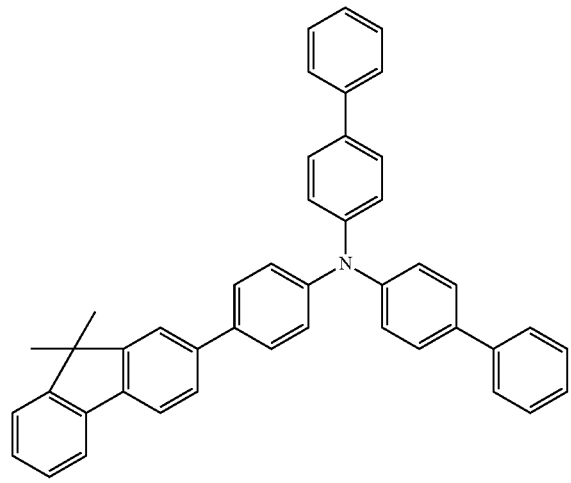
(4-26)
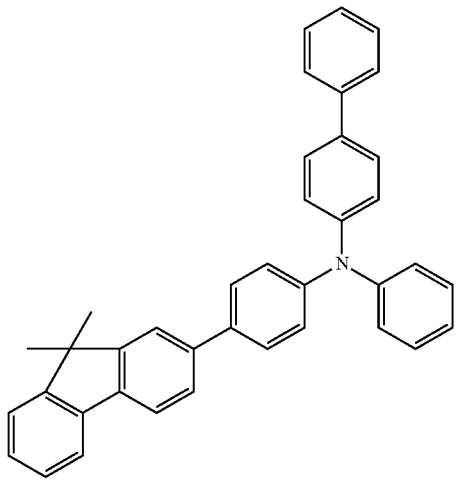

-continued
(4-27)
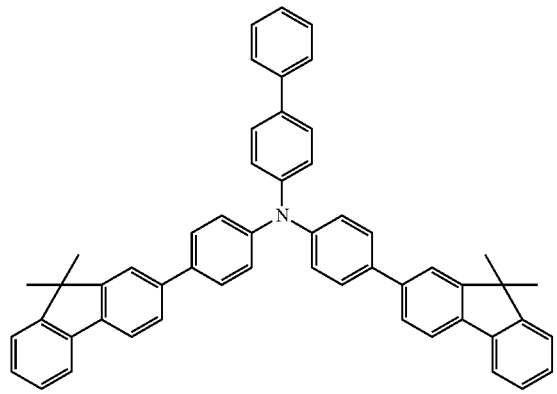
(4-28)
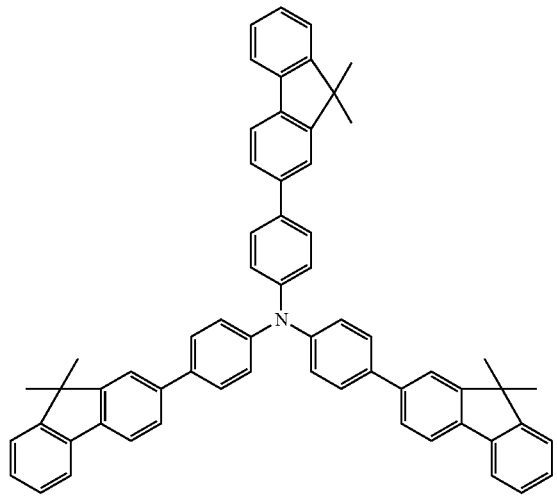
(4-29)
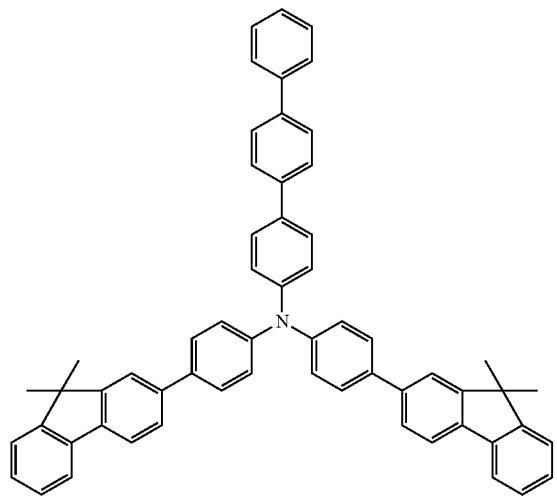
(4-30)
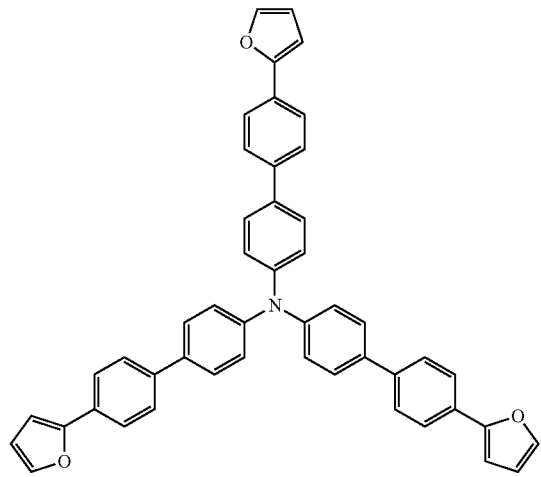

(4-31)
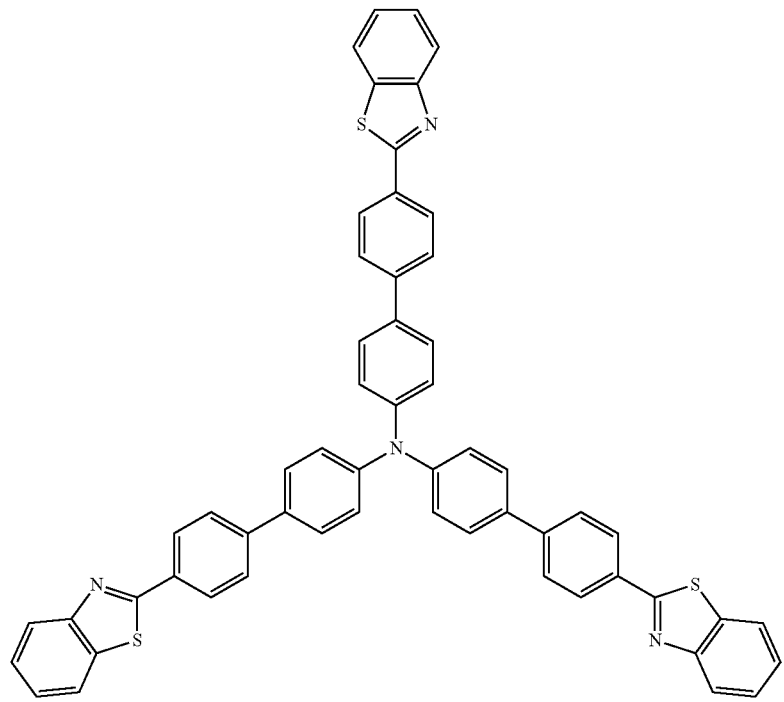
(4-32)
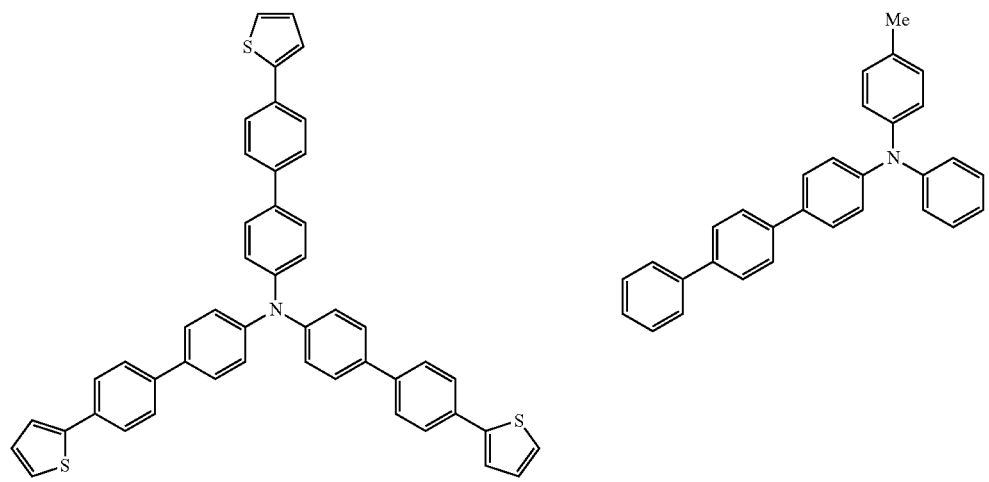
(4-33)
(4-34)
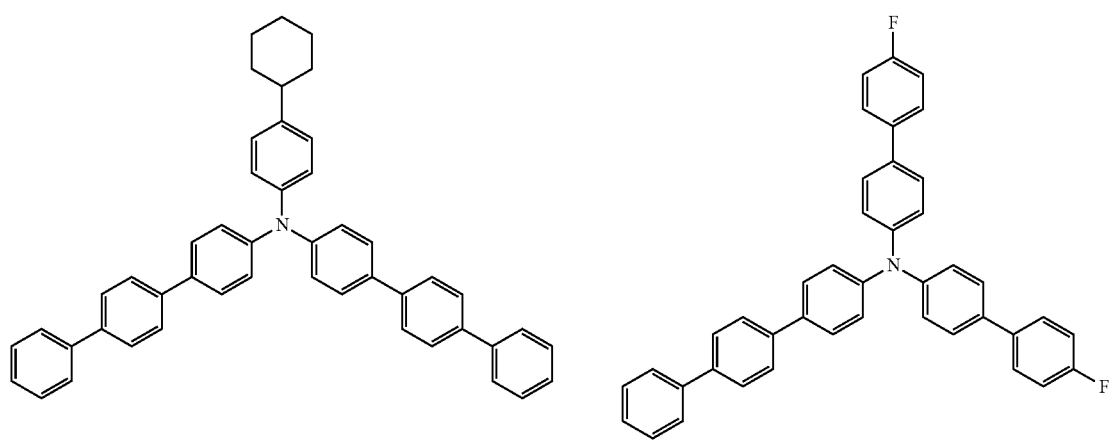
(4-35)

-continued
(4-36)
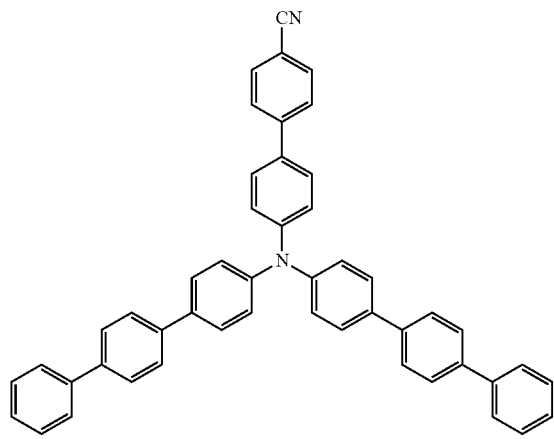
(4-37)
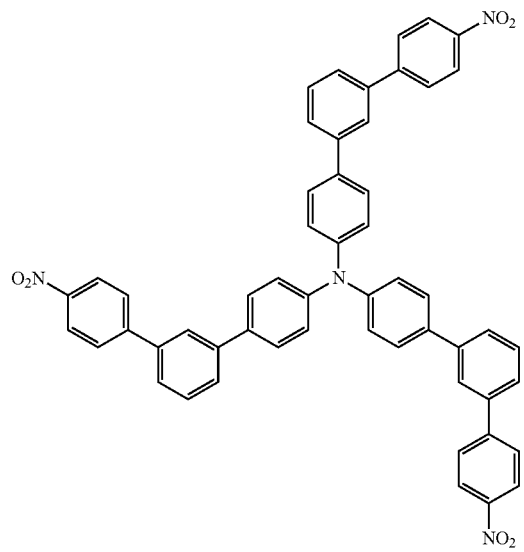
(4-38)
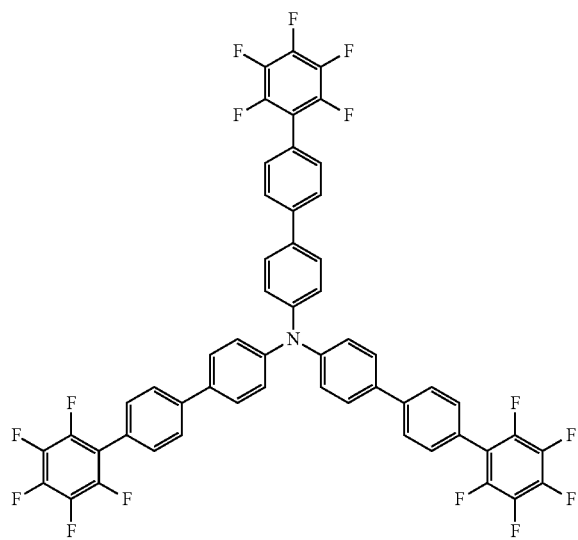
(4-39)
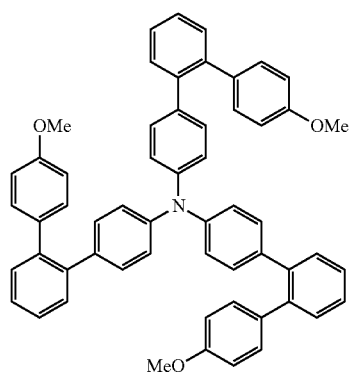
(4-40)
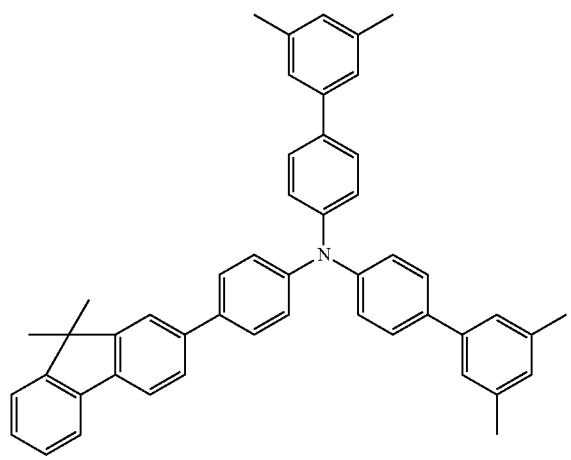
(4-41)
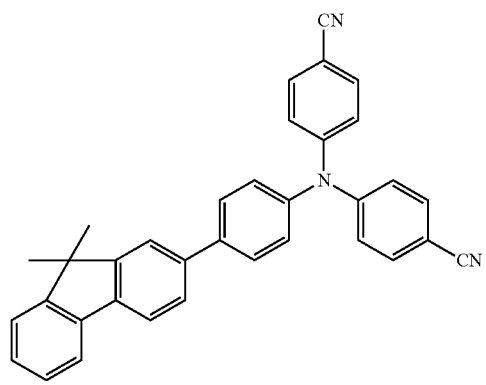

-continued
(4-42)
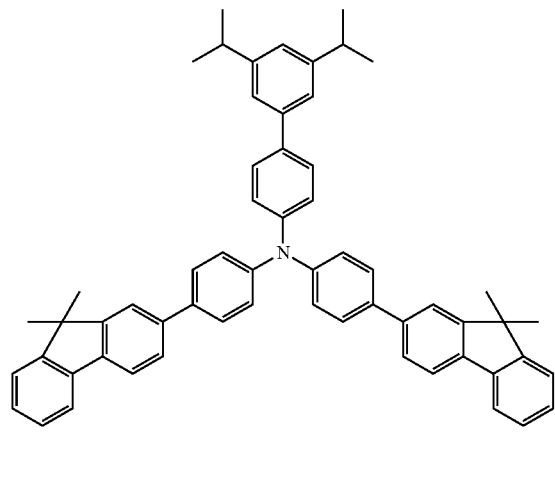
(4-43)
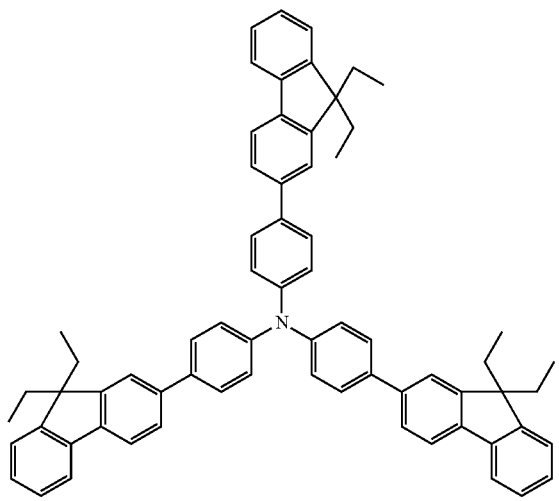
(4-44)
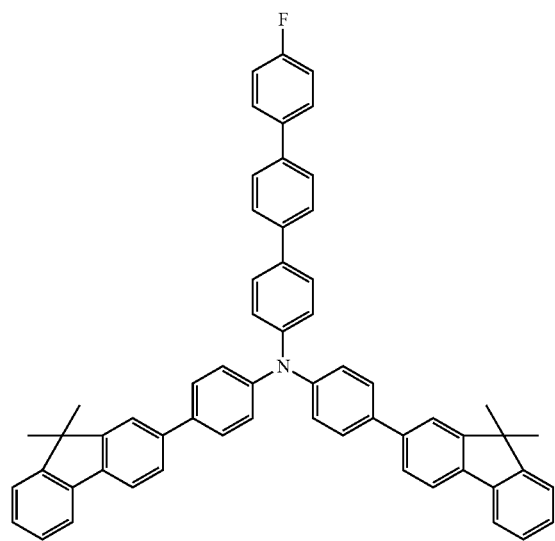
(4-45)
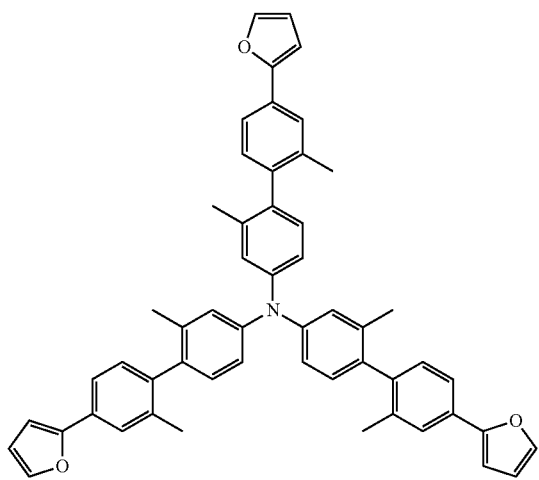

(4-46)
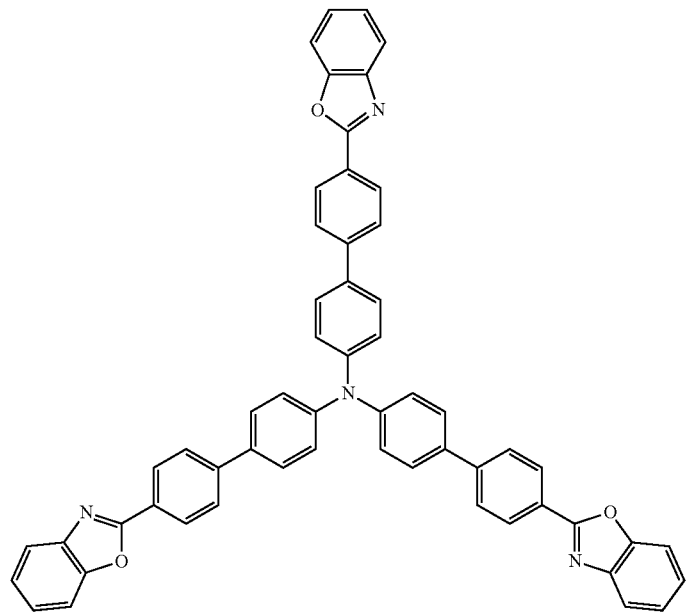
(4-47)
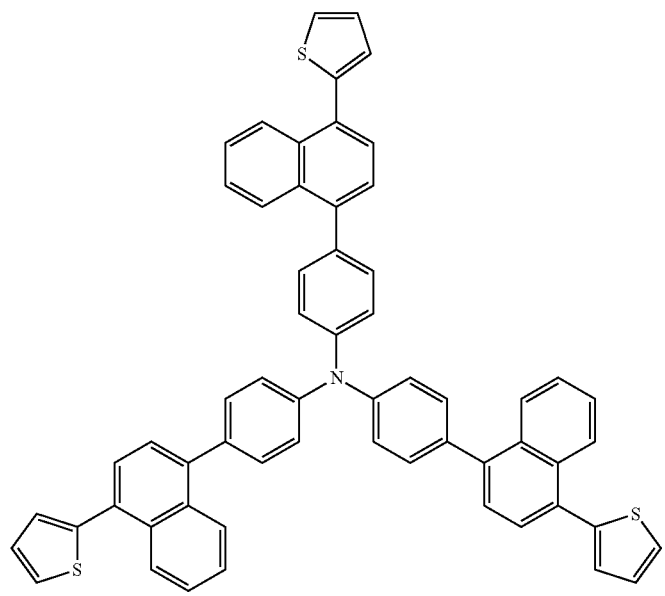

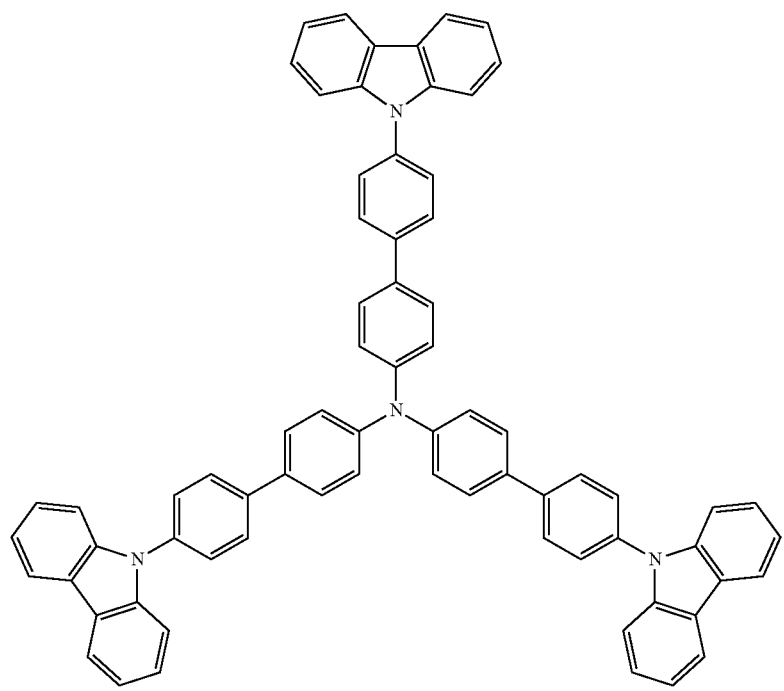
(4-48)
The compounds represented by the formula (5) are exemplified by those represented by the formulas (5-1) to (5-166) below. Incidentally, the nitrogen-containing hydrocarbon group linking to L1 may be a carbazole group, indole group, or imidazole group.
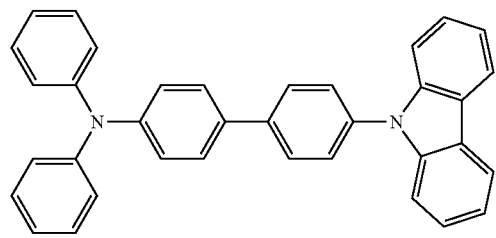
(5-1)
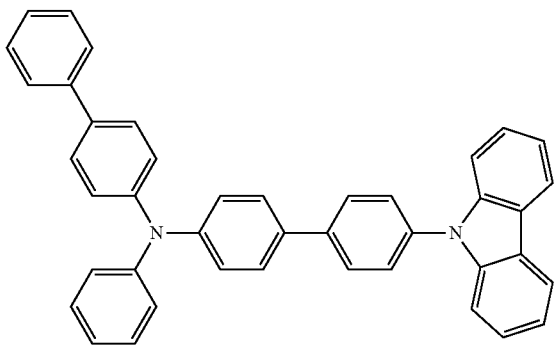
(5-2)
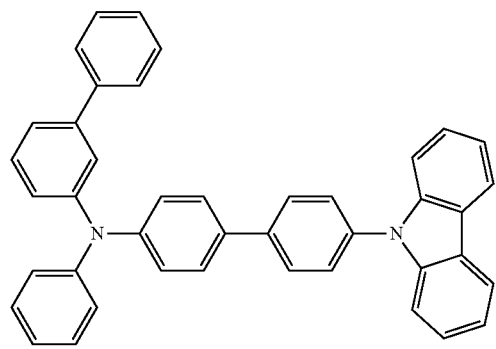
(5-3)
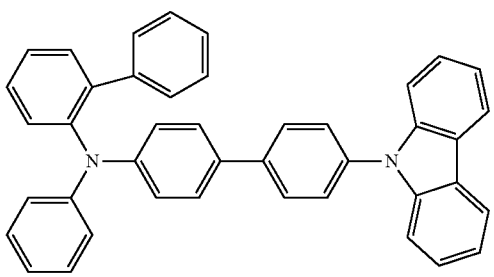
(5-4)

-continued
(5-5)
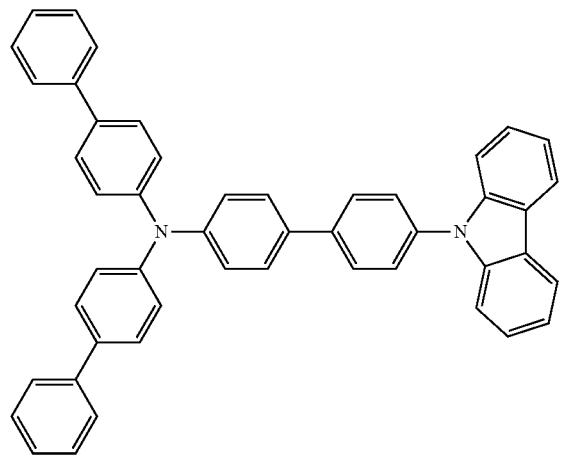
(5-6)
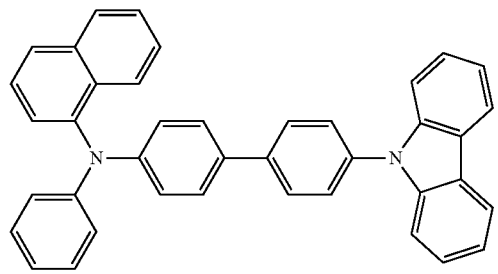
(5-7)
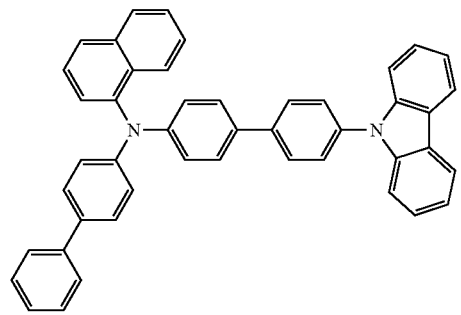
(5-8)
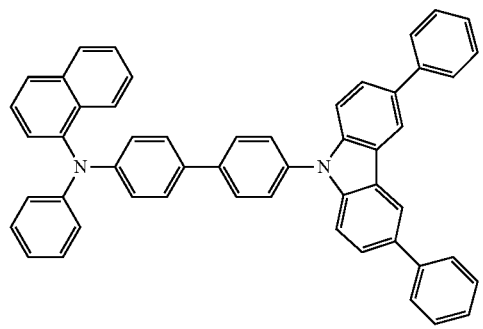
(5-9)
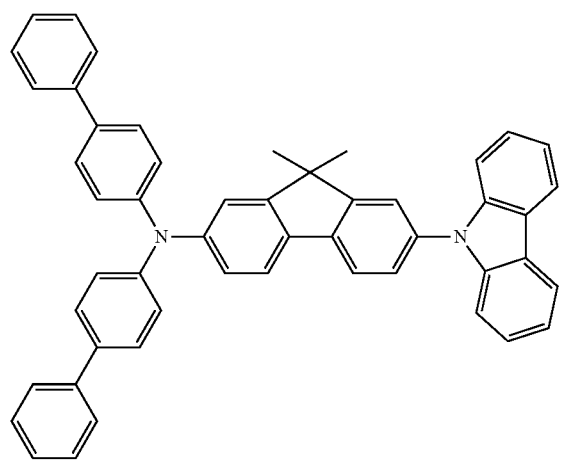
(5-10)
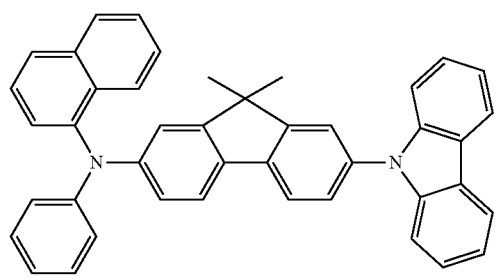

-continued
(5-11)
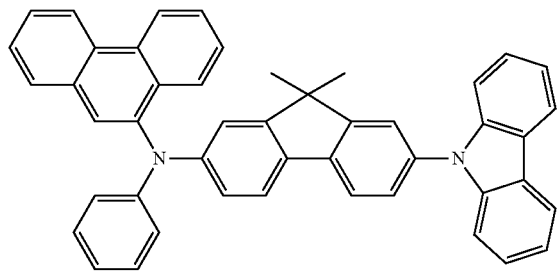
(5-12)
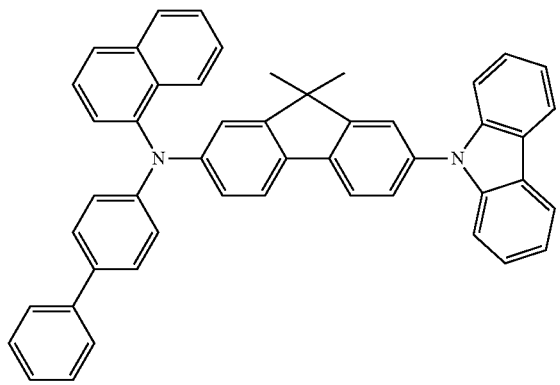
(5-13)
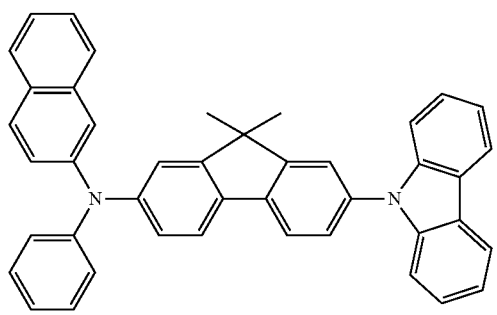
(5-14)
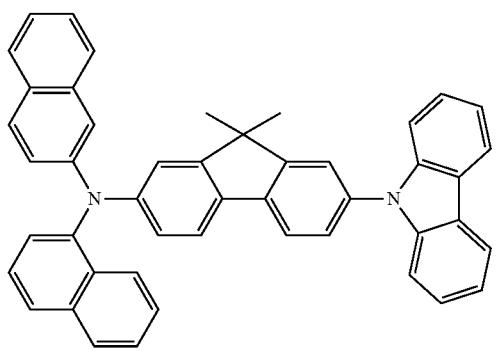
(5-15)
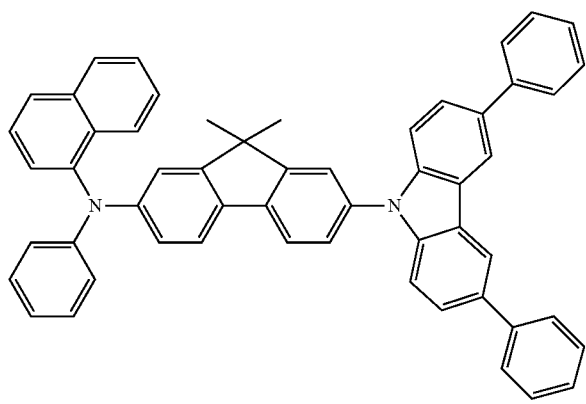
(5-16)
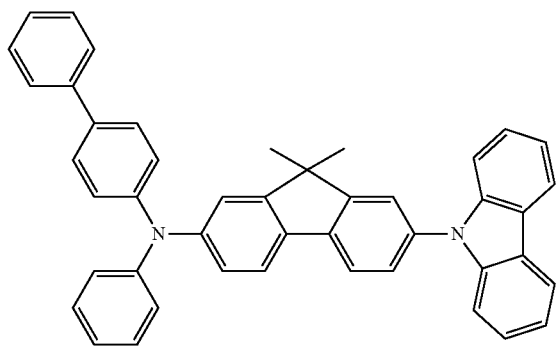
(5-17)
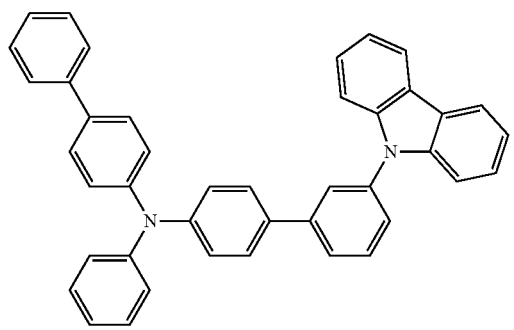
(5-18)
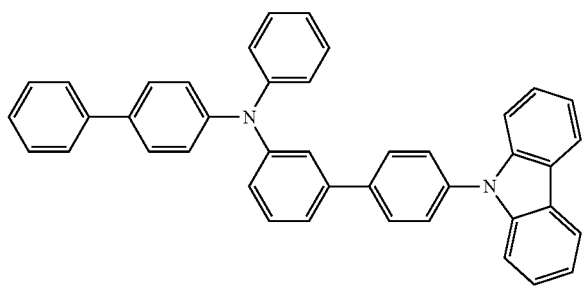

-continued
(5-19)
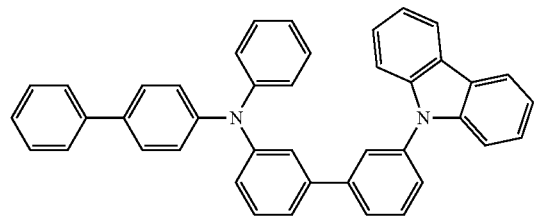
(5-20)
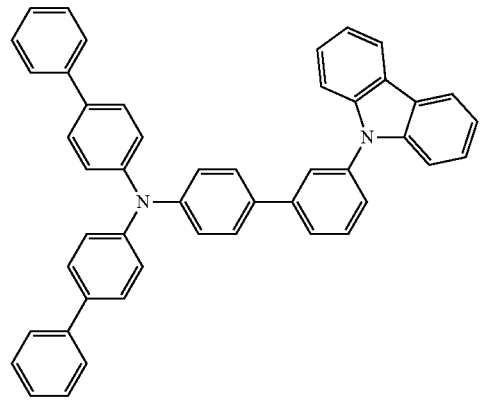
(5-21)
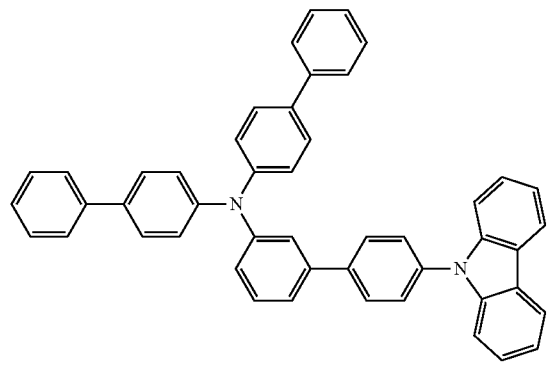
(5-22)
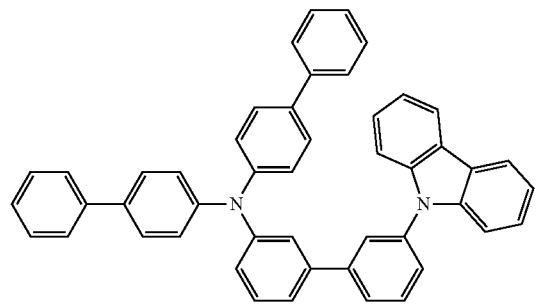
(5-23)
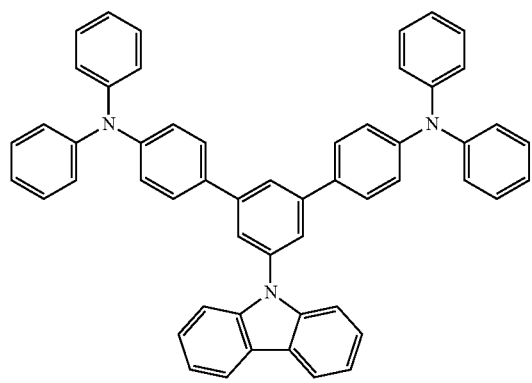
(5-24)
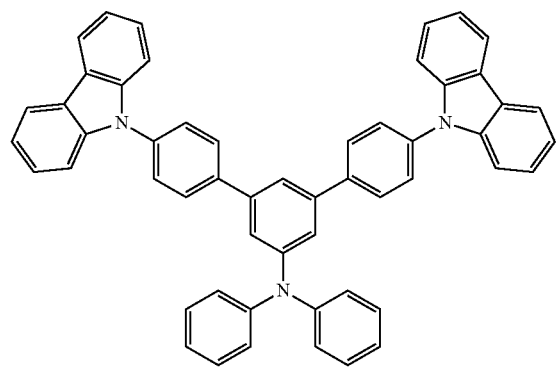
(5-25)
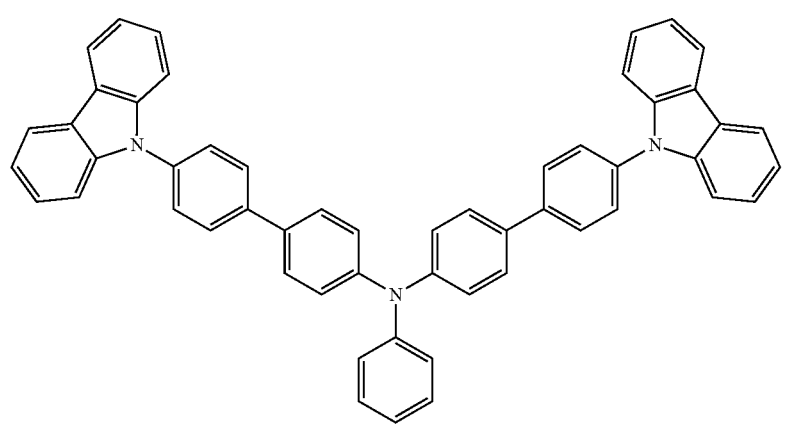

(5-26)
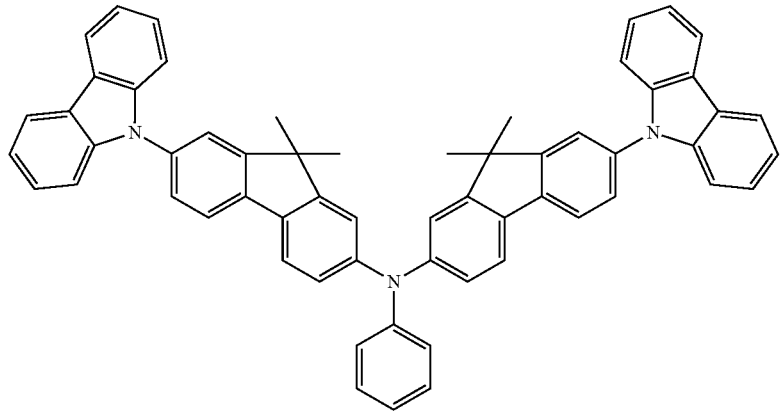
(5-27)
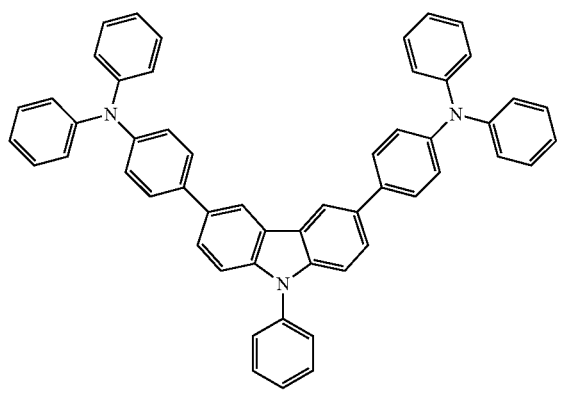
(5-28)
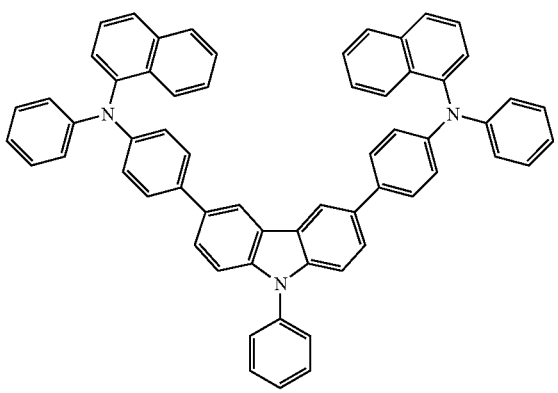
(5-29)
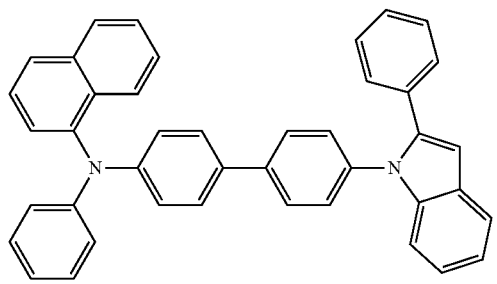
(5-30)
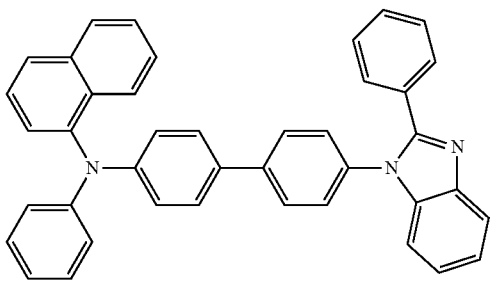
(5-31)
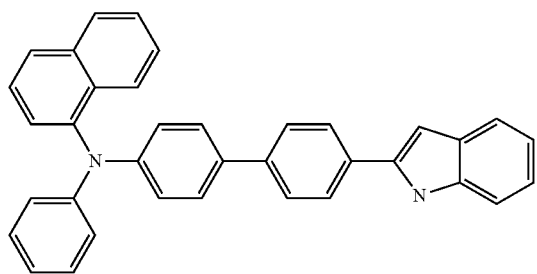
(5-32)
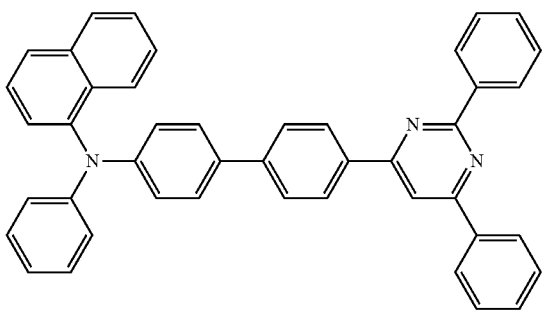

-continued
(5-33)
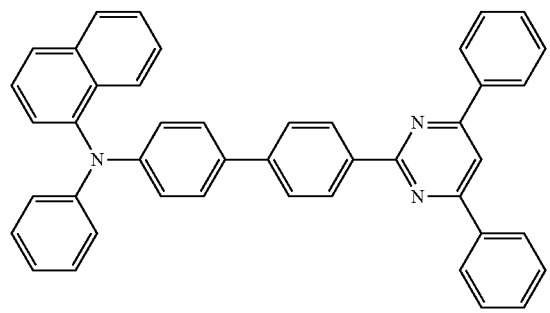
(5-34)
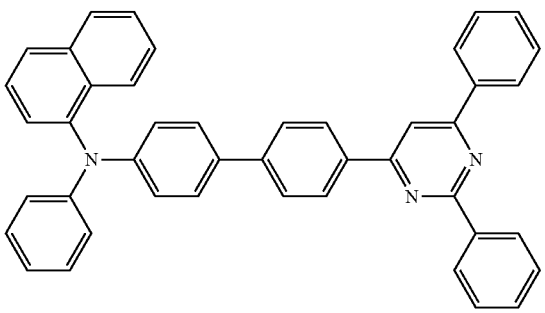
(5-35)
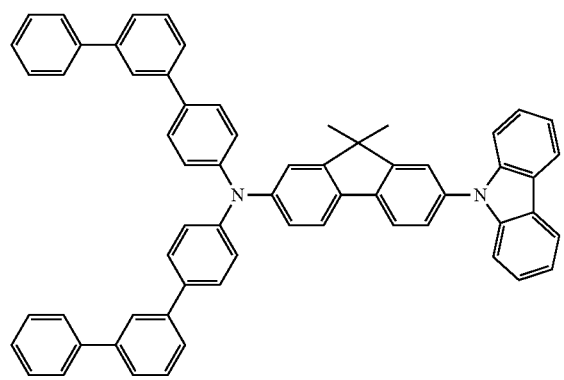
(5-36)
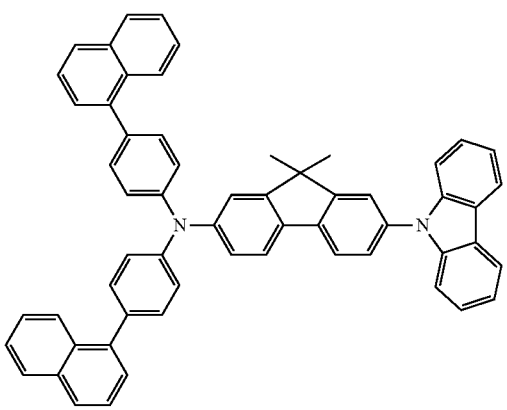
(5-37)
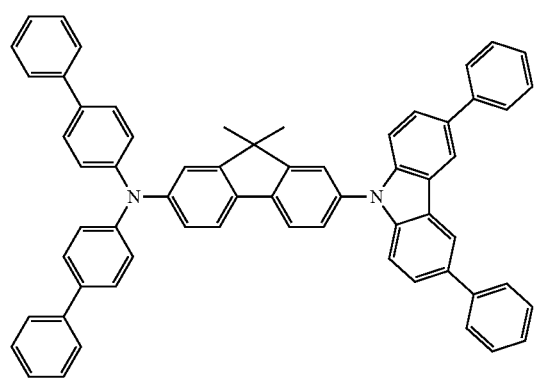
(5-38)
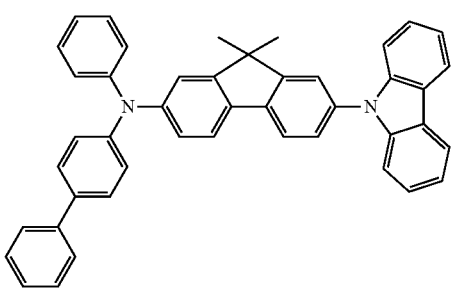
(5-39)
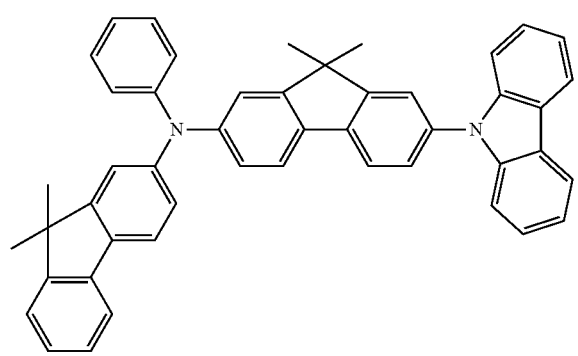
(5-40)
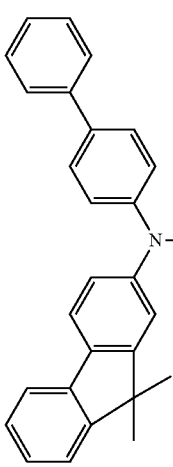

(5-41)
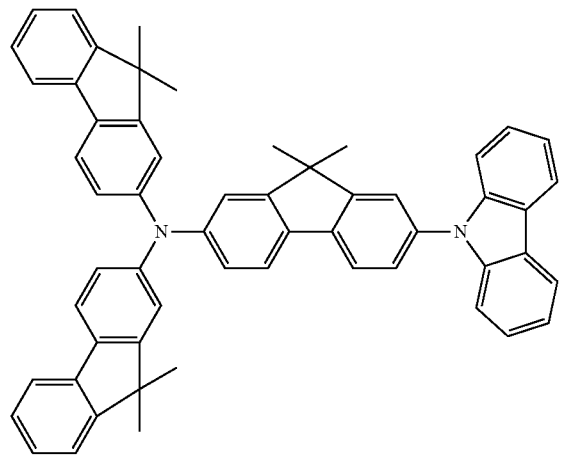
(5-42)
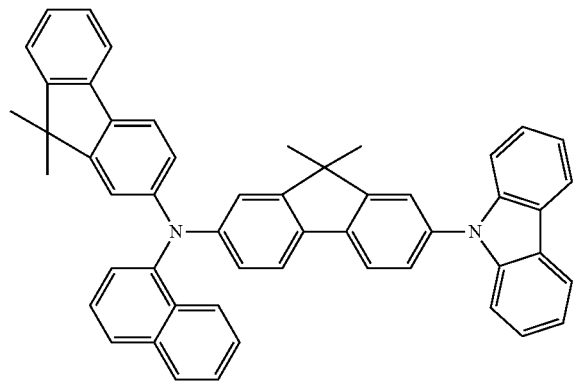
(5-43)
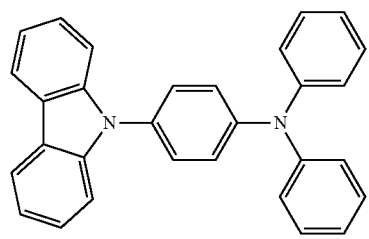
(5-44)
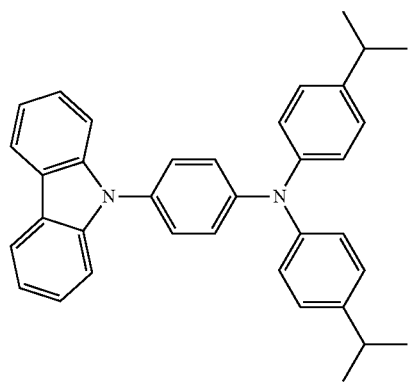
(5-45)
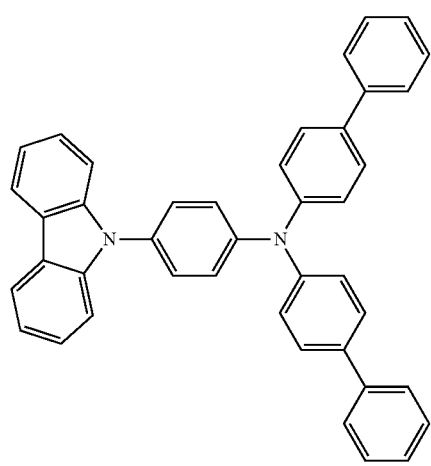
(5-46)
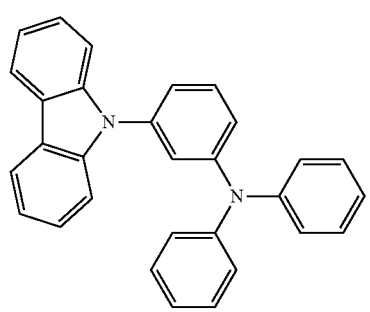

(5-47) 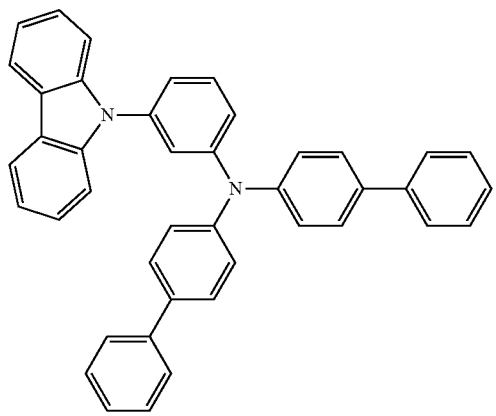
(5-48) 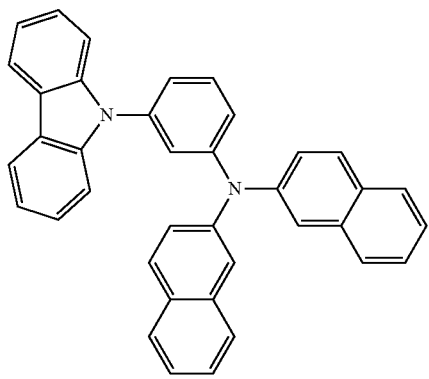
(5-49) 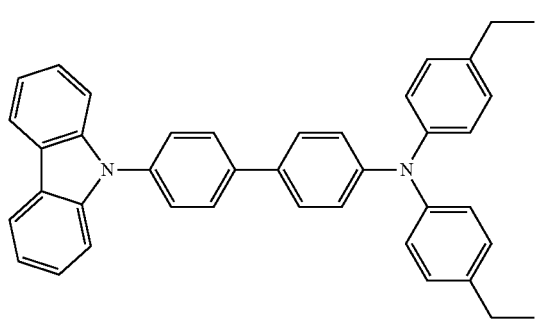
(5-50) 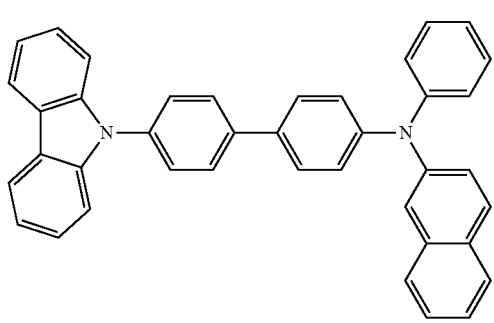
(5-51) 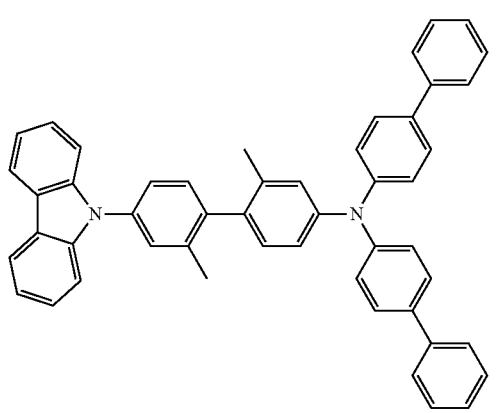
(5-52) 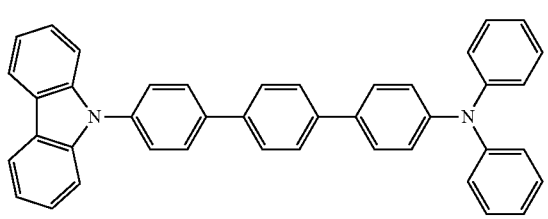
(5-53) 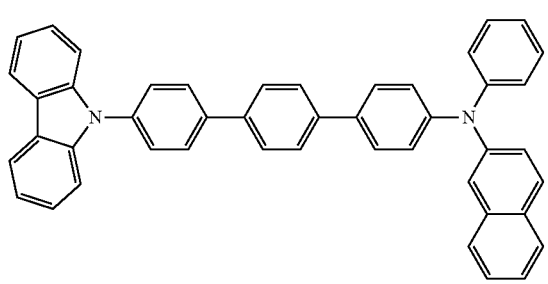
(5-54) 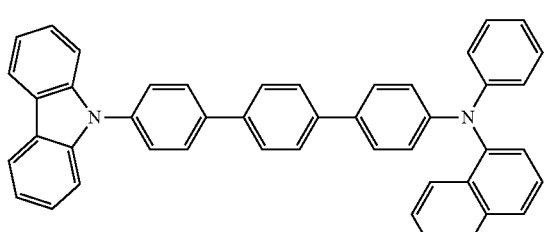

-continued
(5-55)
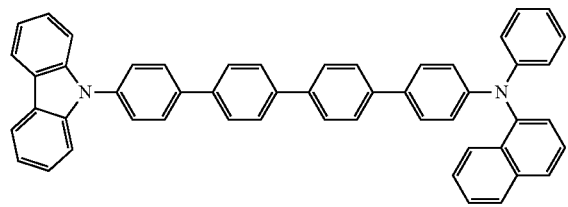
(5-56)
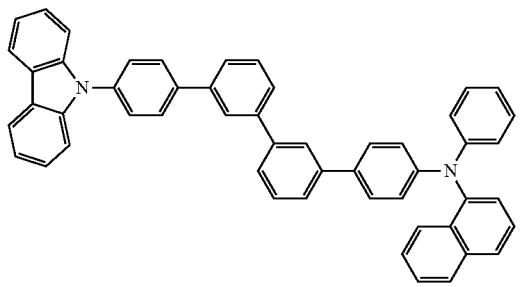
(5-57)
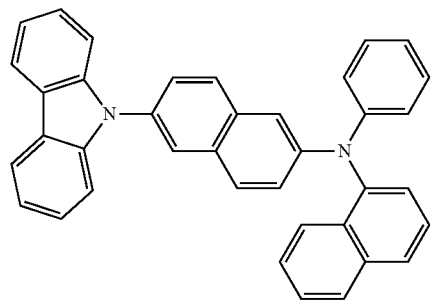
(5-58)
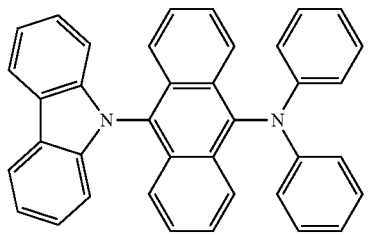
(5-59)
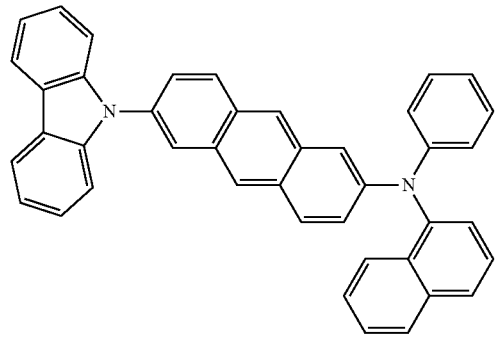
(5-60)
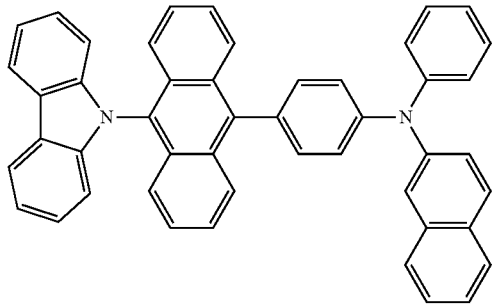
(5-61)
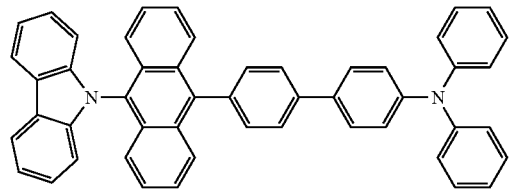
(5-62)
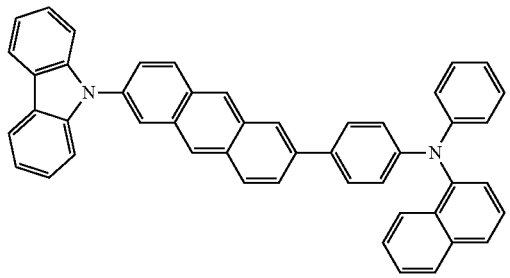
(5-63)
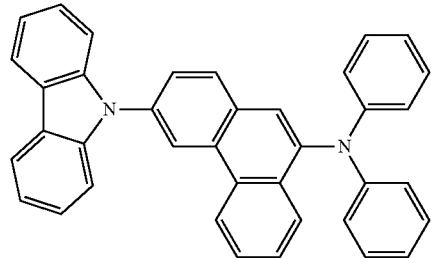
(5-64)
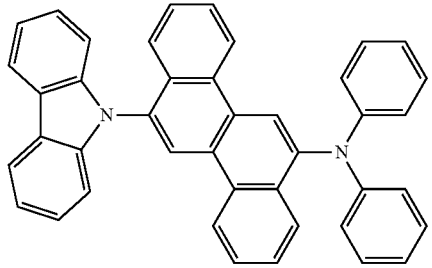

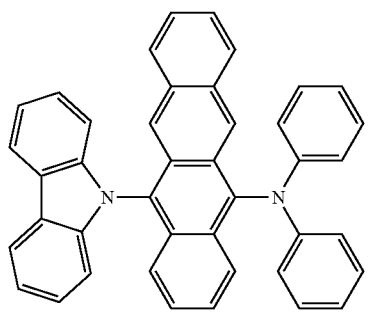
(5-65)
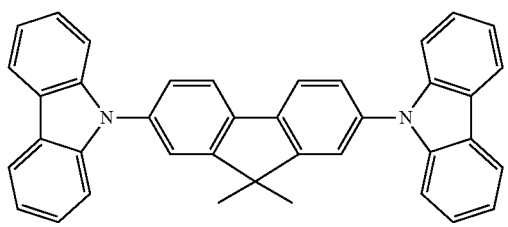
(5-66)
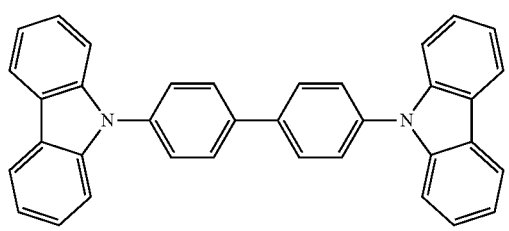
(5-67)
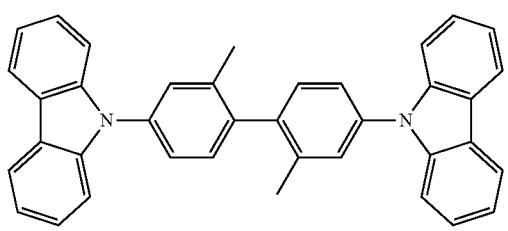
(5-68)
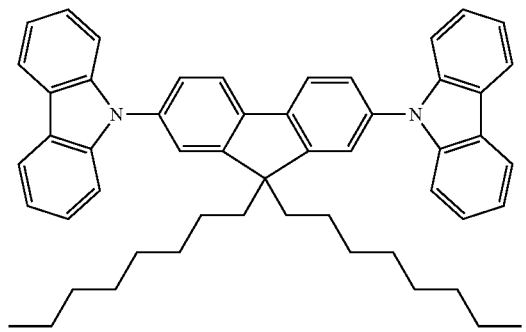
(5-69)
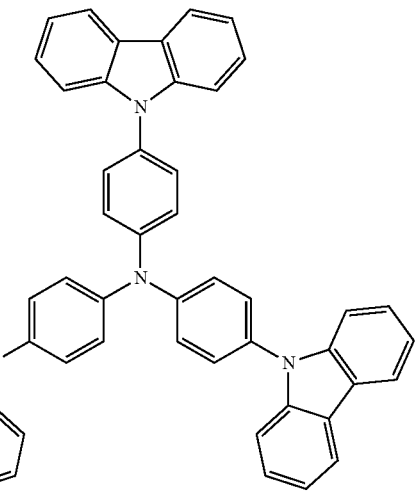
(5-70)
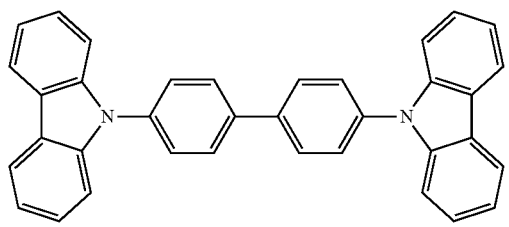
(5-71)
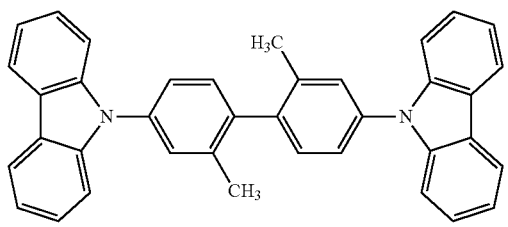
(5-72)
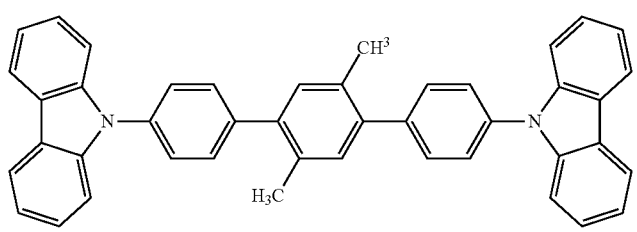
(5-73)

(5-74)
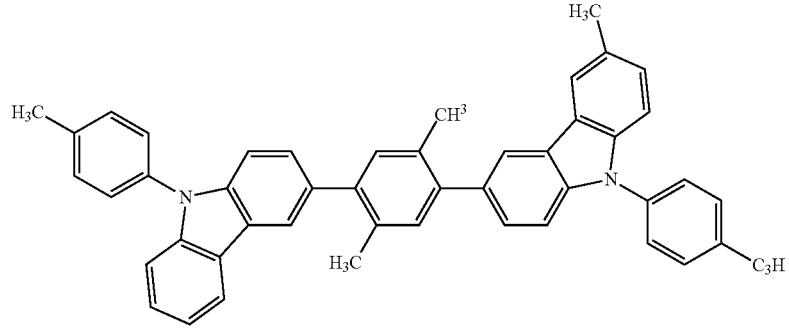
(5-75)
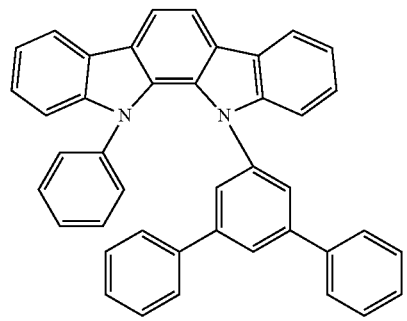
(5-76)
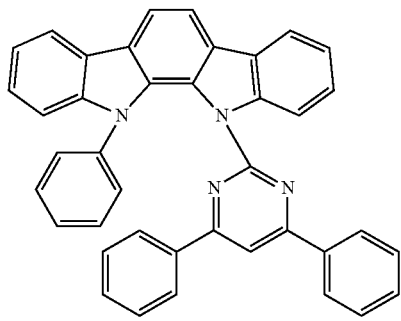
(5-77)
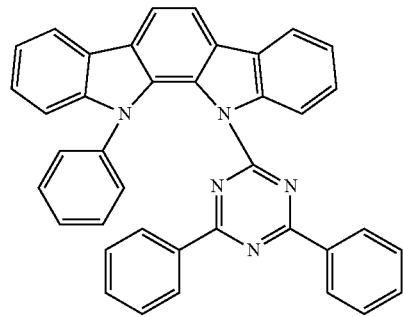
(5-78)
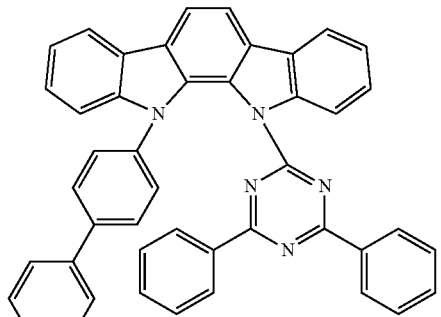
(5-79)
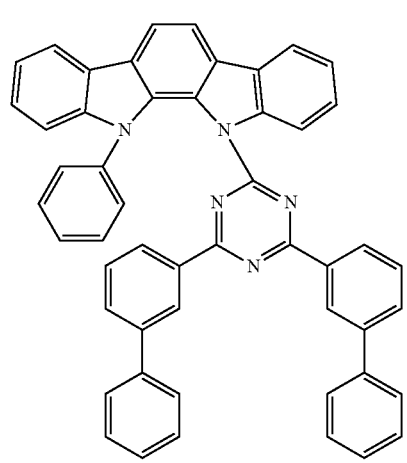
(5-80)
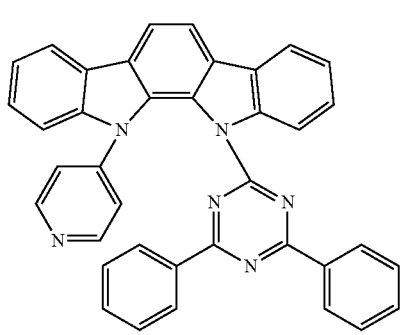

(5-81)
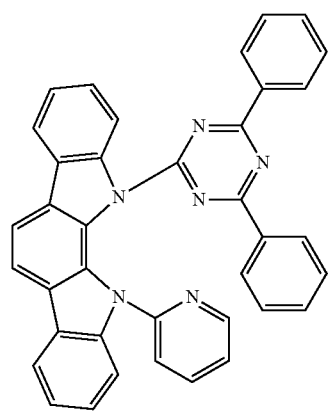
(5-82)
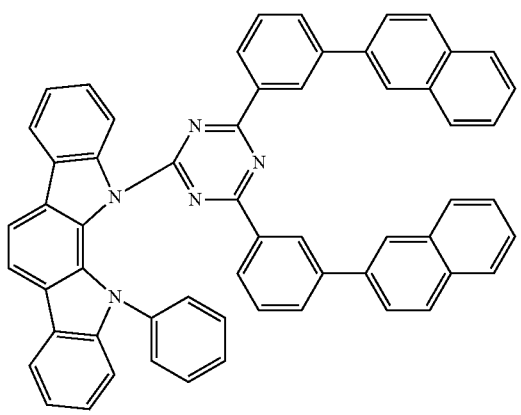
(5-83)
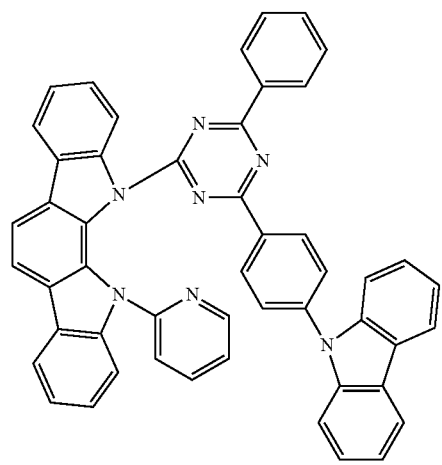
(5-84)
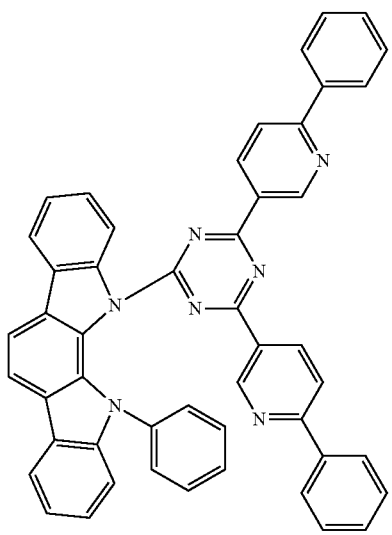
(5-85)
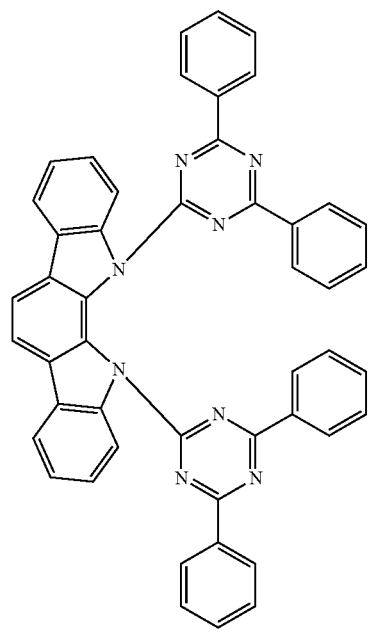
(5-86)
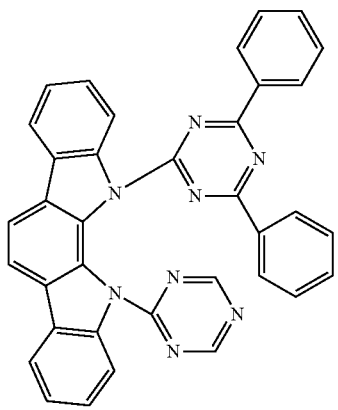

-continued
(5-87)
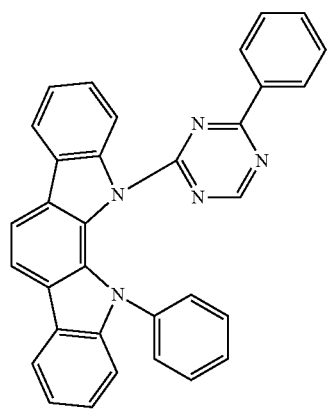
(5-88)
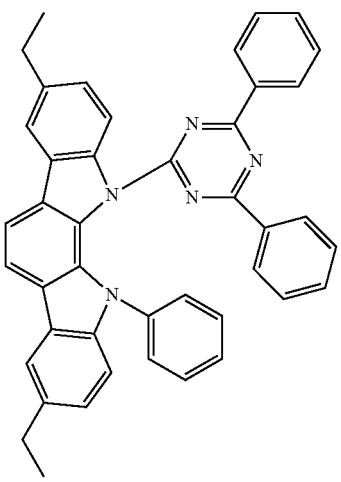
(5-89)
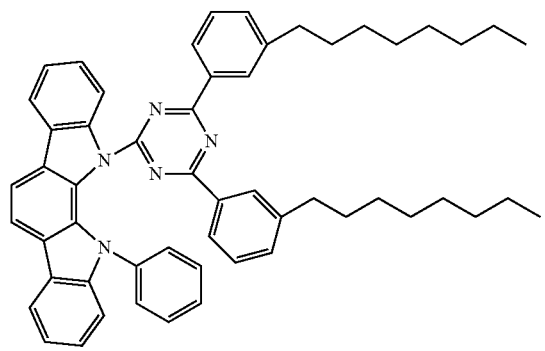
(5-90)
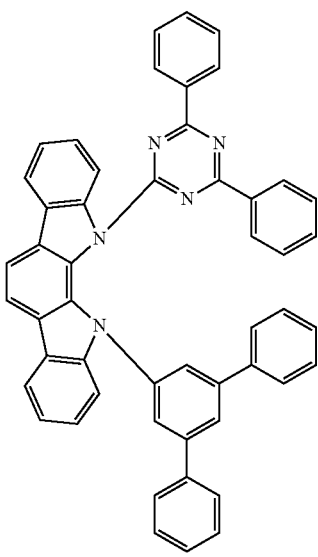
(5-91)
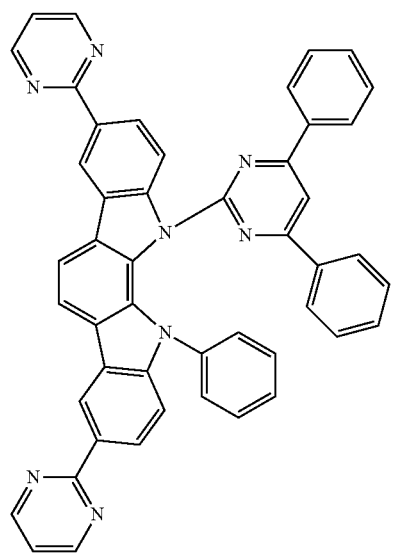
(5-92)
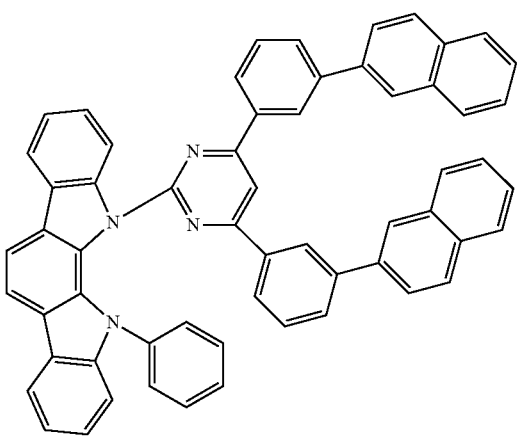

-continued
(5-93)
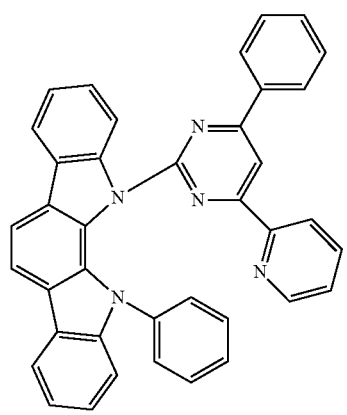
(5-94)
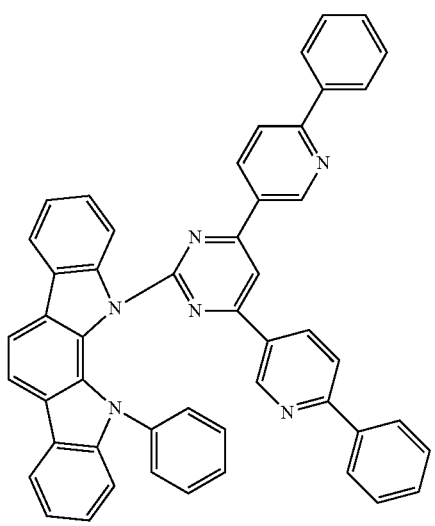
(5-95)
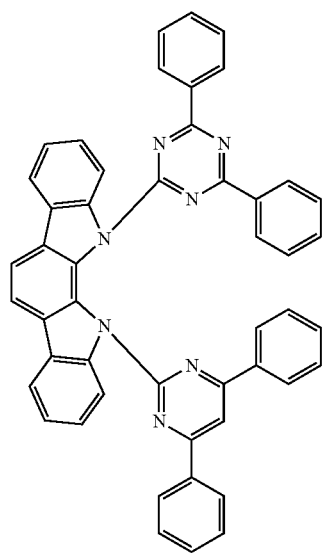
(5-96)
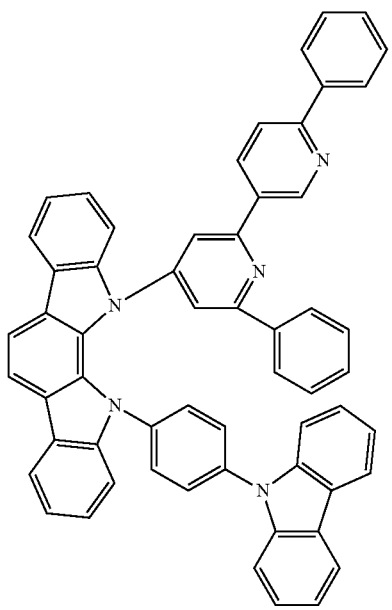
(5-97)
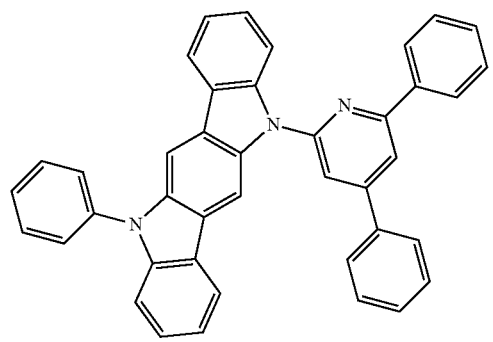
(5-98)
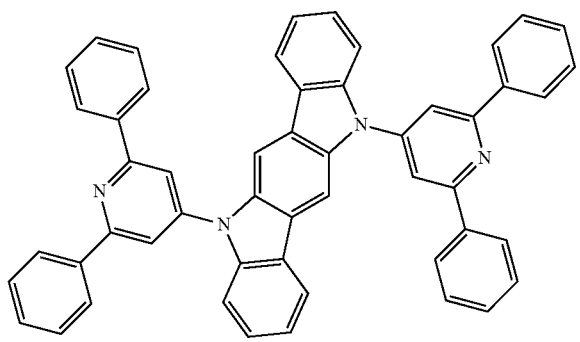

-continued
(5-99)
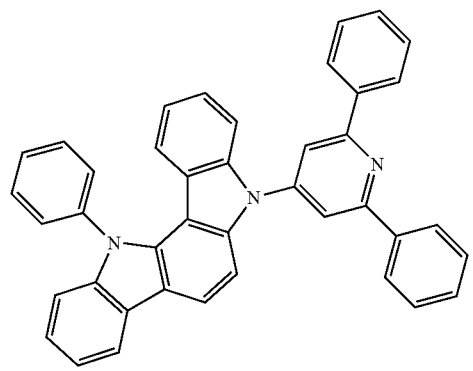
(5-100)
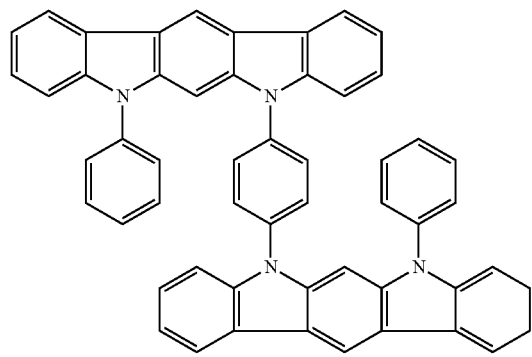
(5-101)
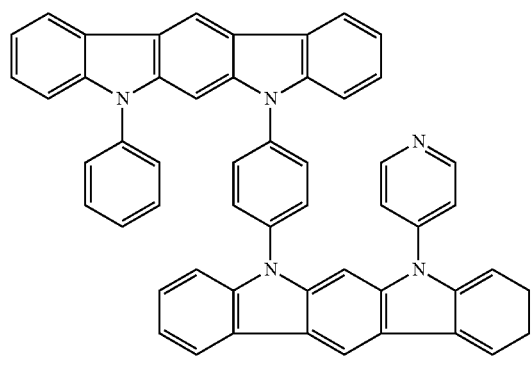
(5-102)
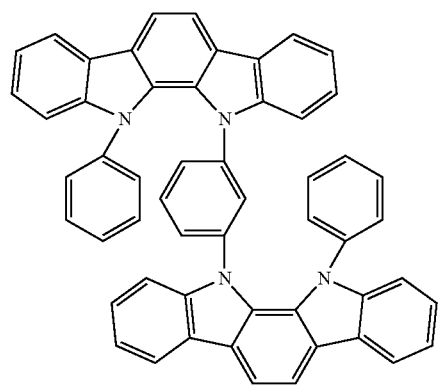
(5-103)
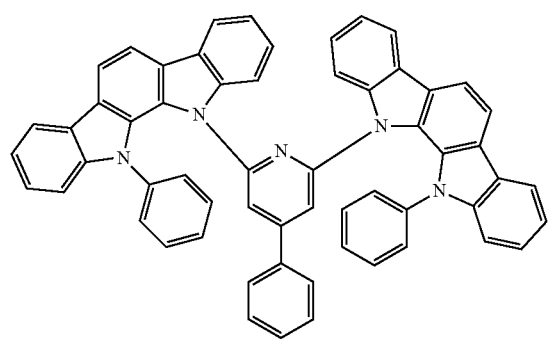
(5-104)
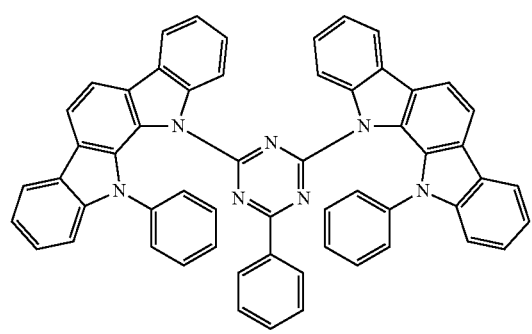
(5-105)
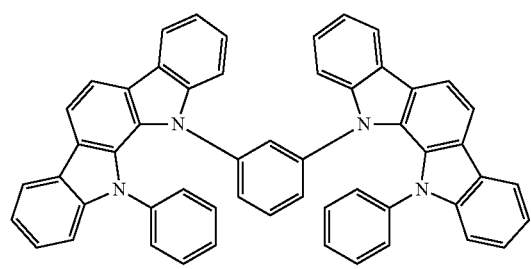
(5-106)
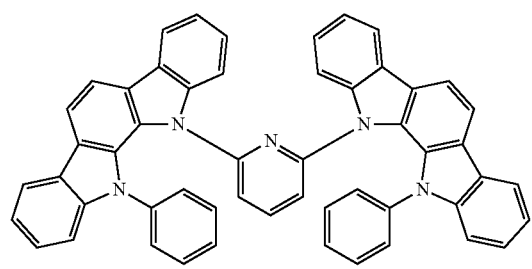

-continued
(5-107)
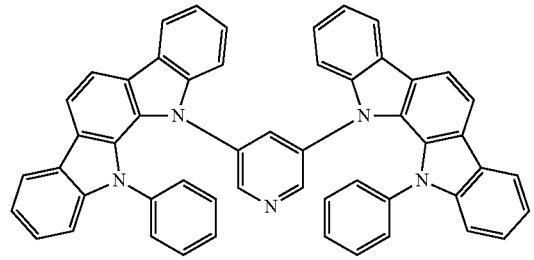
(5-108)
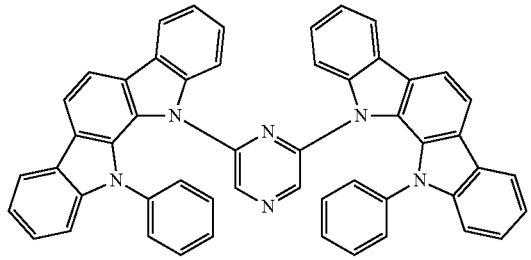
(5-109)
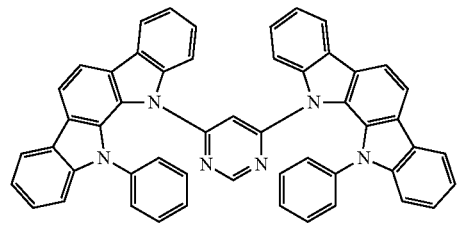
(5-110)
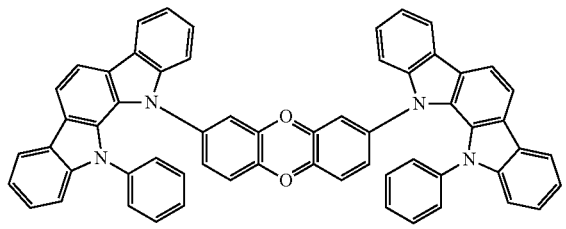
(5-111)
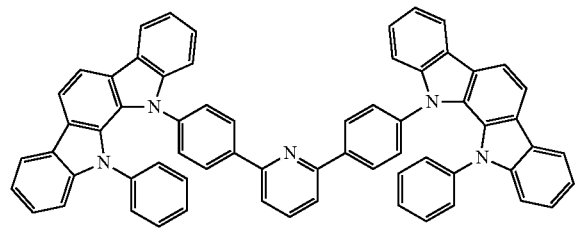
(5-112)
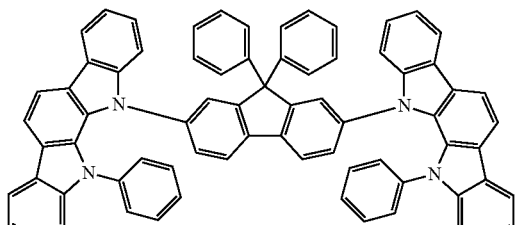
(5-113)
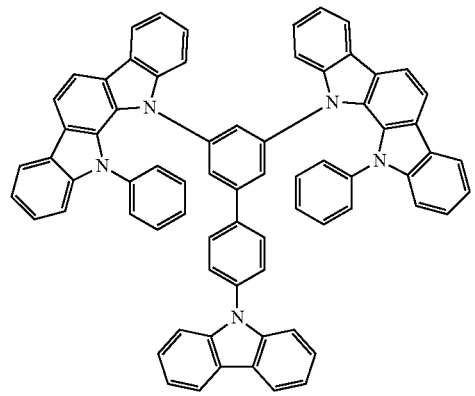
(5-114)
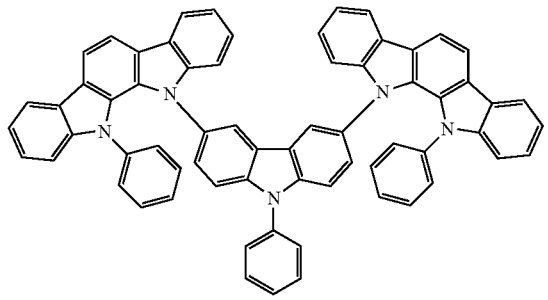
(5-115)
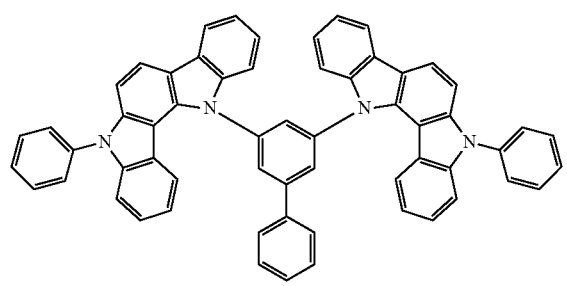
(5-116)
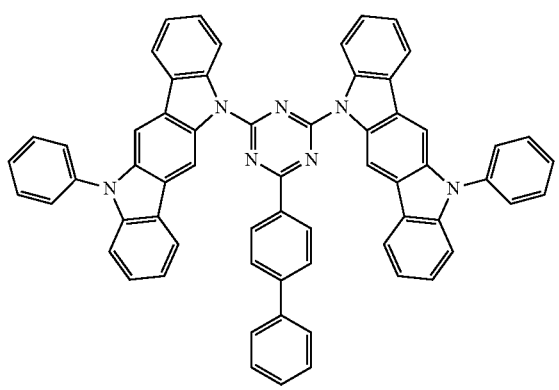

(5-117)
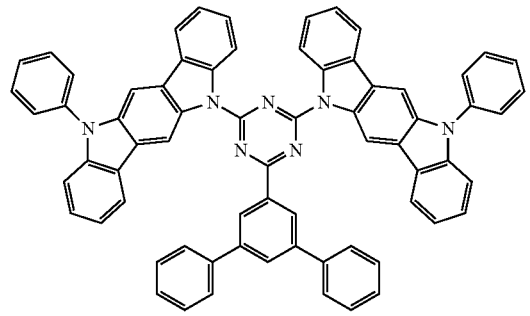
(5-118)
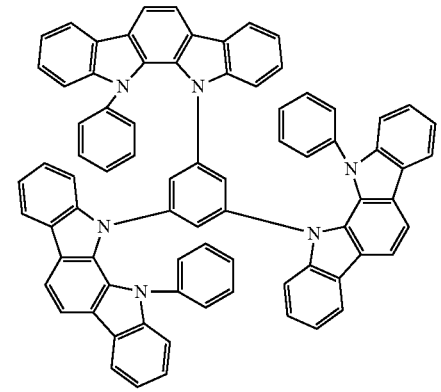
(5-119)
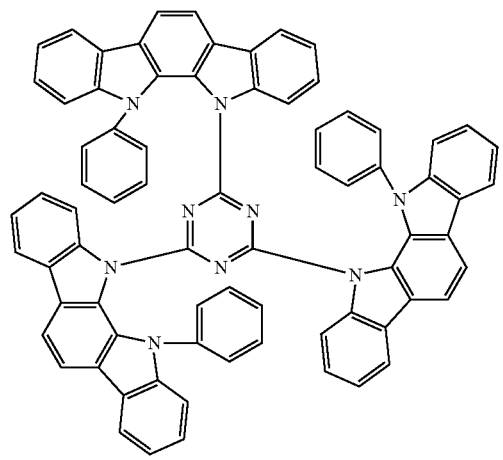
(5-120)
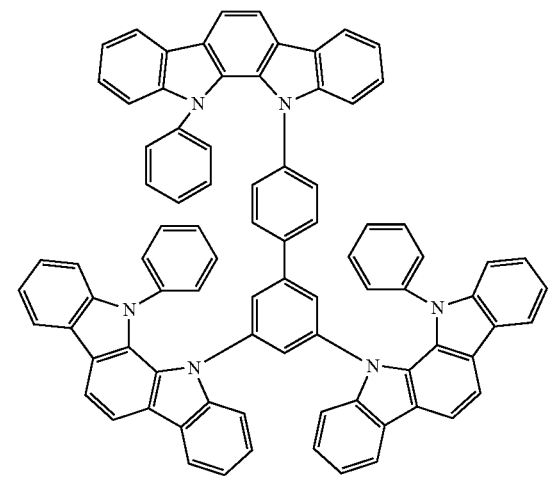
(5-121)
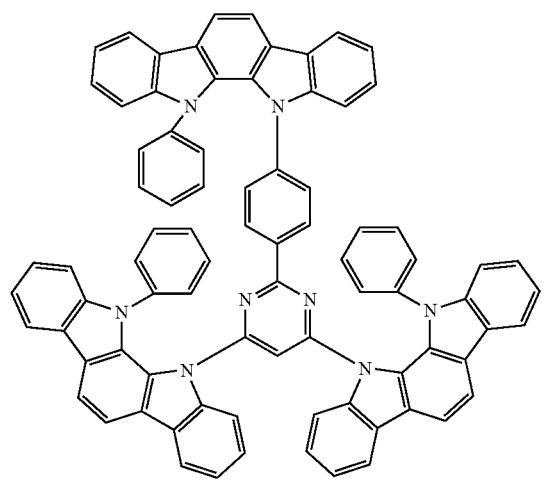
(5-122)
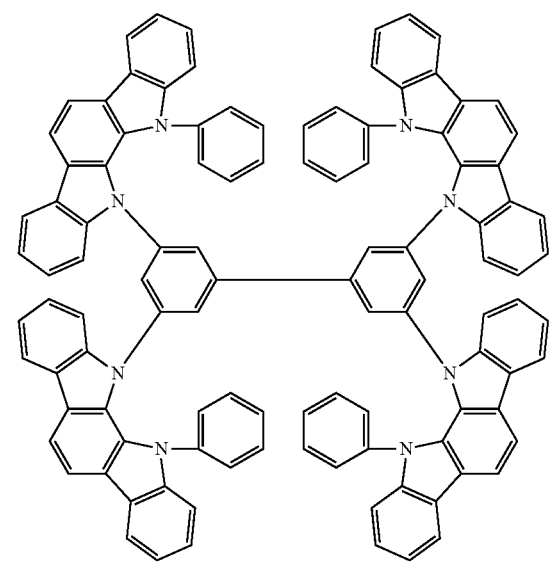

(5-123)
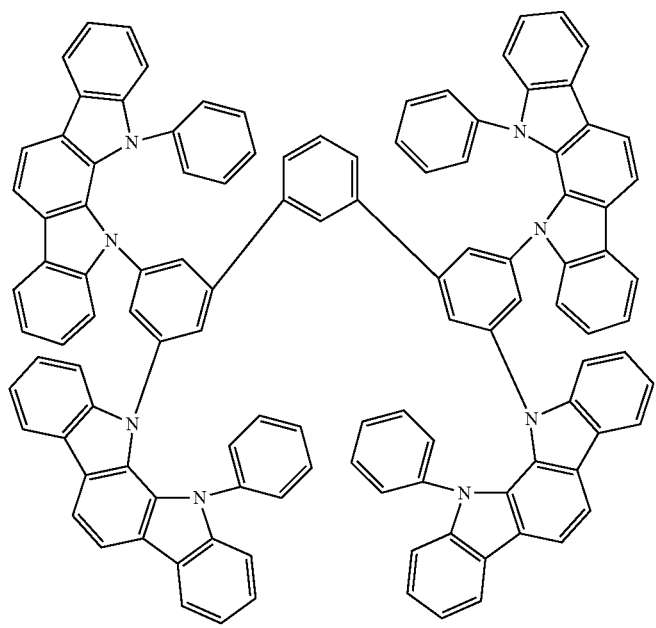
(5-124)
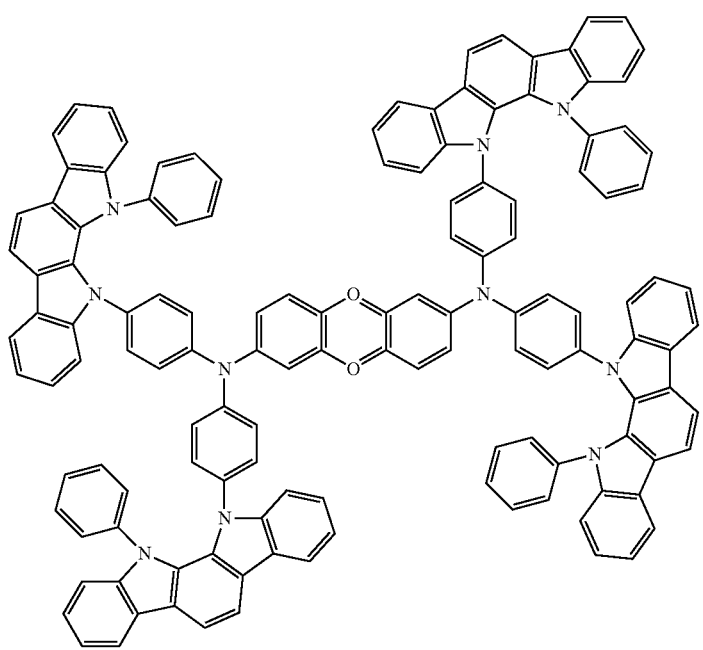

-continued
(5-125)
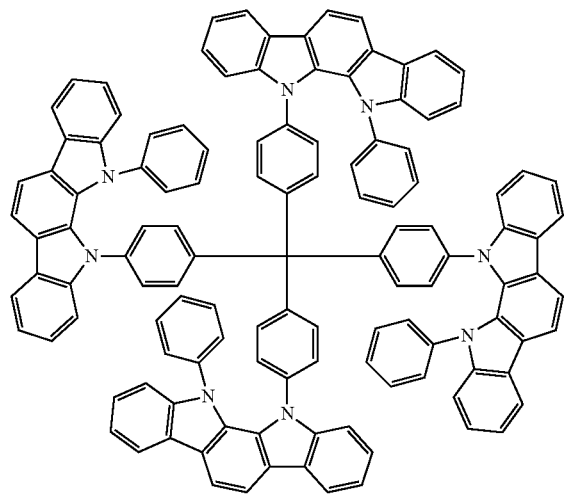
(5-126)
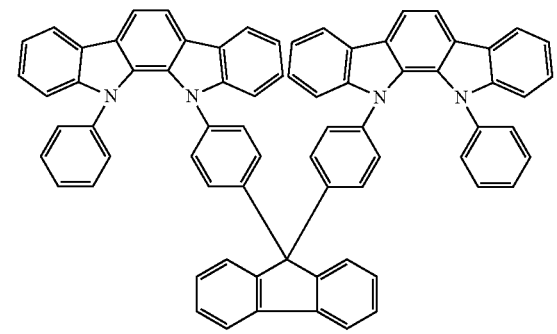
(5-127)
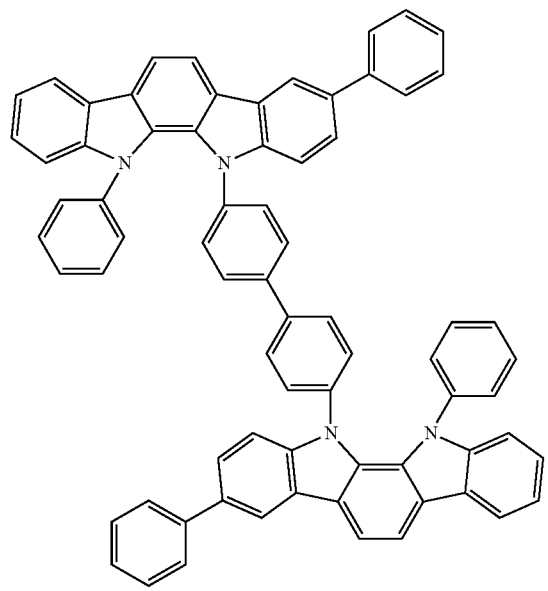
(5-128)
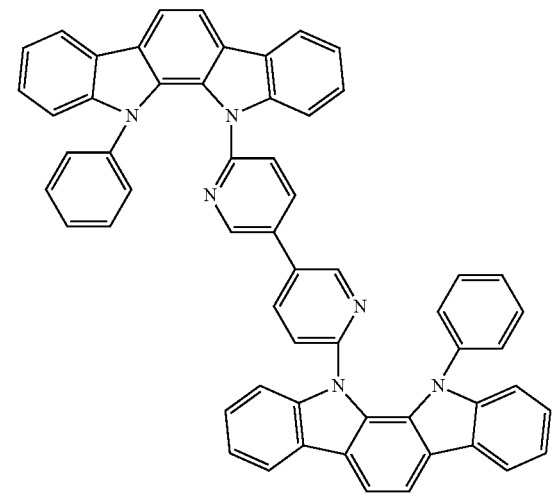
(5-129)
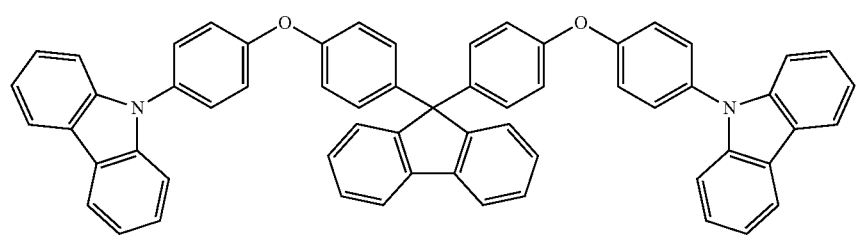
(5-130)
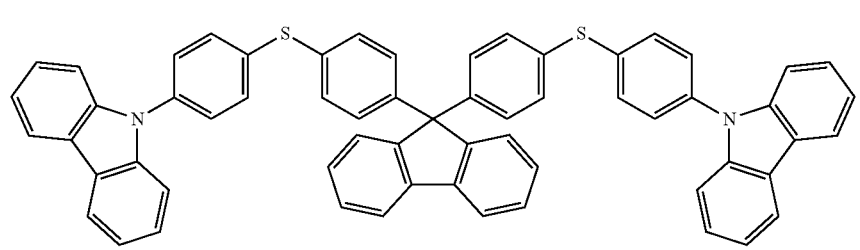

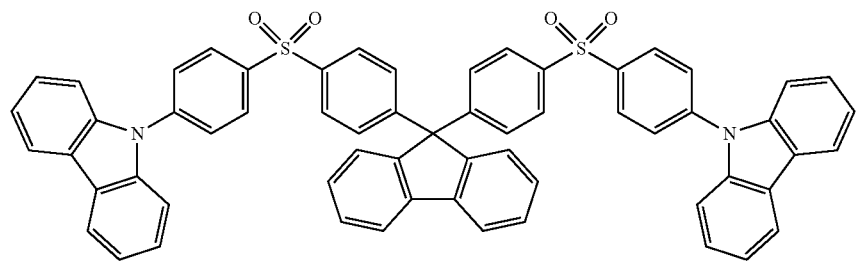
(5-131)
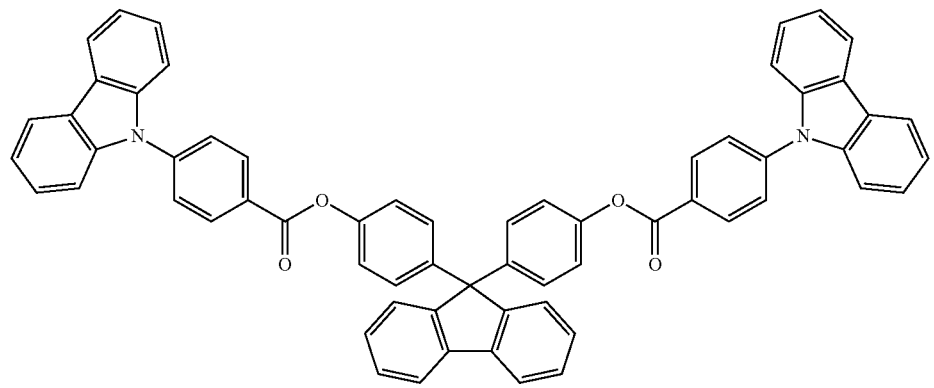
(5-132)
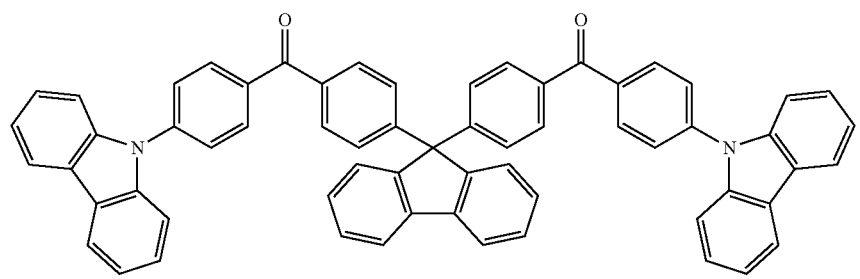
(5-133)
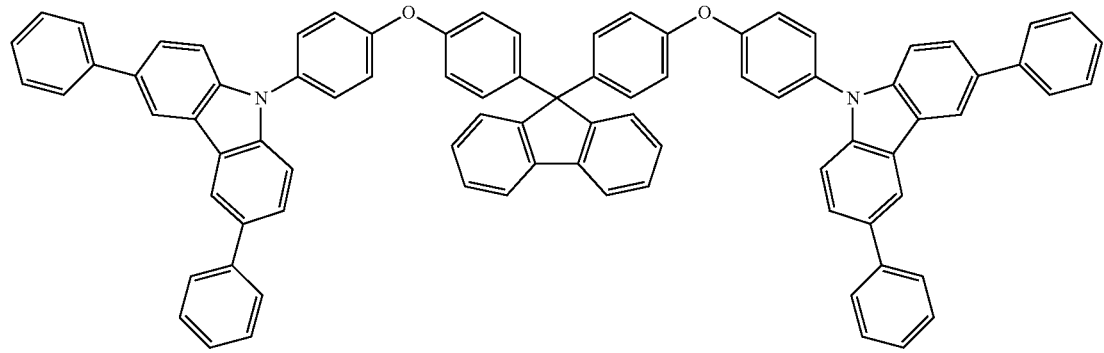
(5-134)
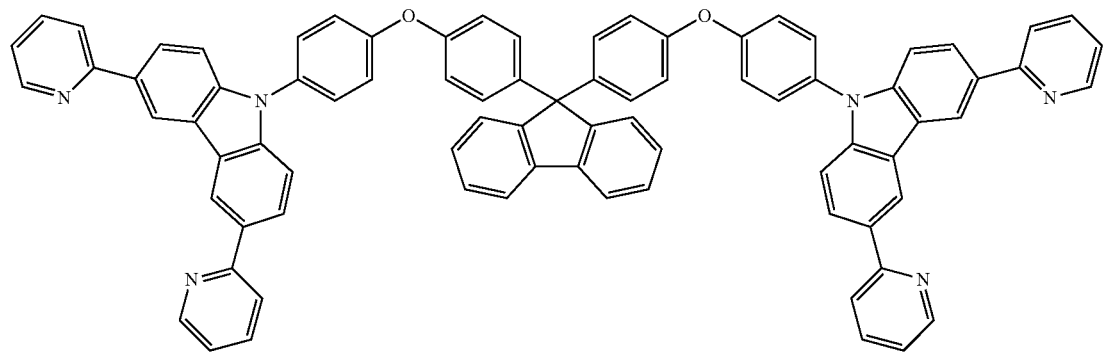
(5-135)

(5-136)
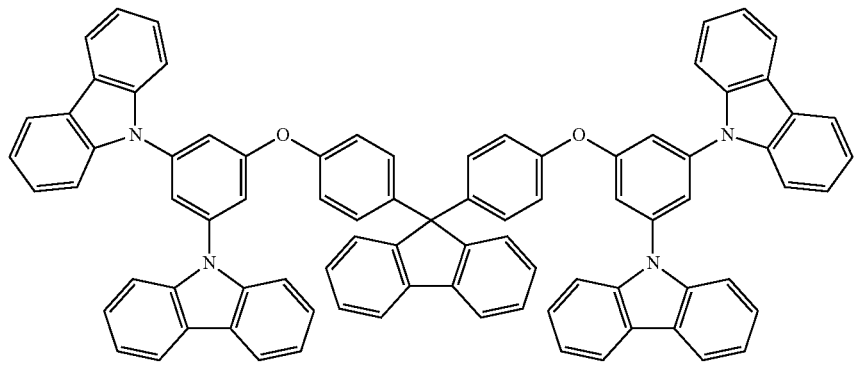
(5-137)
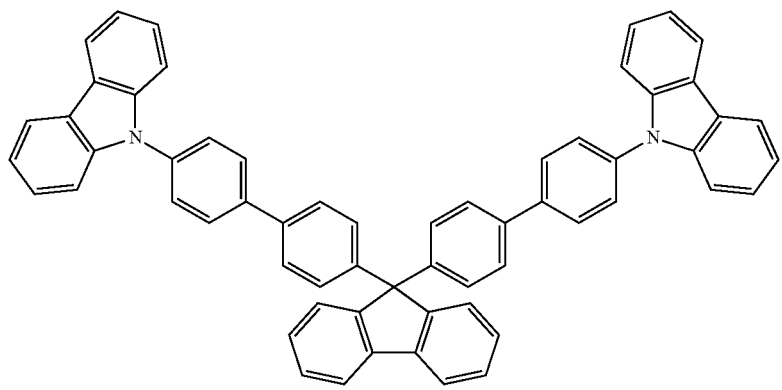
(5-138)
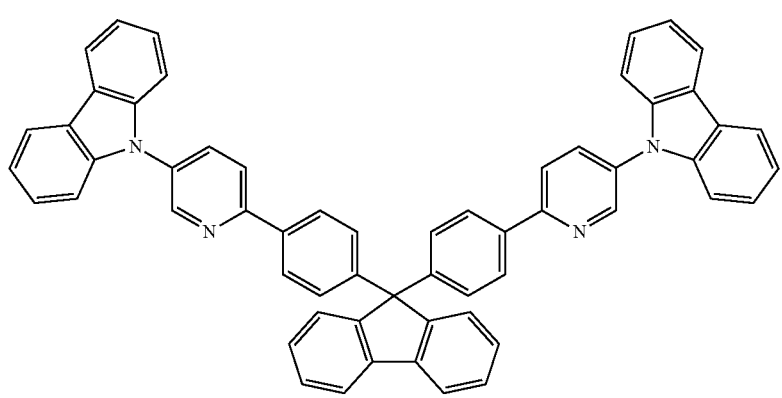
(5-139)
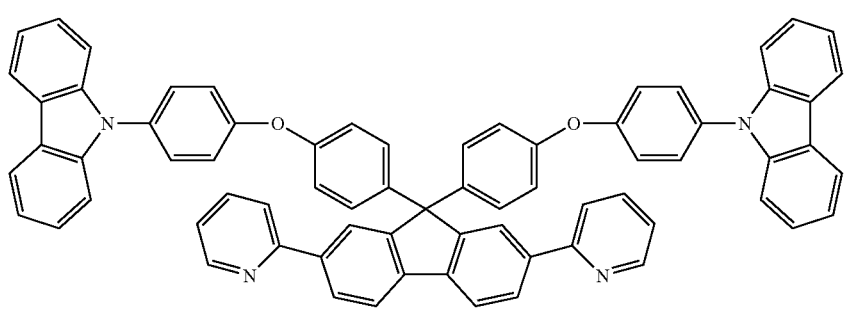

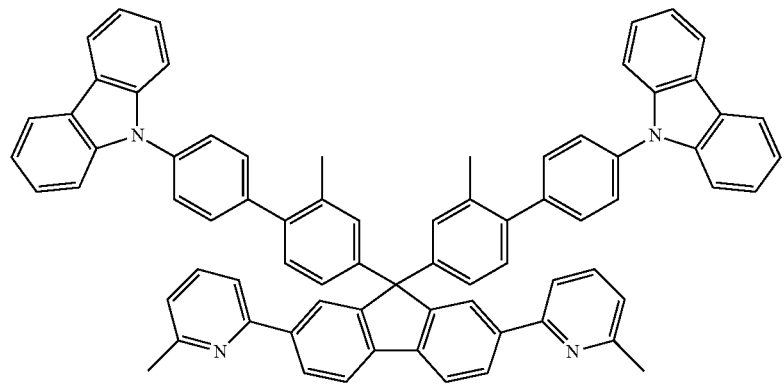
(5-140)
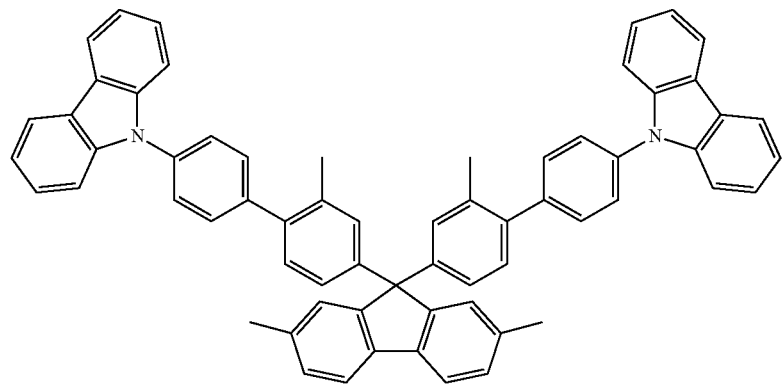
(5-141)
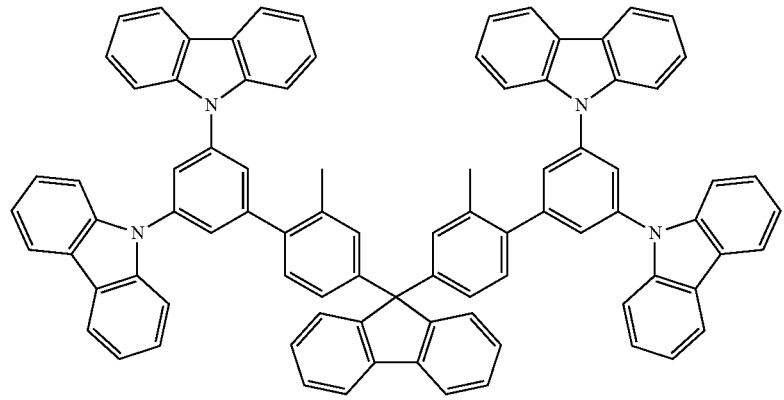
(5-142)
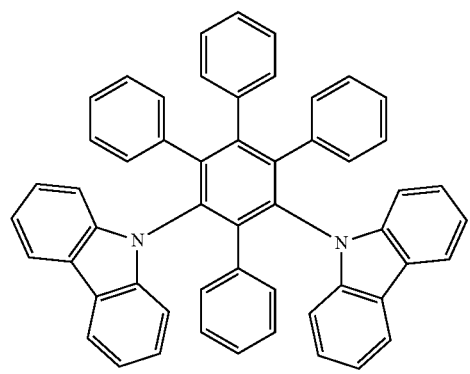
(5-143)
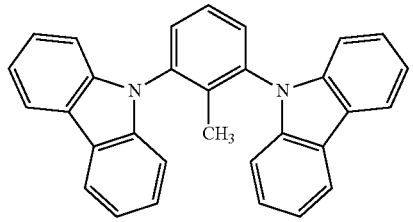
(5-144)

-continued
(5-145)
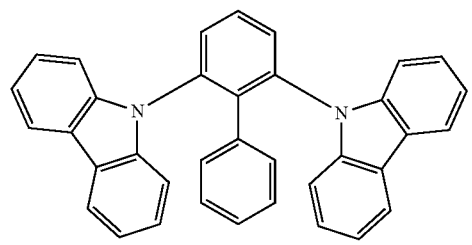
(5-146)
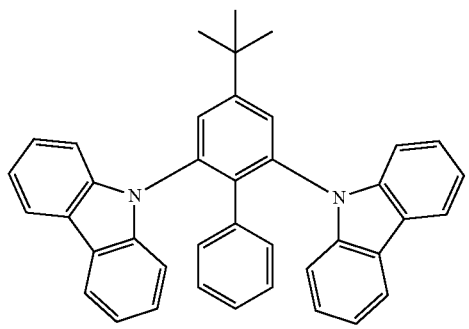
(5-147)
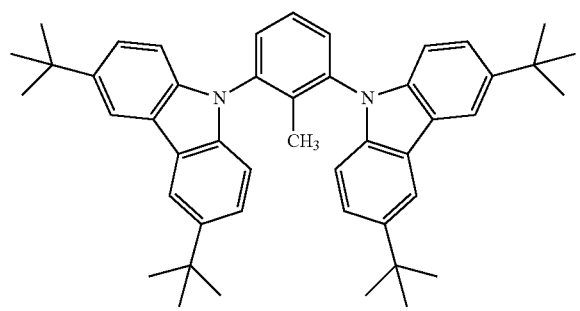
(5-148)
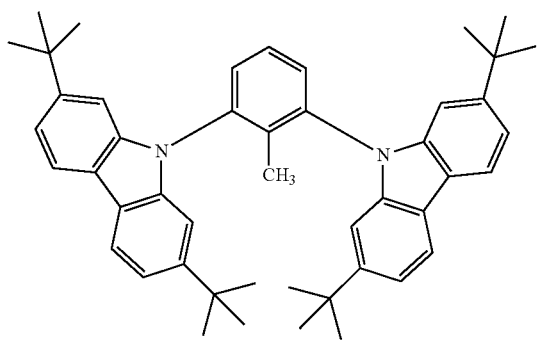
(5-149)
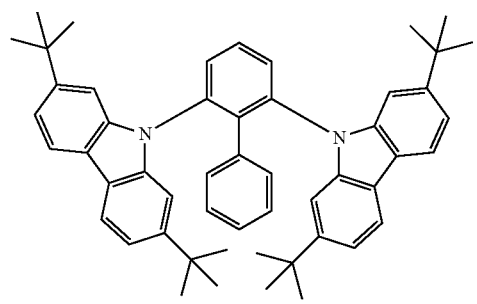
(5-150)
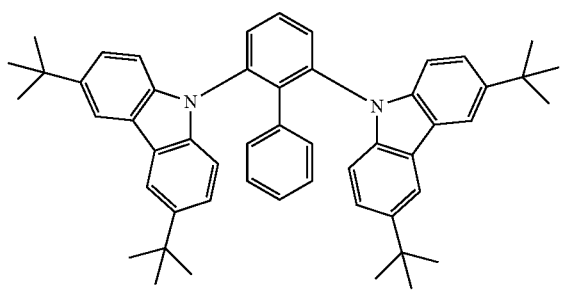
(5-151)
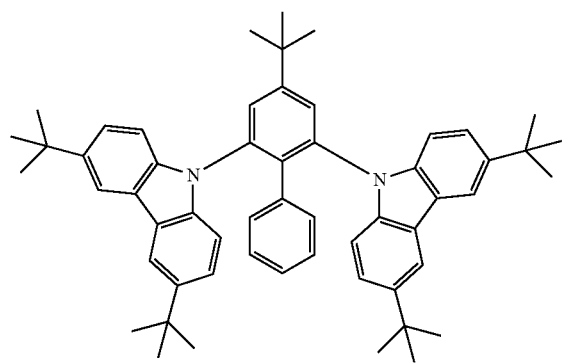
(5-152)
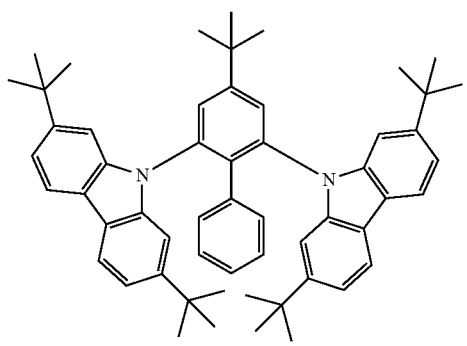

-continued
(5-153)
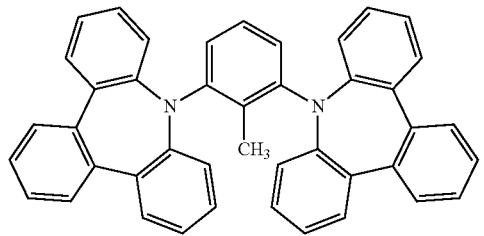
(5-154)
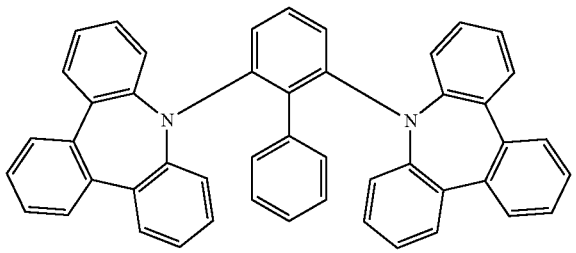
(5-155)
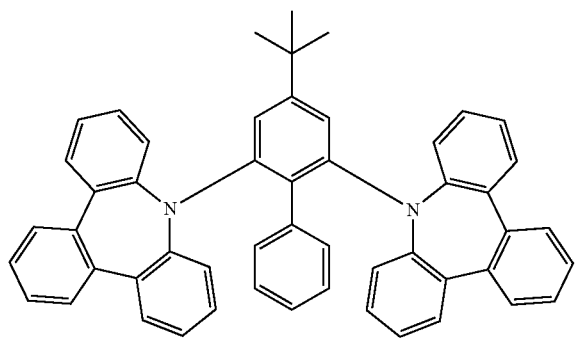
(5-156)
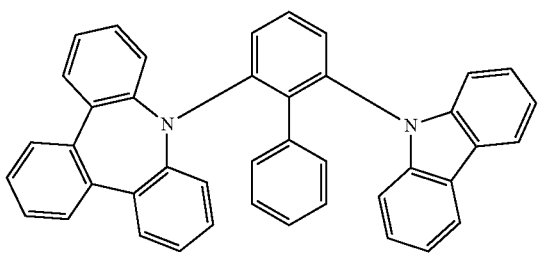
(5-157)
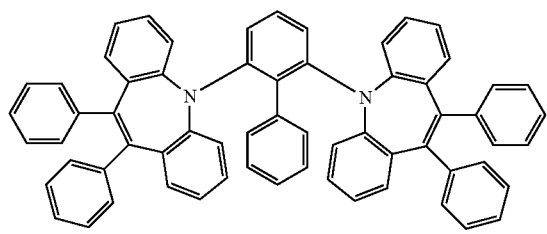
(5-159)
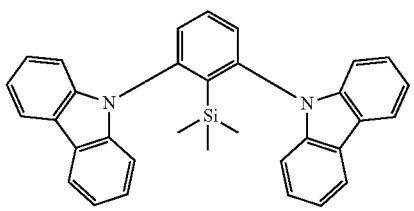
(5-160)
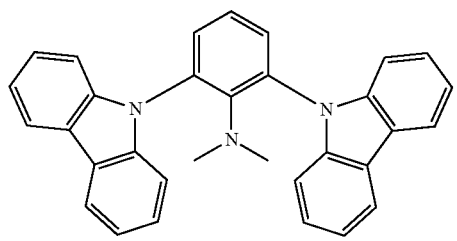
(5-161)
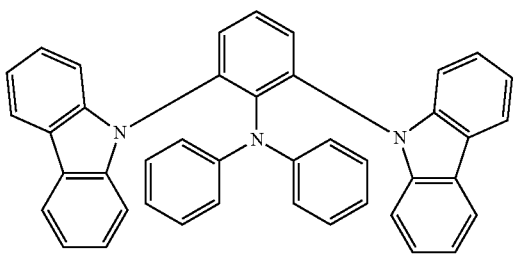
(5-162)
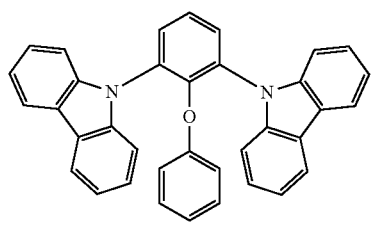
(5-163)
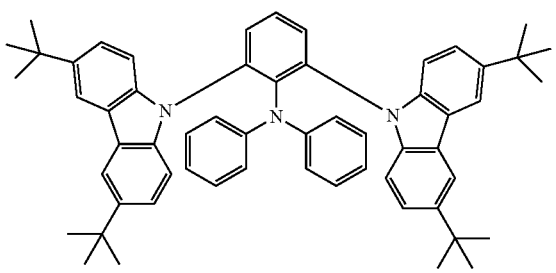

(5-164)
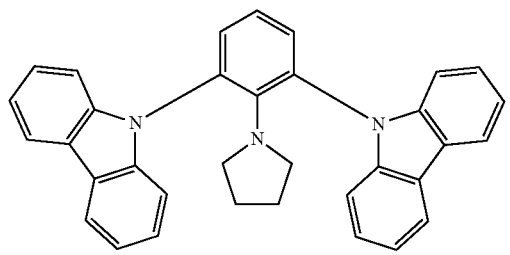
(5-165)
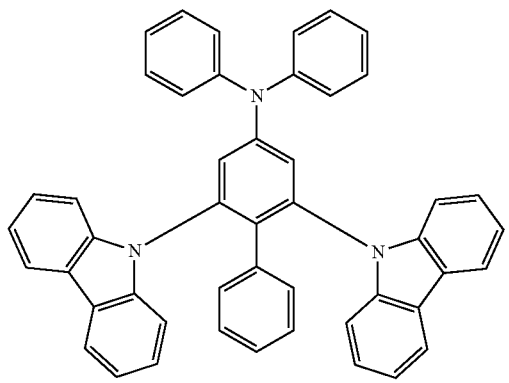
(5-166)
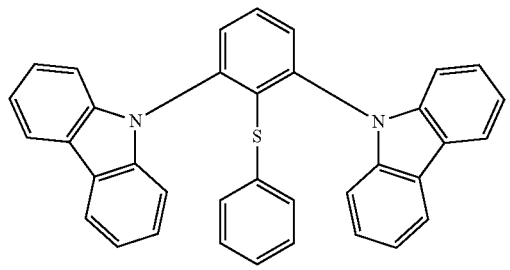
The compounds represented by the formula (6) are exemplified by those represented by the formulas (6-1) to (6-45) below.
(6-1)
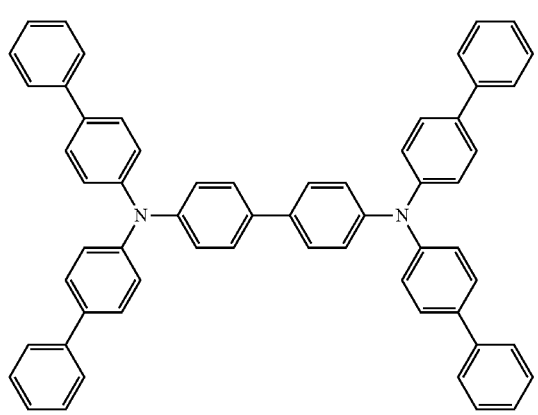
(6-2)
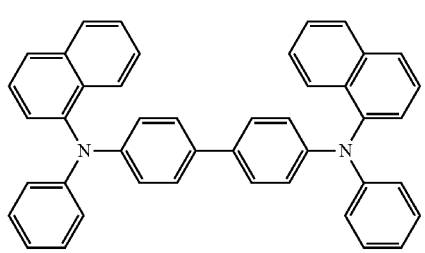
(6-3)
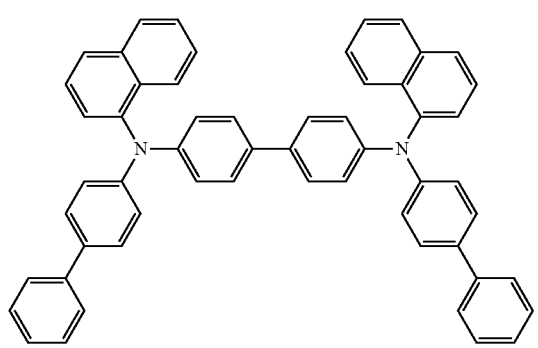
(6-4)
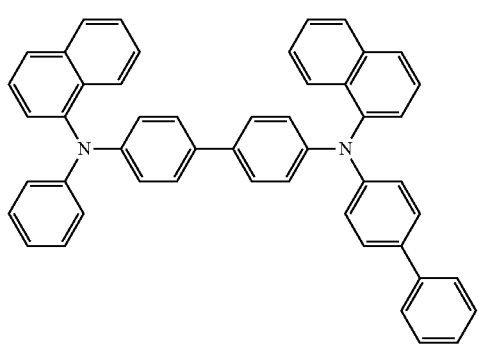

-continued
(6-5)
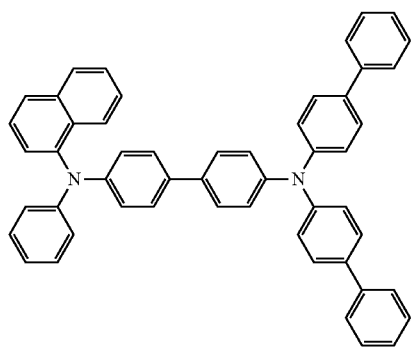
(6-6)
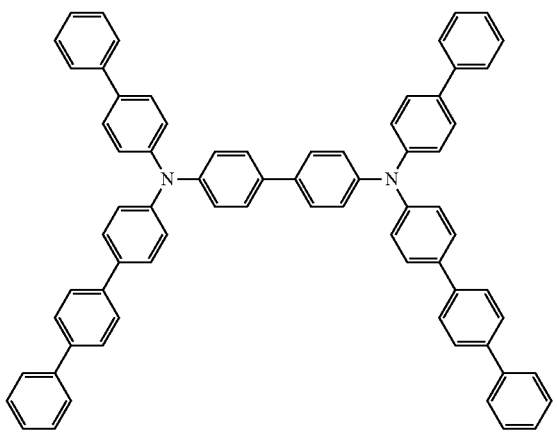
(6-7)
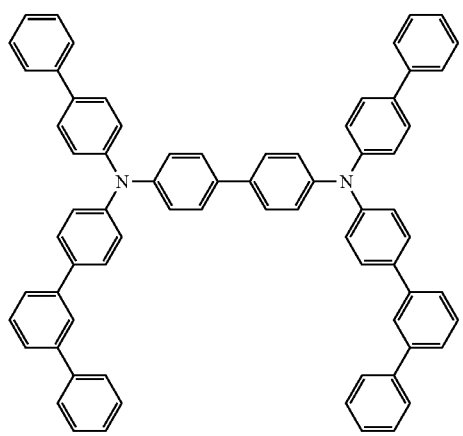
(6-8)
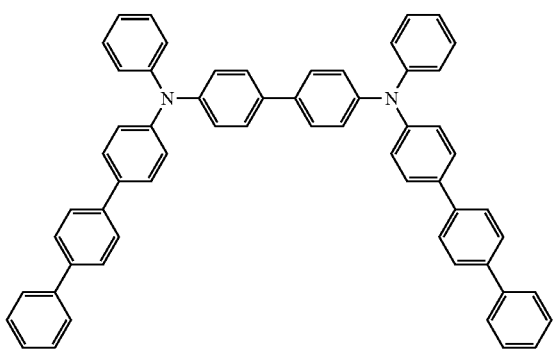
(6-9)
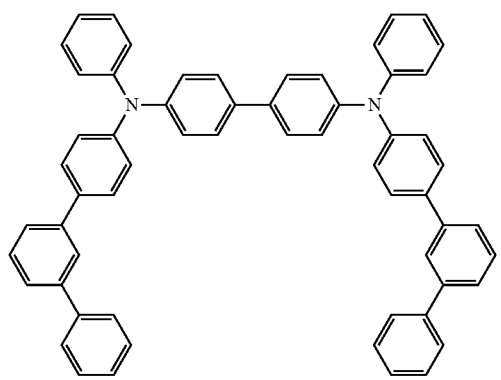
(6-10)
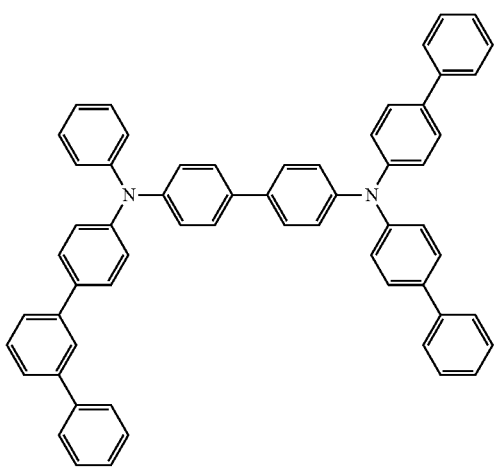

(6-11)
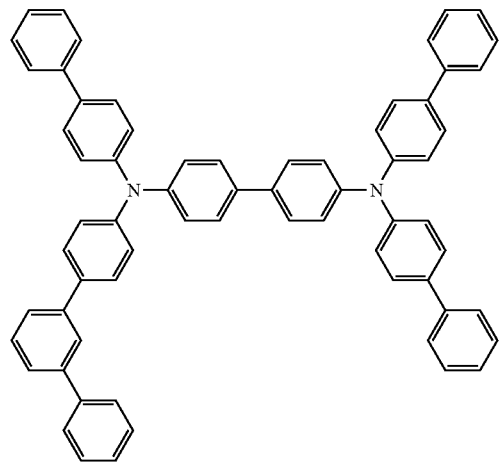
(6-12)
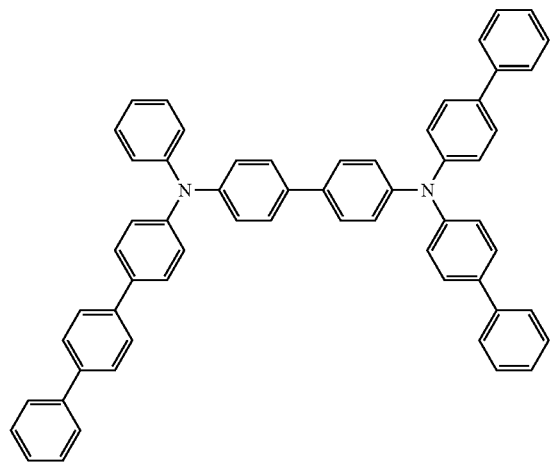
(6-13)
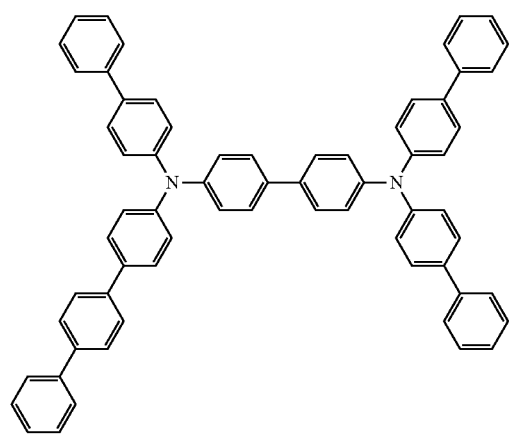
(6-14)
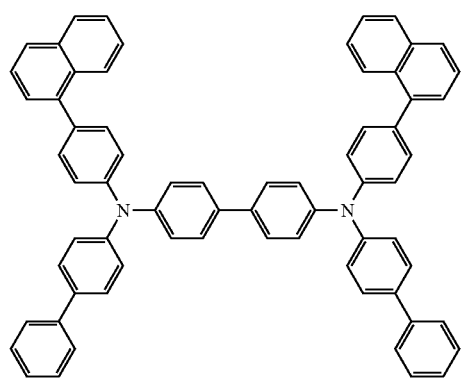
(6-15)
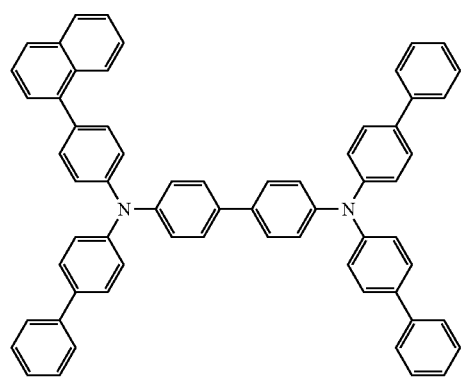
(6-16)
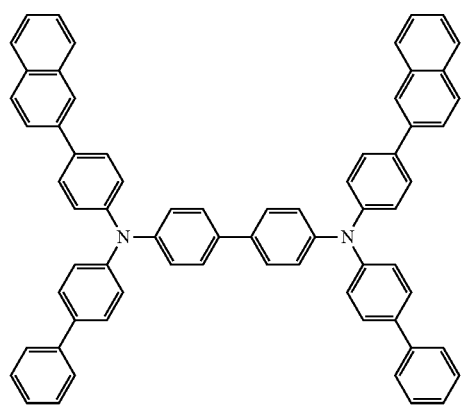

-continued
(6-17)
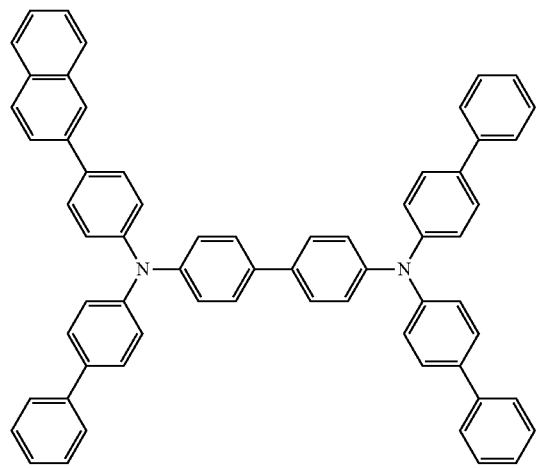
(6-18)
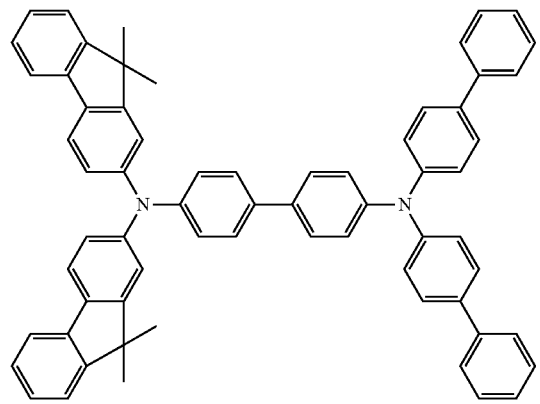
(6-19)
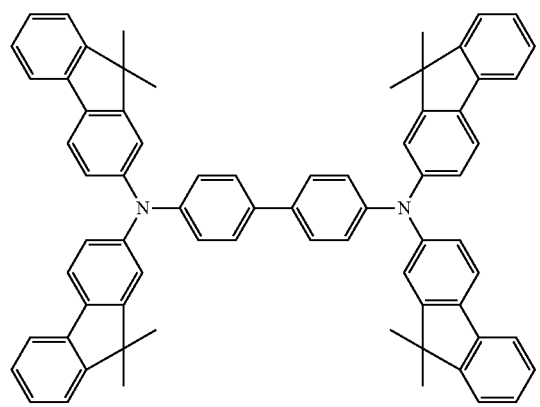
(6-20)
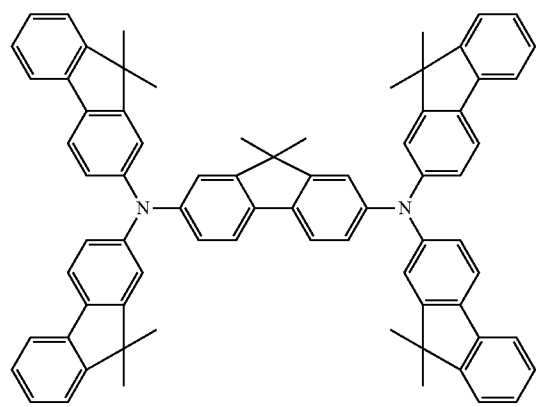
(6-21)
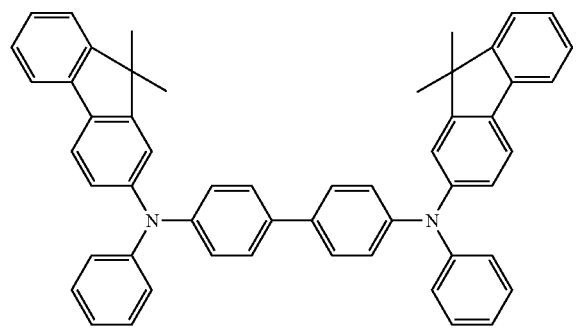
(6-22)
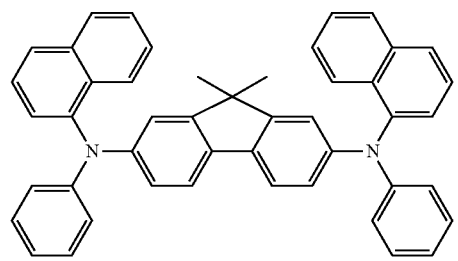

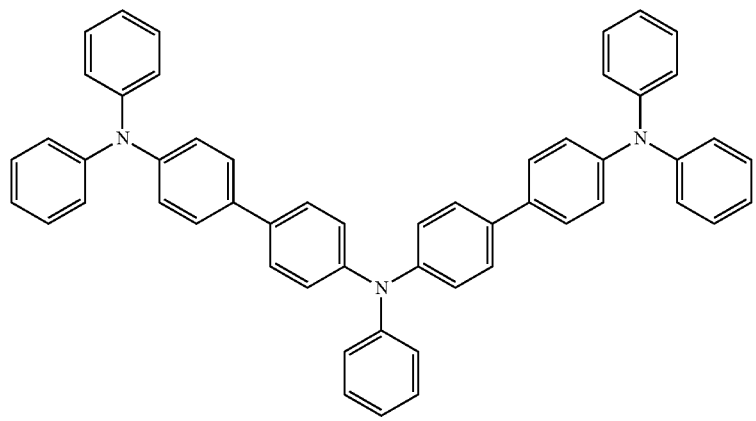
(6-23)
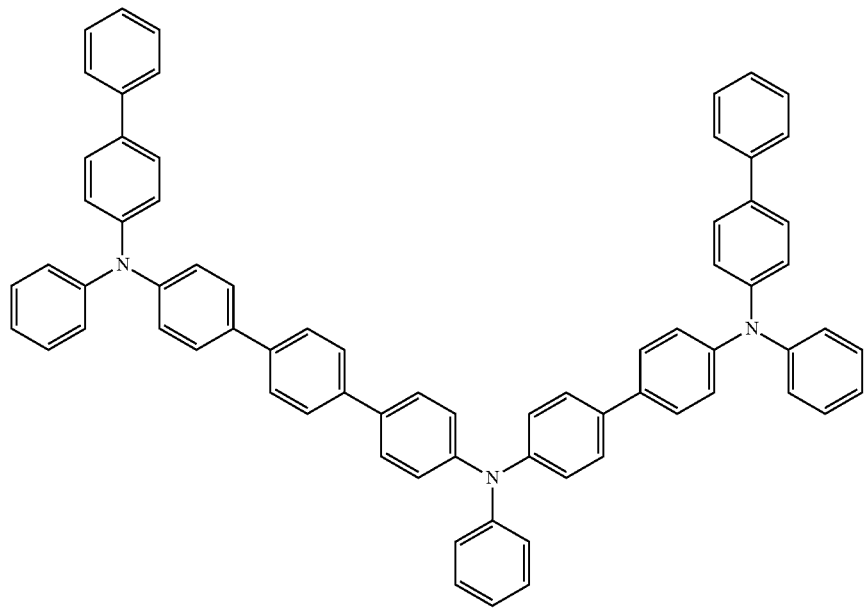
(6-24)
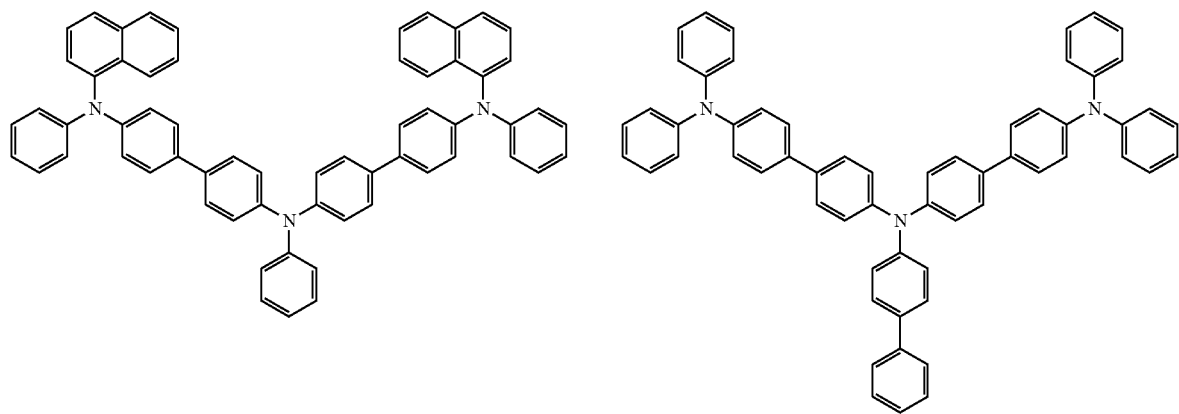
(6-25) (6-26)

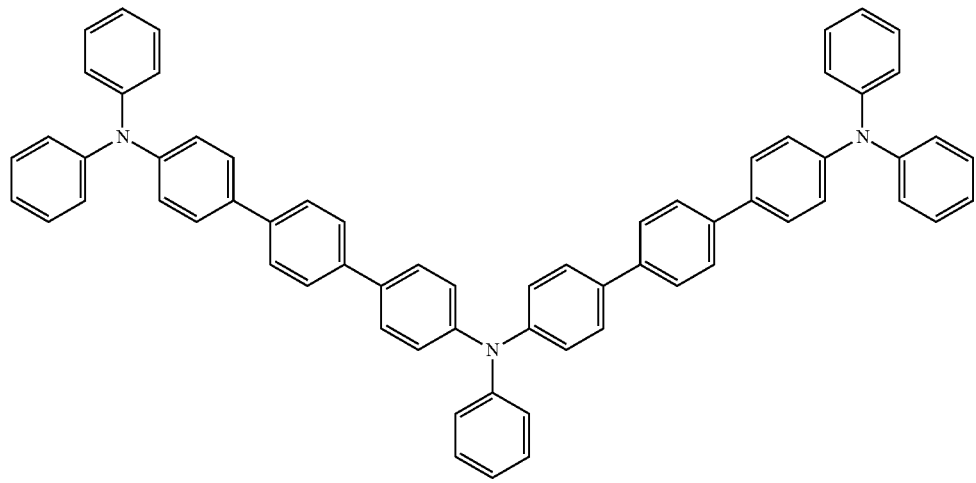
(6-27)
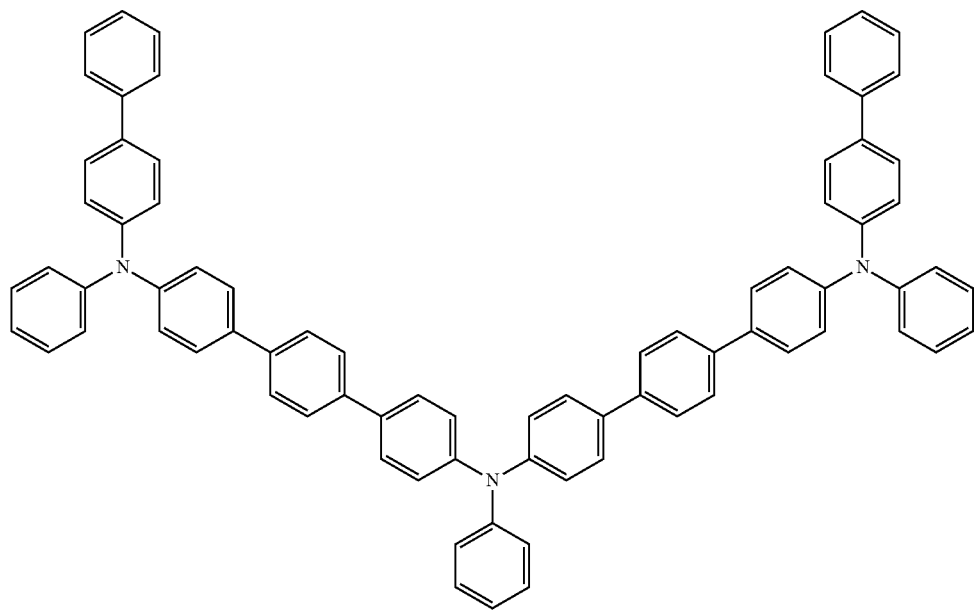
(6-28)
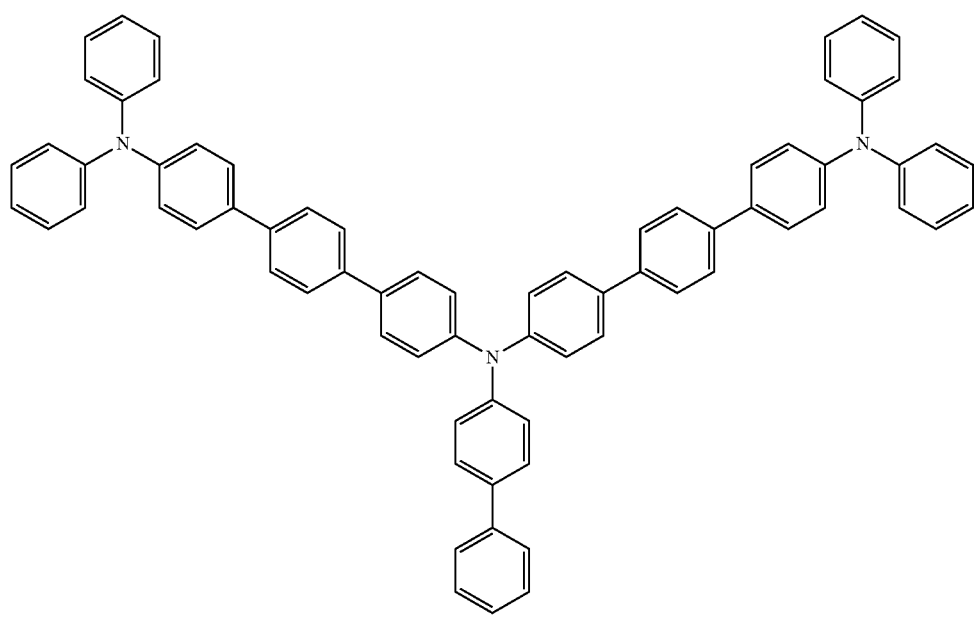
(6-29)

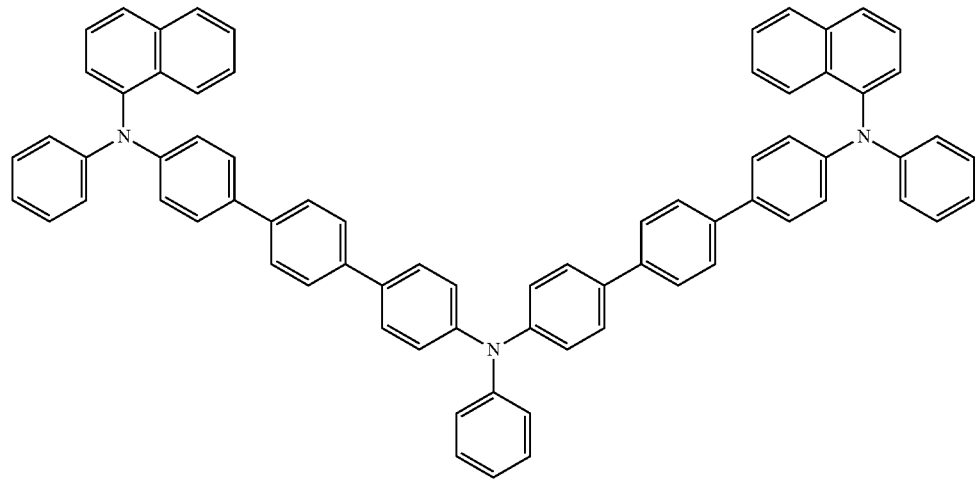
(6-30)
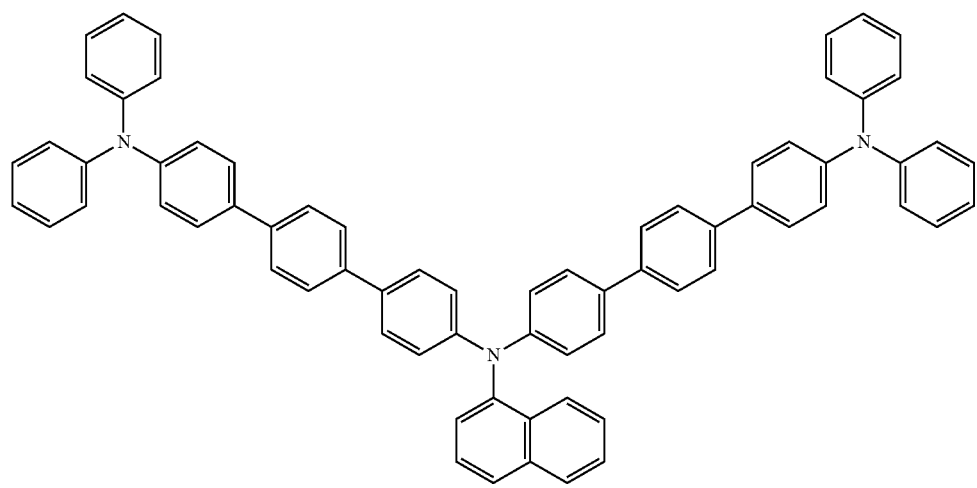
(6-31)
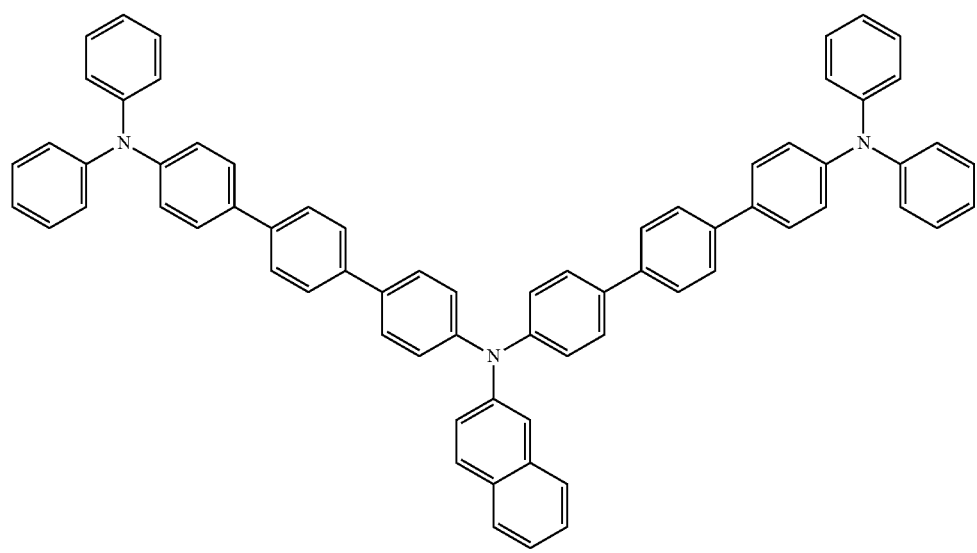
(6-32)

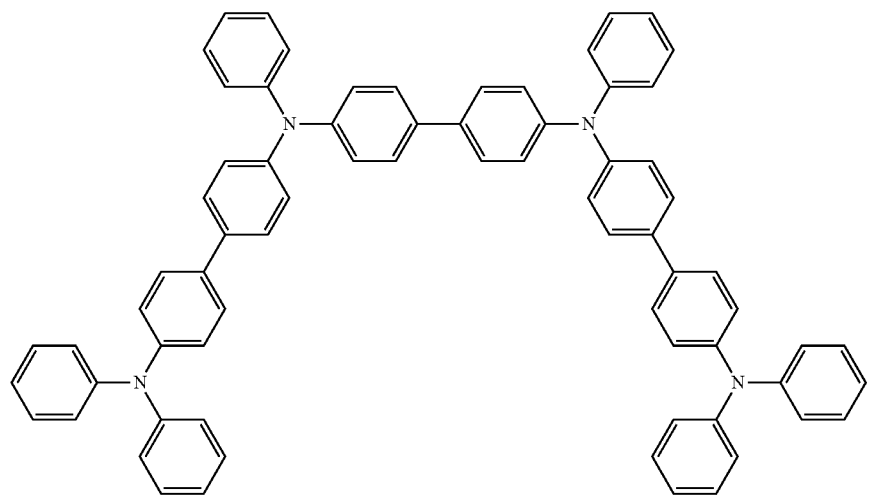
(6-33)
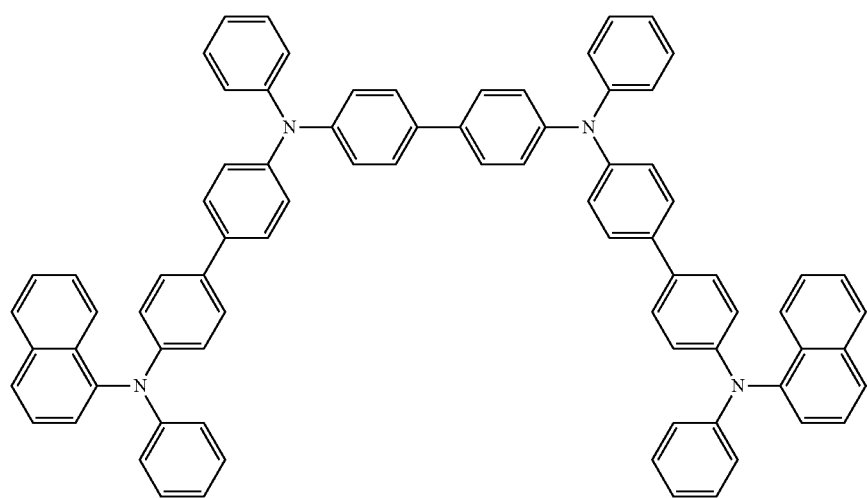
(6-34)
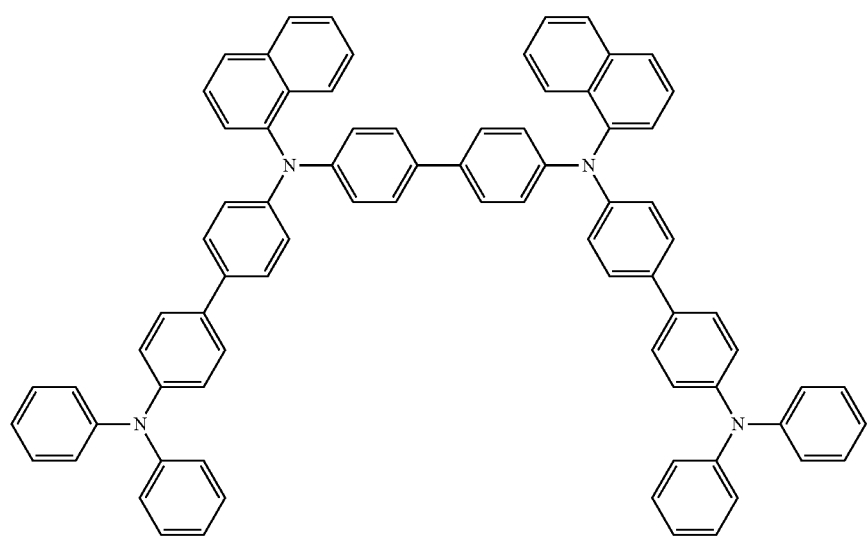
(6-35)

(6-36)
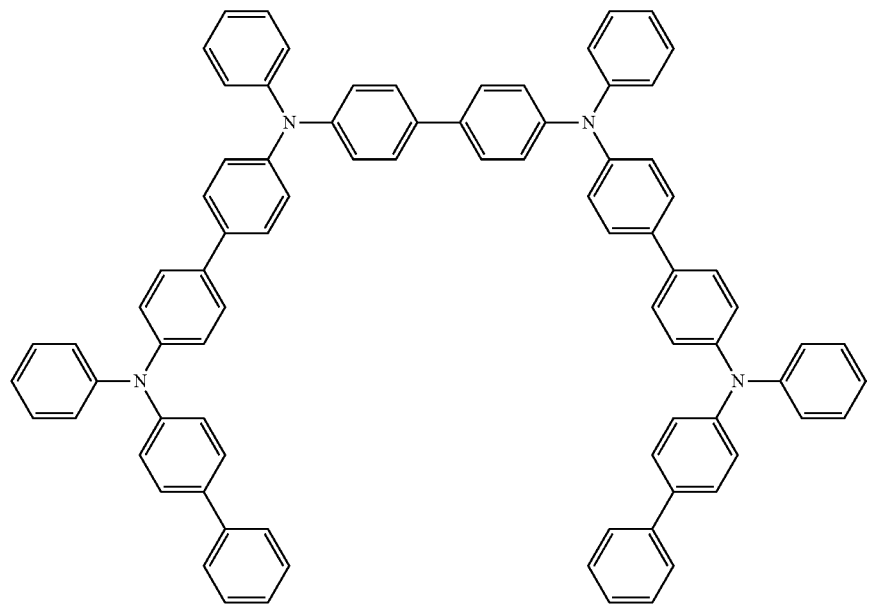
(6-37)
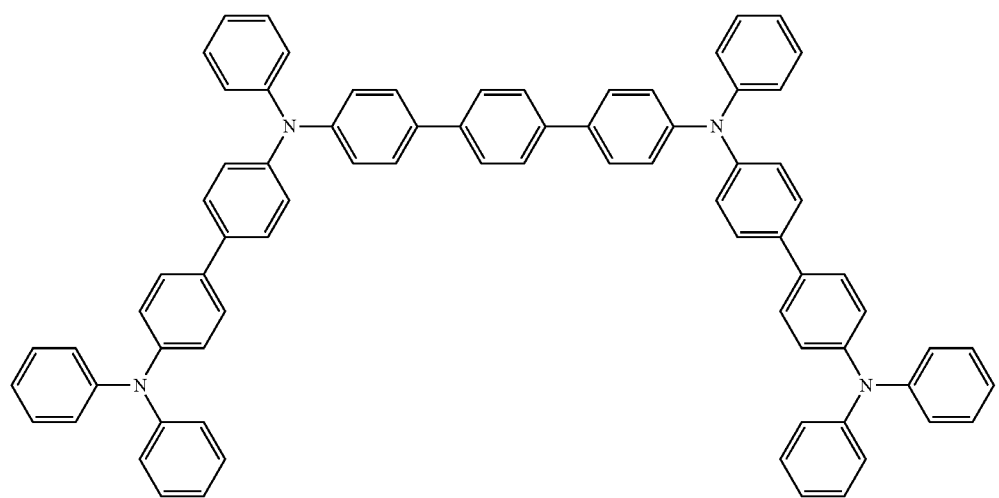

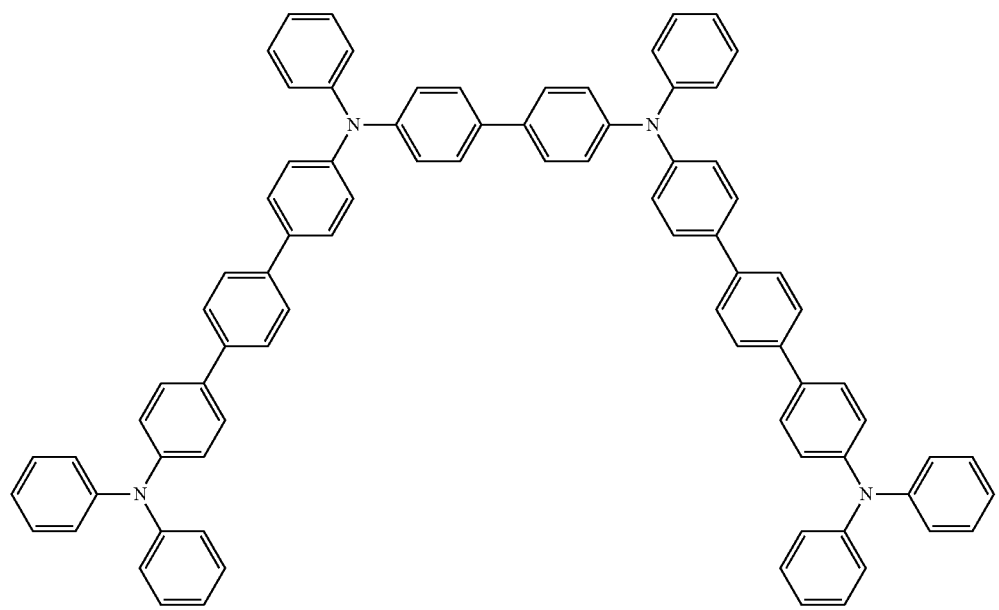
(6-38)
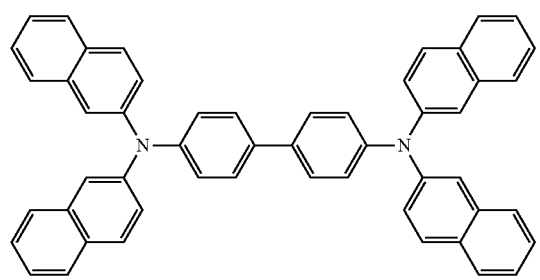
(6-39)
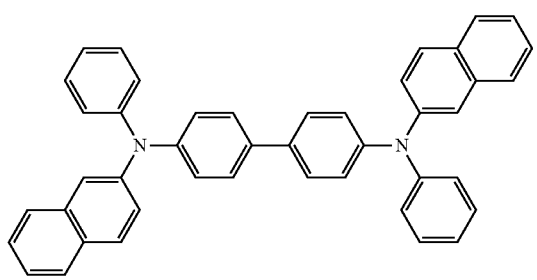
(6-40)
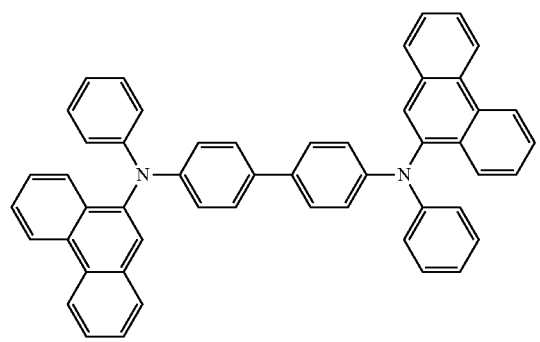
(6-41)
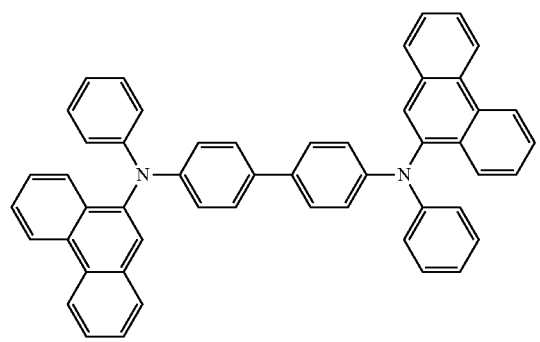
(6-42)
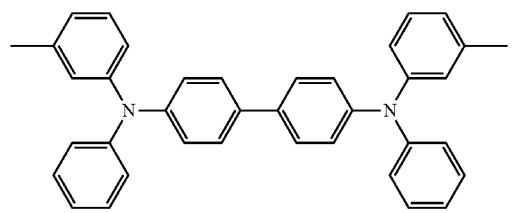
(6-43)
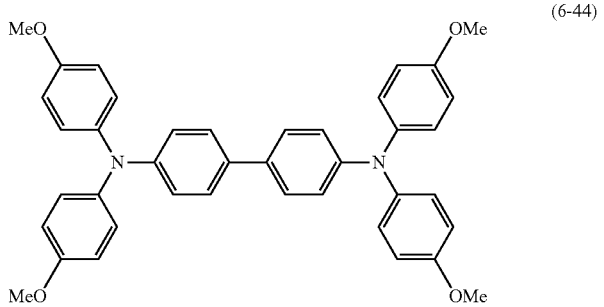
(6-44)

-continued (6-45)

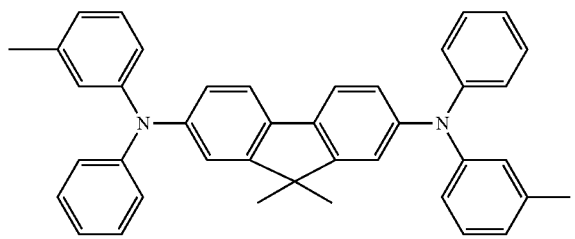

The low-molecular weight compound to be incorporated into the red, green, and blue emitting layers 16CR, 16CG, and 16CB includes those represented by the formula (7) without restrictions.

(7)

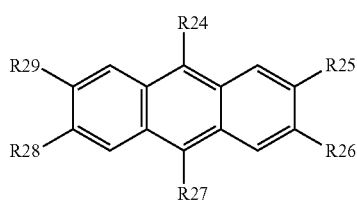

(where R24 to R29 each denotes a hydrogen atom, halogen atom, hydroxyl group, alkyl group with a carbon number of 20 or less, alkenyl group, a group having a carbonyl group, a group having a carbonylester group, a group having an alkoxyl group, a group having a cyano group, a group having a nitro group, a derivative thereof, a group having a silyl group with a carbon number of 30 or less, a group having an aryl group, a group having a heterocyclic group, or a group having an amino group, or a derivative thereof.)

The compound represented by the formula (7) has the groups R24 to R29, each having an aryl group, as mentioned above. They are exemplified by phenyl group, 1-naphthyl group, 2-naphthyl group, fluorenyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 1-chrysenyl group, 6-chrysenyl group, 2-fluoranthenyl group, 3-fluoranthenyl group, 2-biphenylyl group, 3-biphenylyl group, 4-biphenylyl group, o-tolyl group, m-tolyl group, p-tolyl group, and p-t-butylphenyl group.

The compound represented by the formula (7) has the groups R24 to R29, each having a heterocyclic group, as mentioned above. The heterocyclic group is a five- or six-membered aromatic ring including oxygen (O), nitrogen (N), or sulfur (S) as the hetero atom. It is a $C_{2-20}$ condensed polycyclic aromatic group exemplified below. Thienyl group, furyl group, pyrrolyl group, pyridyl group, quinolyl group, quinoxalyl group, imidazopyridyl group, and benzothiazole group. Their typical examples include 1-pyrolyl group, 2-pyrolyl group, 3-pyrolyl group, pyridinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quionoxalinyl group, 1-carbazolyl group, 2-carbazolyl group, 3-carbazolyl group, 4-carbazolyl group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-pheanthridinyl group, 9-phenathridinyl group, 10-phenanthridinyl group, 1-acridinyl group, 2-acridinyl group, 3-acridinyl group, 4-acridinyl group, and 9-acridinyl group.

In the formula (7), the groups R24 to R29, each having an amino group, include alkylamino groups, arylamino groups, and aralkylamino groups. These groups should preferably have $C_{1-6}$ aliphatic hydrocarbon groups and/or $C_{1-4}$ aromatic cyclic groups, such as dimethylamino group, diethylamino group, dibutylamino group, diphenylamino group, ditolylamino group, bisbiphenylylamino group, and dinaphthylamino group. The above-mentioned substituent group may form a condensed ring composed of two or more substituent groups, or may include its derivatives.

The compound represented by the formula (7) is typically exemplified by those represented by the formulas (7-1) to (7-51).

(7-1)

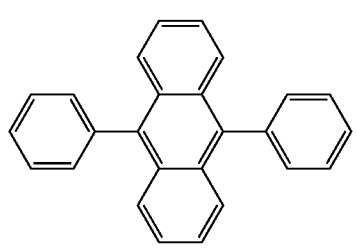

(7-2)

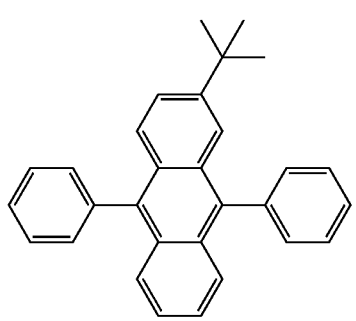

-continued
(7-3)
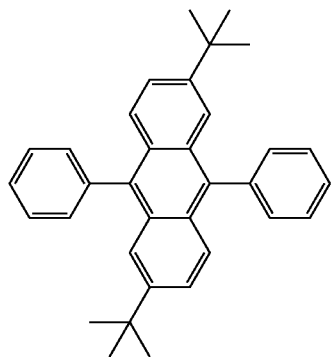
(7-4)
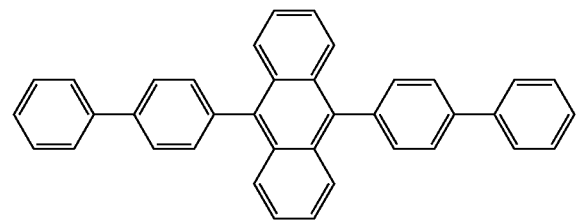
(7-5)
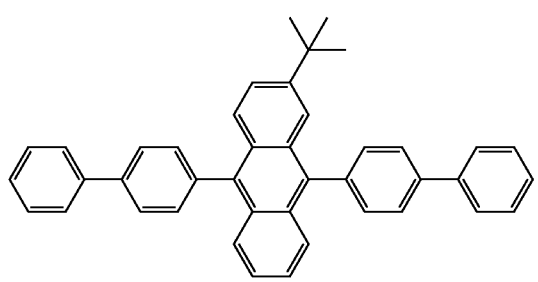
(7-6)
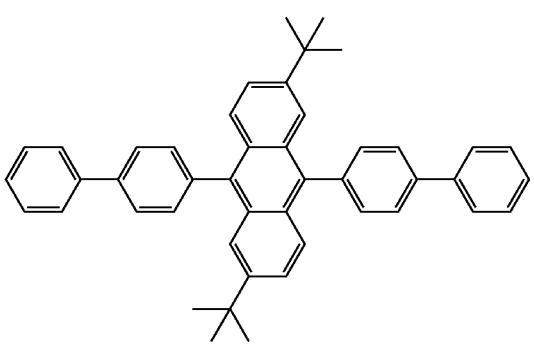
(7-7)
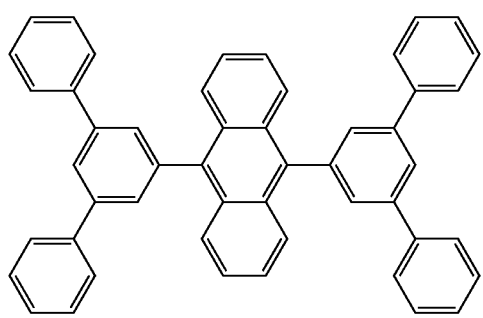
(7-8)
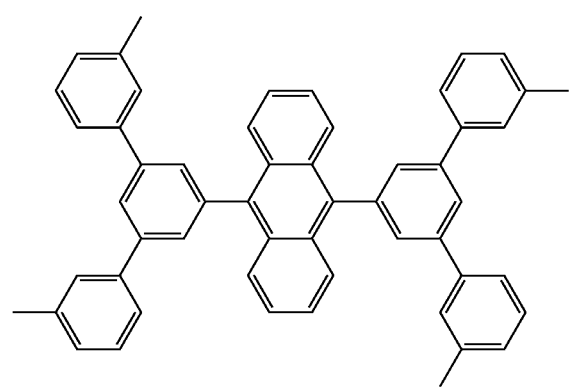
(7-9)
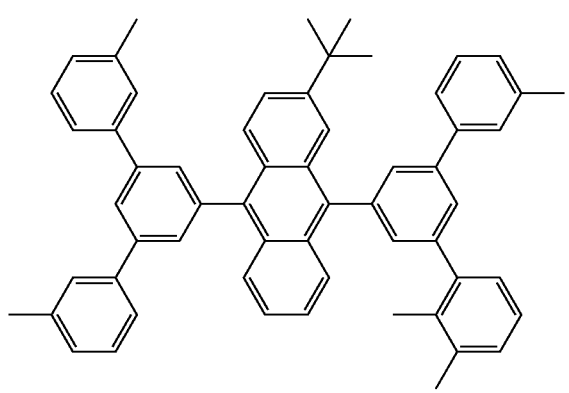
(7-10)
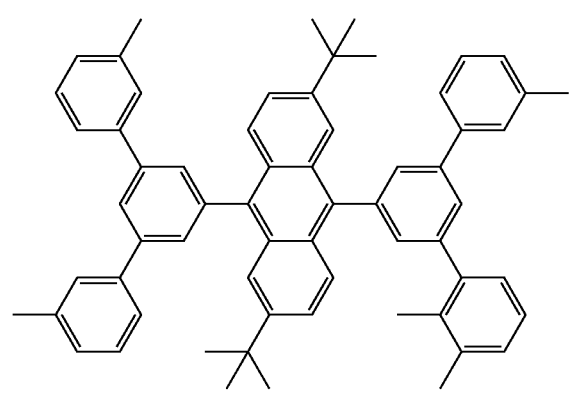

-continued
(7-11)
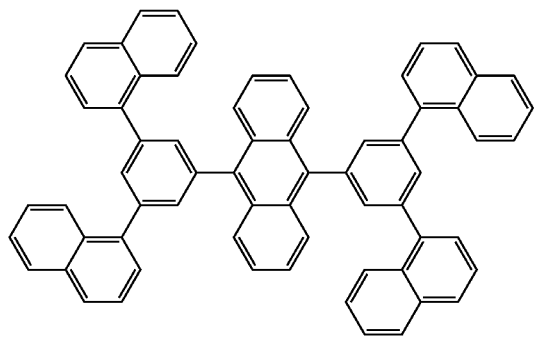
(7-12)
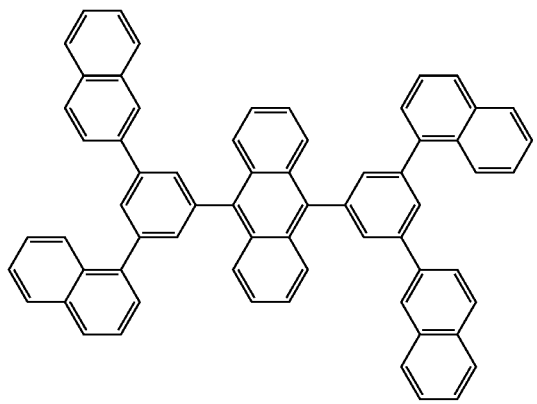
(7-13)
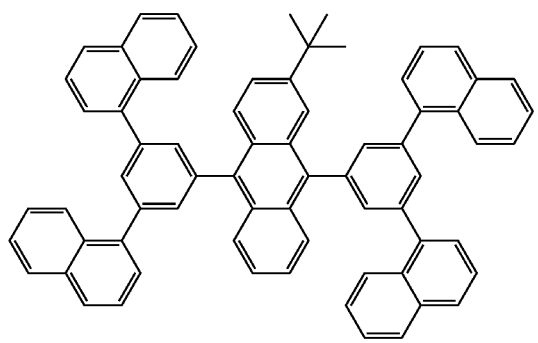
(7-14)
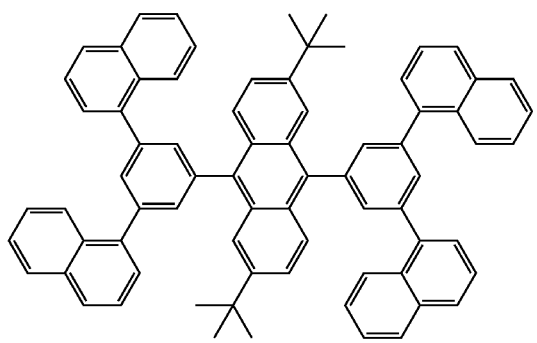
(7-15)
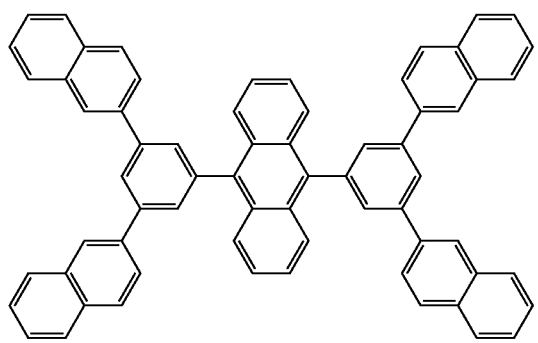
(7-16)
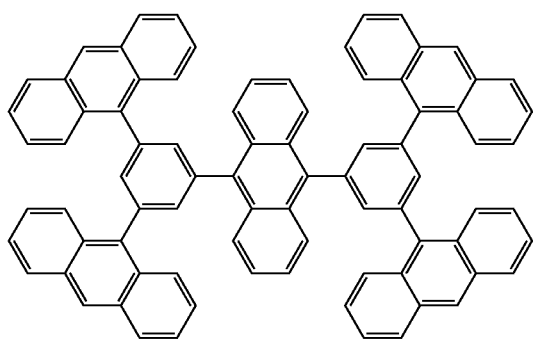
(7-17)
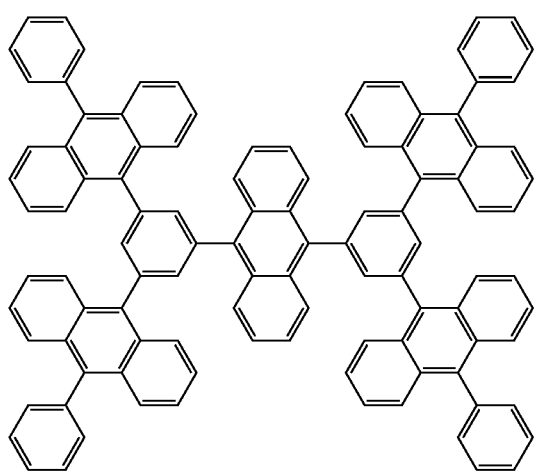
(7-18)
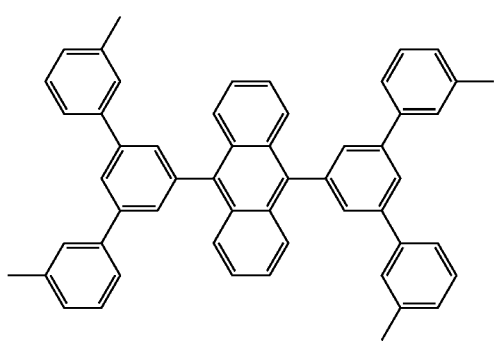

(7-19)
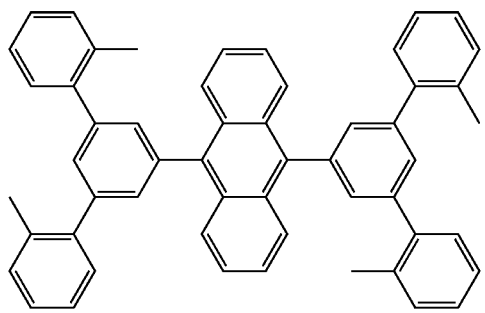
(7-20)
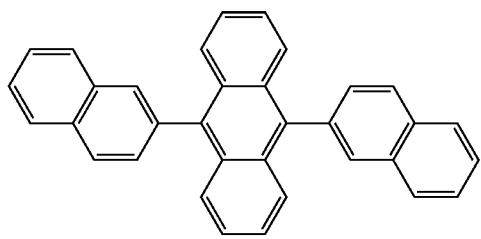
(7-21)
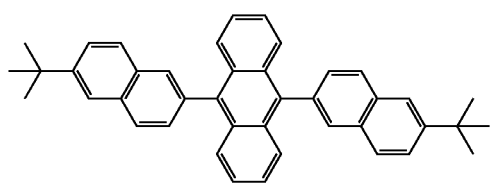
(7-22)
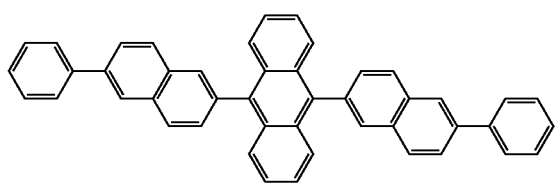
(7-23)
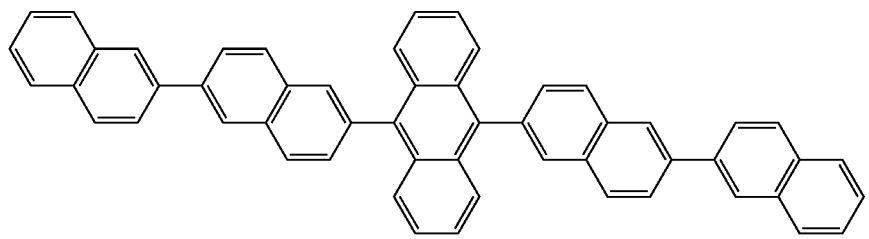
(7-24)
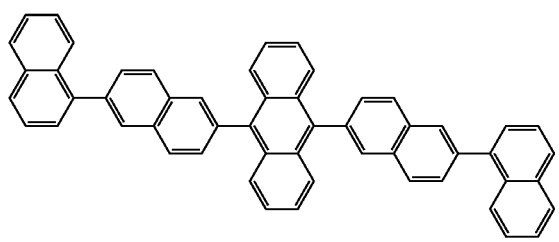
(7-25)
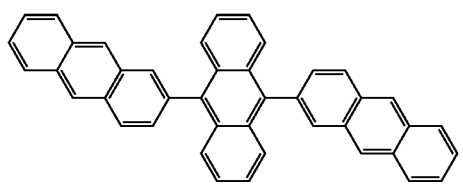
(7-26)
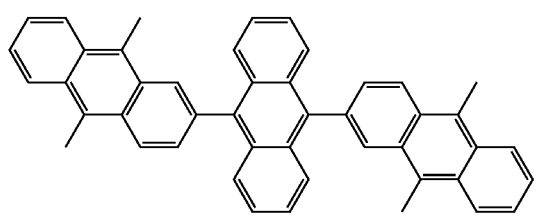
(7-27)
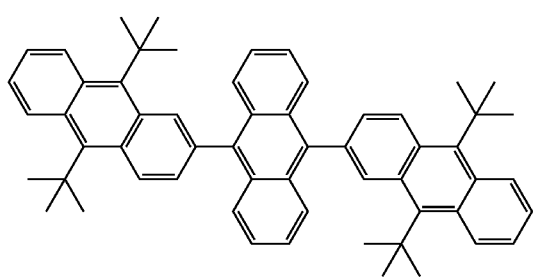
(7-28)
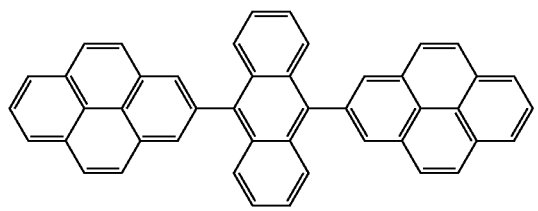
(7-29)
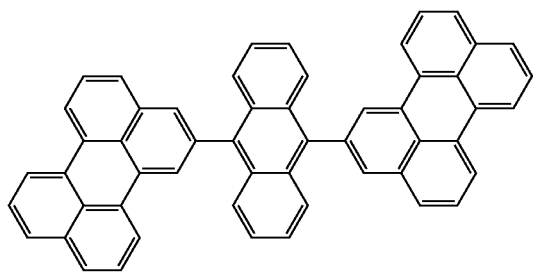

(7-30)
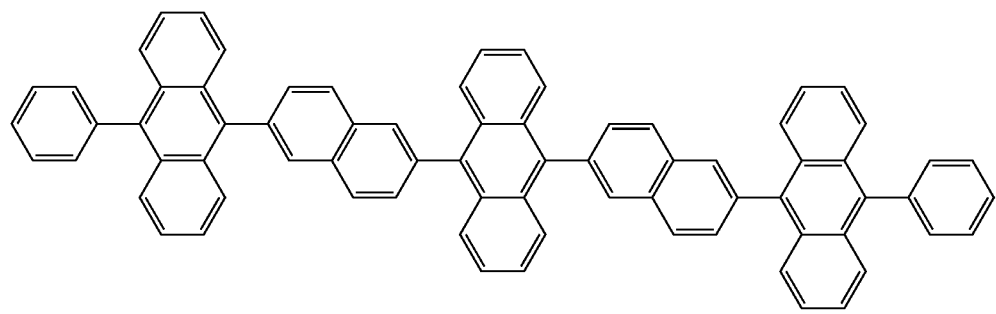
(7-31)
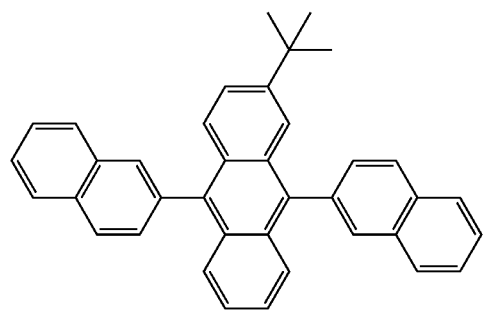
(7-32)
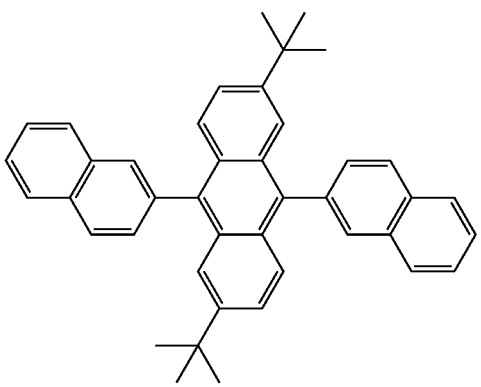
(7-33)
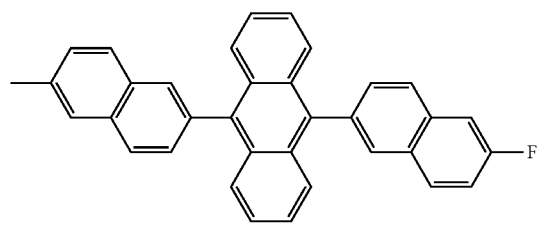
(7-34)
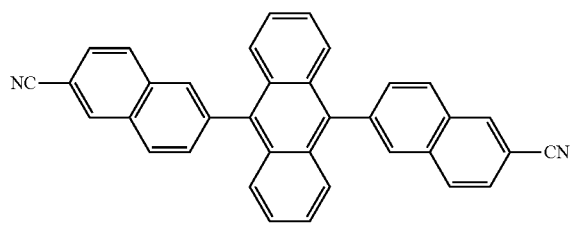
(7-35)
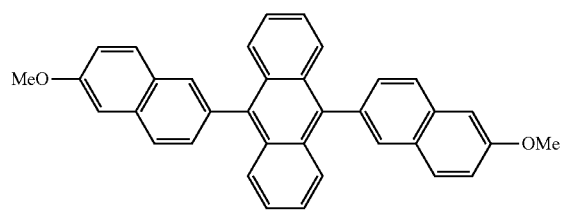
(7-36)
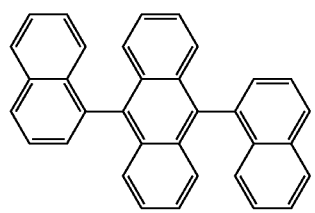
(7-37)
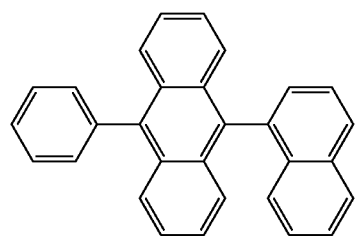
(7-38)
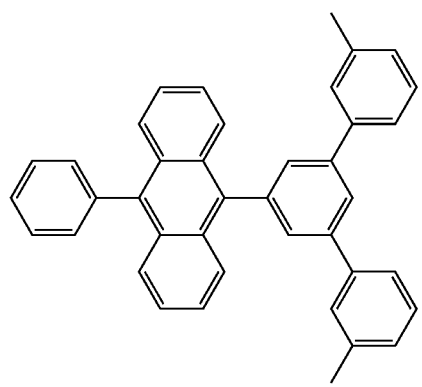

-continued
(7-39)
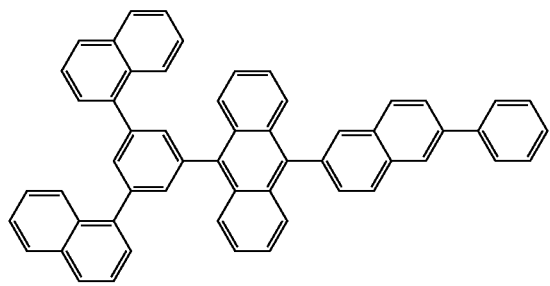
(7-40)
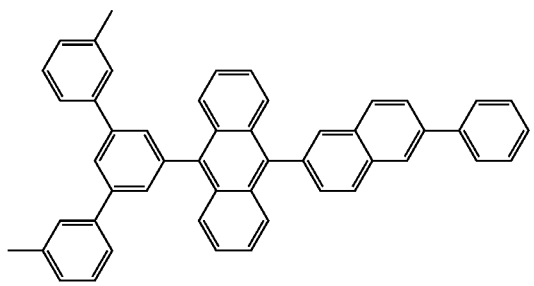
(7-41)
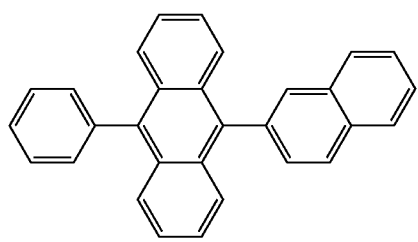
(7-42)
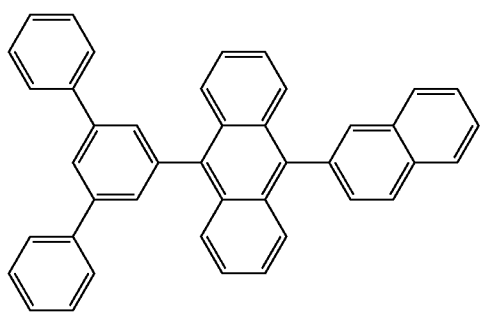
(7-43)
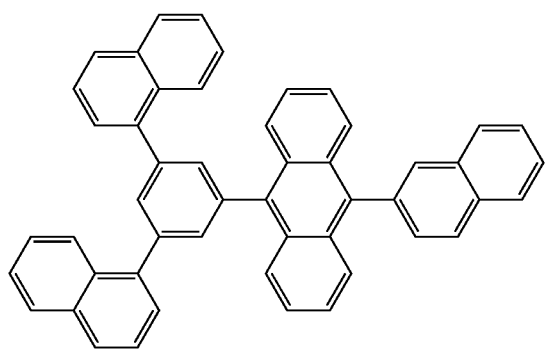
(7-44)
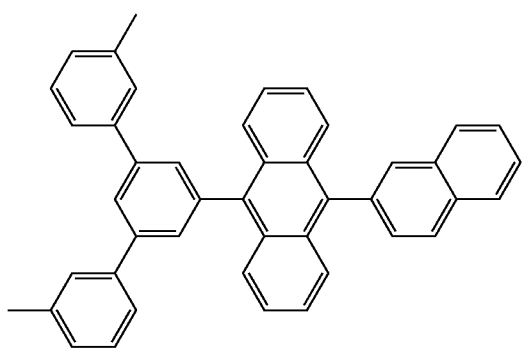
(7-45)
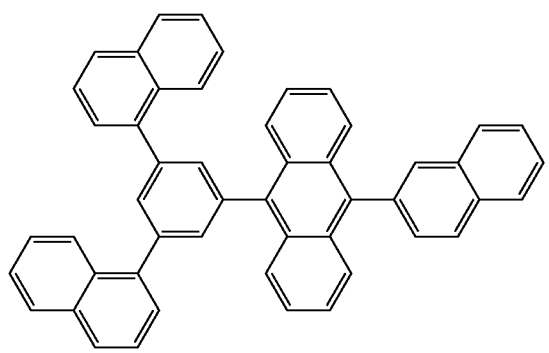
(7-46)
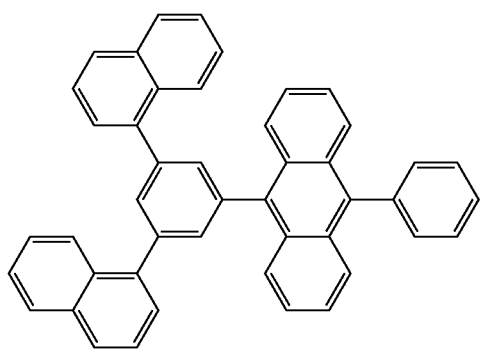

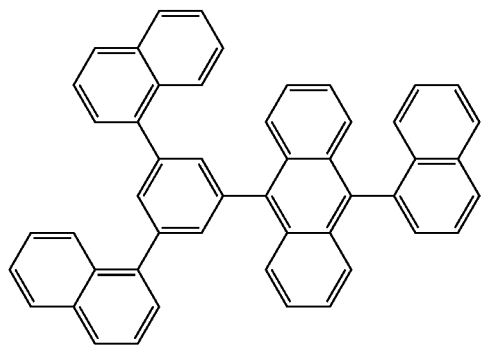
(7-47)

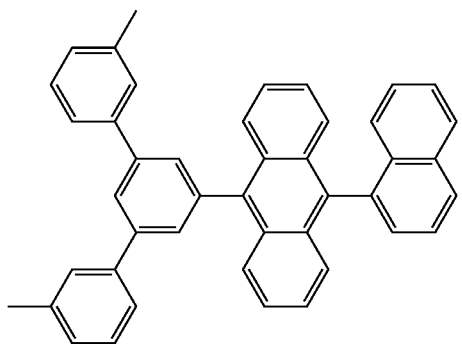
(7-48)

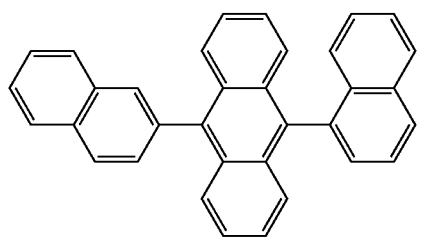
(7-49)

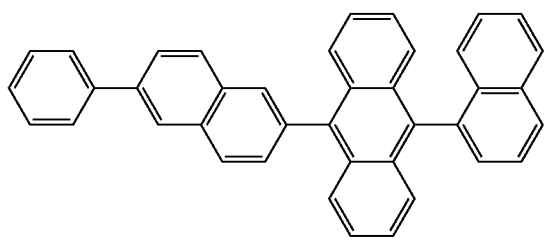
(7-50)

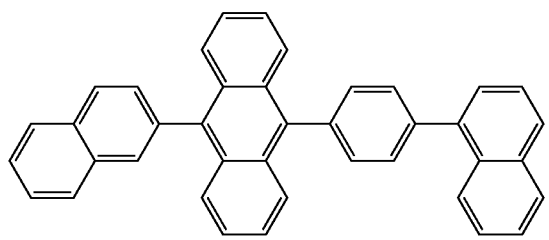
(7-51)

In addition, the low-molecular weight compound to be incorporated into the red, green, and blue emitting layers 16CR, 16CG, and 16CB includes those capable of electron transportation. Their typical but nonrestrictive examples are benzoimidazole derivatives, pyridylphenyl derivatives, and bipyridine derivatives, which are represented by the following formulas (8), (9), and (10), respectively.

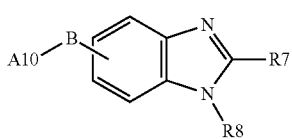
(8)

(where A10 denotes hydrogen atom, a halogen atom, $C_{1-20}$ alkyl group, $C_{6-60}$ hydrocarbon group having a polycyclic aromatic hydrocarbon group formed by condensation from 3 to 40 aromatic rings, or nitrogen-containing heterocyclic group, or a derivative thereof; B denotes a single bond, or a divalent aromatic cyclic group or a derivative thereof; and R7 and R8 each independently denotes a hydrogen atom, halogen atom, $C_{1-20}$ alkyl group, $C_{6-60}$ aromatic hydrocarbon group, nitrogen-containing heterocyclic group, or $C_{1-20}$ alkoxyl group, or a derivative thereof.)

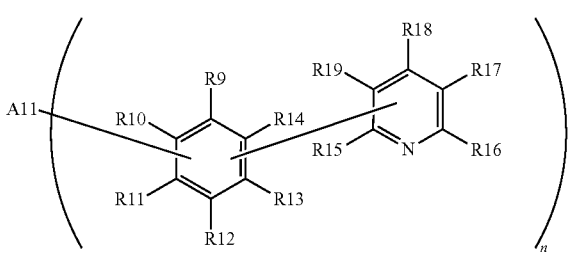
(9)

(where A11 denotes a n-valent group formed by condensation from two to five aromatic rings (typically n-valent acene aromatic ring formed by condensation from three aromatic rings) or a derivative thereof; R9 to R14 each independently denotes a hydrogen atom, halogen atom, or a free valance linking to any one of A11 or R15 to R19; R15 to R19 each independently denotes a hydrogen atom, halogen atom, or a free valance linking to any one of R9 to R14; and n is an integer of 2 or above. The pyridylphenyl groups existing as many as n may be identical or different.)

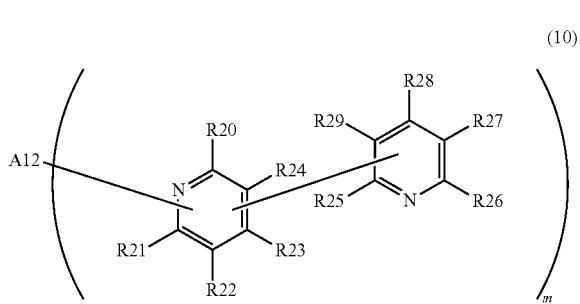

(where A12 denotes an m-valent group formed by condensation from two to five aromatic rings (typically m-valent acene aromatic ring formed by condensation from three aromatic rings) or a derivative thereof; R20 to R24 each independently denotes a hydrogen atom, halogen atom, or a free valance linking to any one of A12 or R25 to R29; R25 to R29 each independently denotes a hydrogen atom, halogen atom, or a free valance linking to any one of R20 to R24; and m is an integer of 2 or above. The bipyridyl groups existing as many as m may be identical or different.)

The compounds represented by the formula (8) are typically exemplified by those represented by the formulas (8-1) to (8-49) below. In the formulas (8-1) to (8-43), Ar(α) corresponds to the benzoimidazole skeleton containing R7 and R8 shown in the formula (8) and B corresponds to B shown in the formula (8). Also, Ar(1) and Ar(2) correspond to A10 shown in the formula (8), and they are bonded to B sequentially in the order of Ar(1) and Ar(2).

-continued

| | Ar (α) | B | Ar (1) | Ar (2) |
|---|---|---|---|---|
| (8-6) | | | | |
| (8-7) | | | | |
| (8-8) | | | | |
| (8-9) | | | | |
| (8-10) | | | | |
| (8-11) | | | | |
| (8-12) | | | | |

-continued

| | Ar (α) | B | Ar (1) | Ar (2) |
|---|---|---|---|---|
| (8-13) | | | | |
| (8-14) | | | | |
| (8-15) | | | | |
| (8-16) | | | | |
| (8-17) | | | | |
| (8-18) | | — | | |
| (8-19) | | — | | |

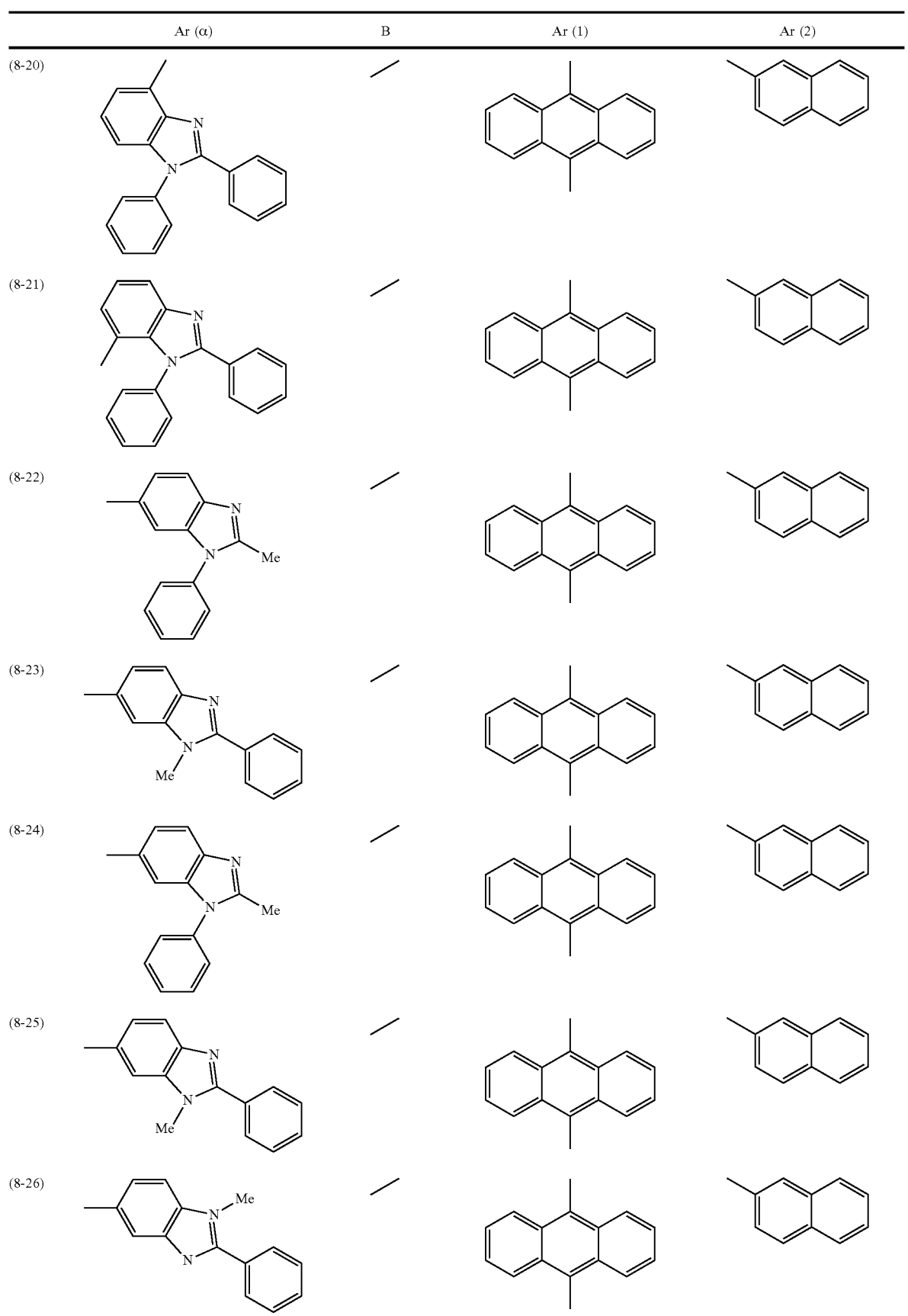

-continued
| | Ar (α) | B | Ar (1) | Ar (2) |
|---|---|---|---|---|
| (8-27) | 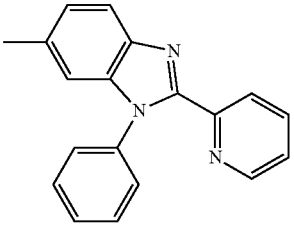 [SMILES: Cc1ccc2nc(-c3ccccn3)n(-c3ccccc3)c2c1] |  | 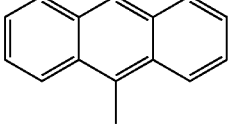 | 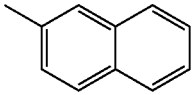 |
| (8-28) | 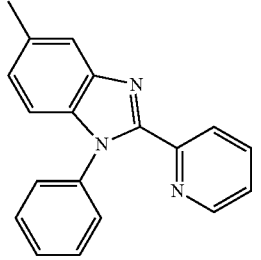 [SMILES: Cc1ccc2c(c1)nc(-c1ccccn1)n2-c1ccccc1] |  | 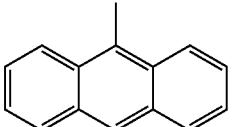 | 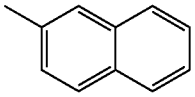 |
| (8-29) | 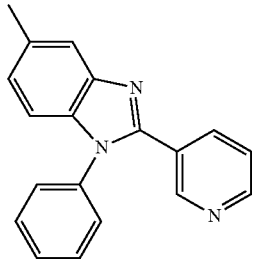 [SMILES: Cc1ccc2c(c1)nc(-c1cccnc1)n2-c1ccccc1] |  | 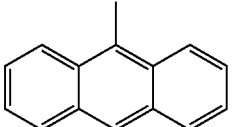 | 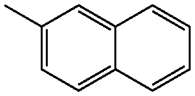 |
| (8-30) | 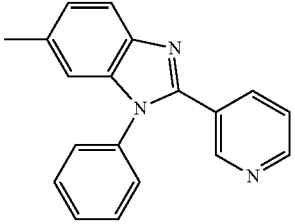 [SMILES: Cc1ccc2nc(-c3cccnc3)n(-c3ccccc3)c2c1] |  | 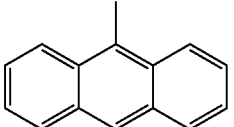 | 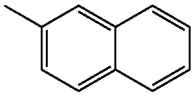 |
| (8-31) | 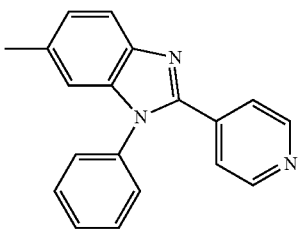 [SMILES: Cc1ccc2nc(-c3ccncc3)n(-c3ccccc3)c2c1] |  | 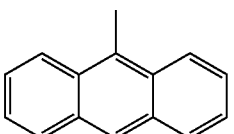 | 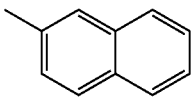 |
| (8-32) | 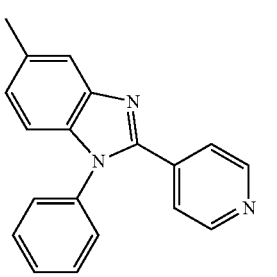 [SMILES: Cc1ccc2c(c1)nc(-c1ccncc1)n2-c1ccccc1] |  | 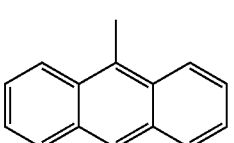 | 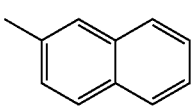 |

-continued

| | Ar (α) | B | Ar (1) | Ar (2) |
|---|---|---|---|---|
| (8-33) | | / | | |
| (8-34) | | / | | |
| (8-35) | | / | | |
| (8-36) | | / | | |
| (8-37) | | / | | |
| (8-38) | | / | | |

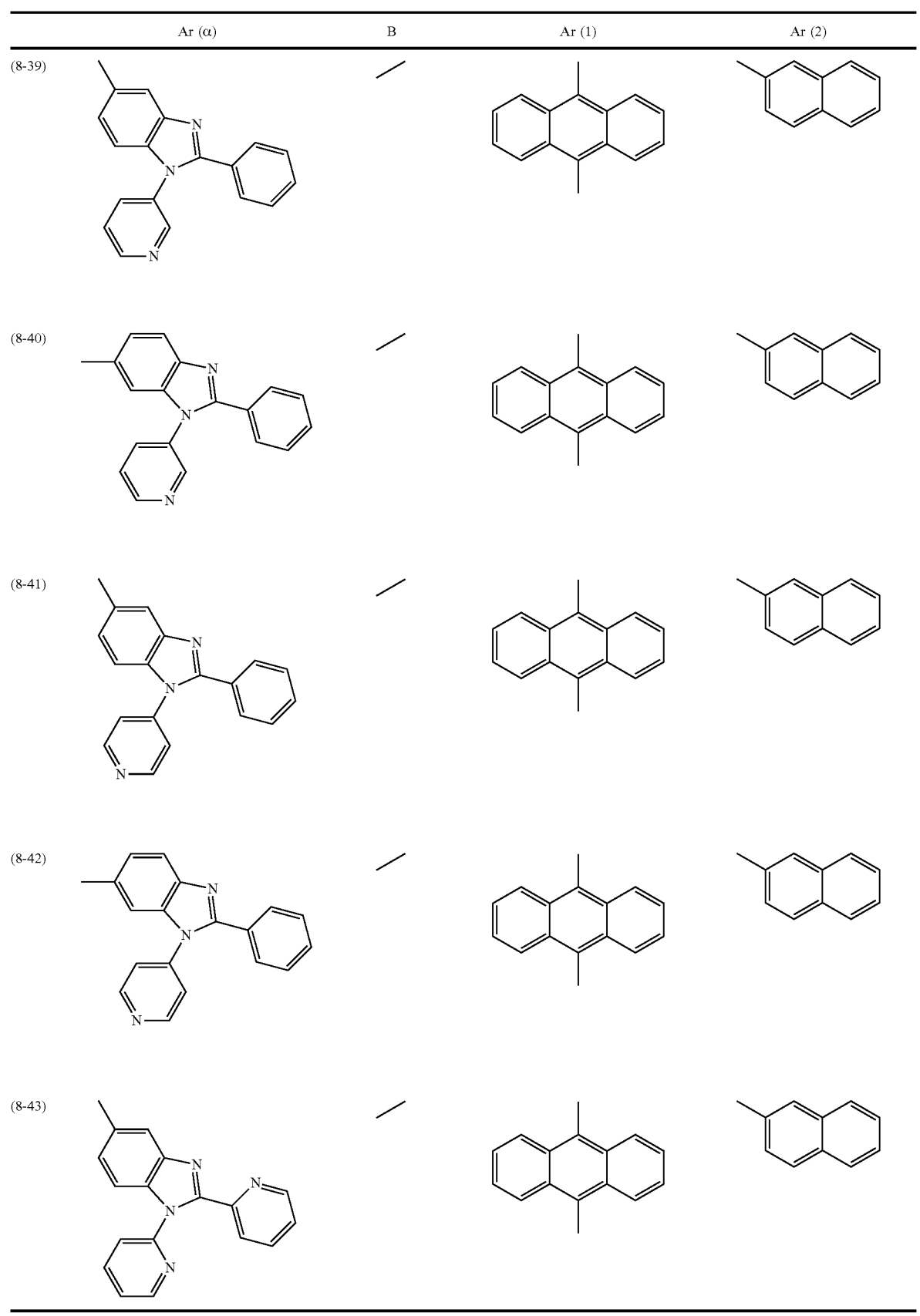

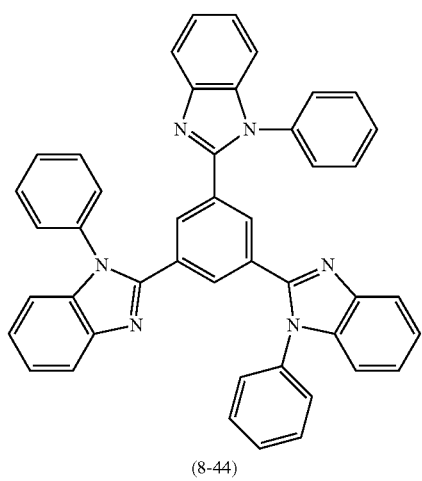
(8-44)
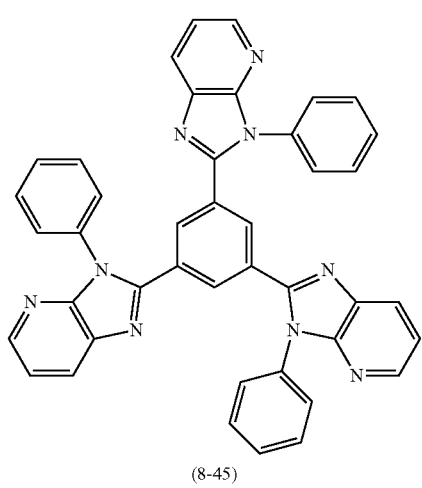
(8-45)
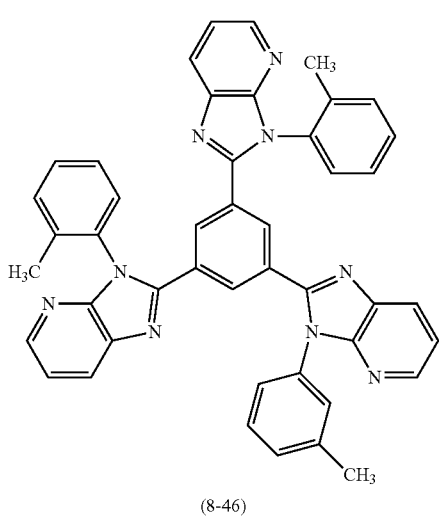
(8-46)
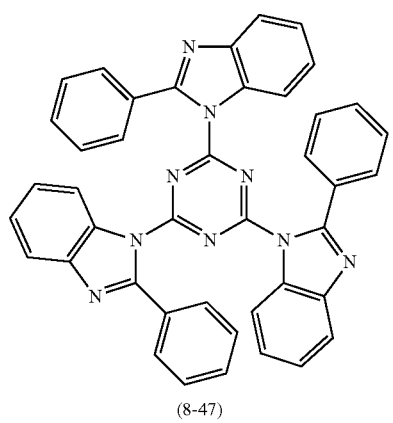
(8-47)
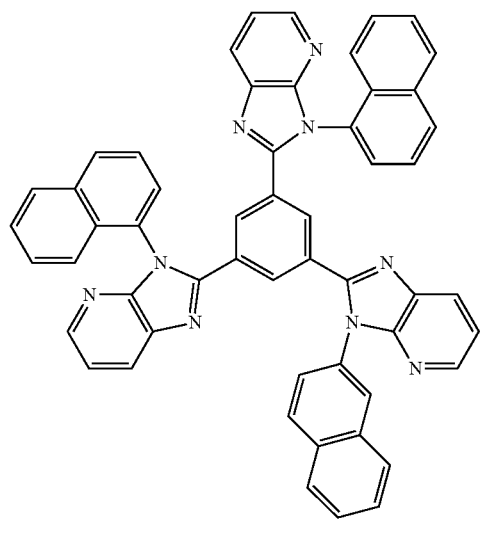 [SMILES: c1ccc2cc(-n3c(-c4cc(-c5nc6cccnc6n5-c5cccc6ccccc56)cc(-c5nc6cccnc6n5-c5cccc6ccccc56)c4)nc4cccnc43)ccc2c1]
(8-48)
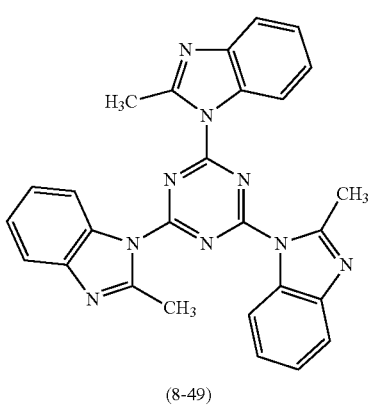
(8-49)
The compounds represented by the formula (9) are typically exemplified by those represented by the formulas (9-1) to (9-81) below.

(9-1)
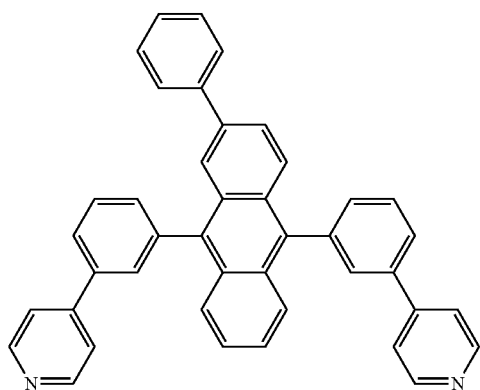
(9-2)
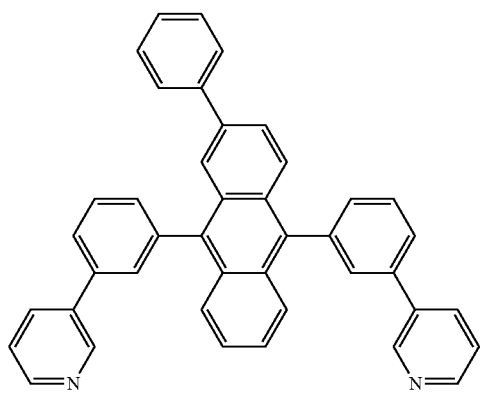
(9-3)
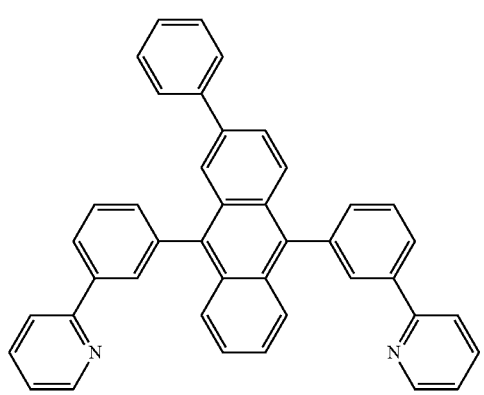
(9-4)
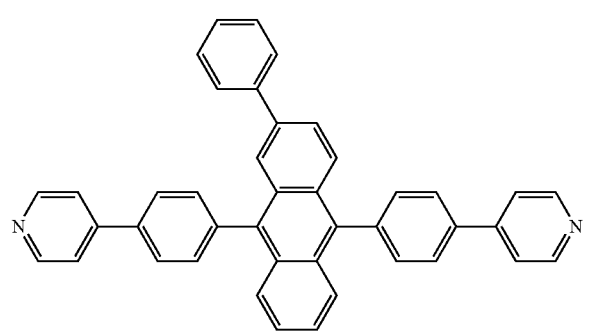
(9-5)
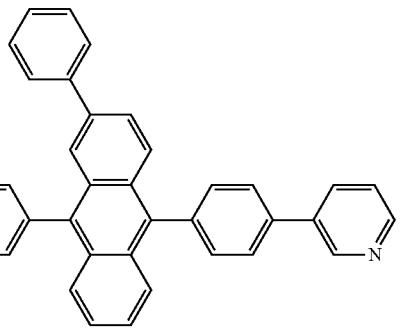
(9-6)
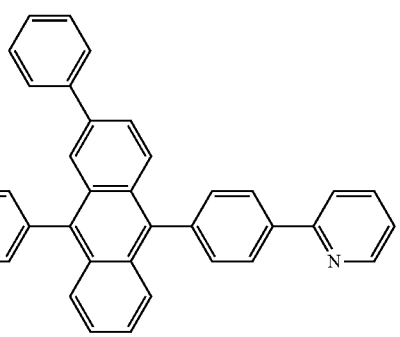
(9-7)
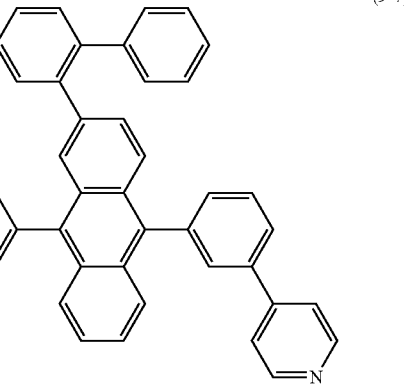
(9-8)
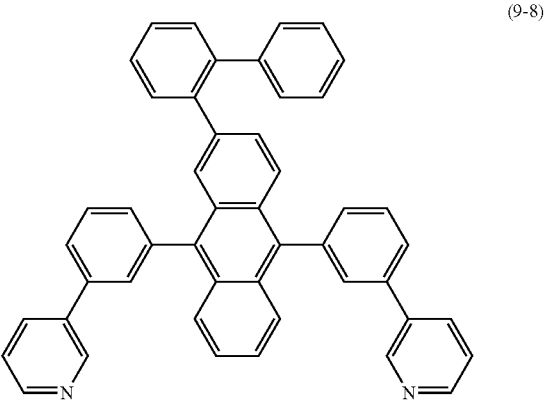

(9-9)
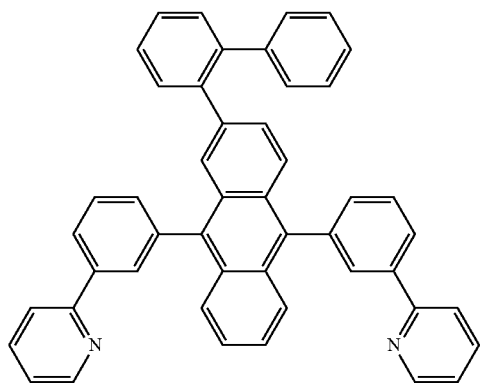
(9-13)
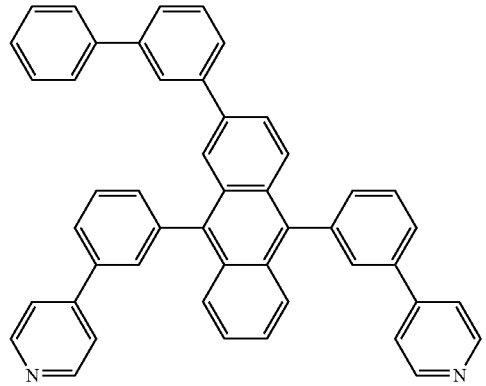
(9-10)
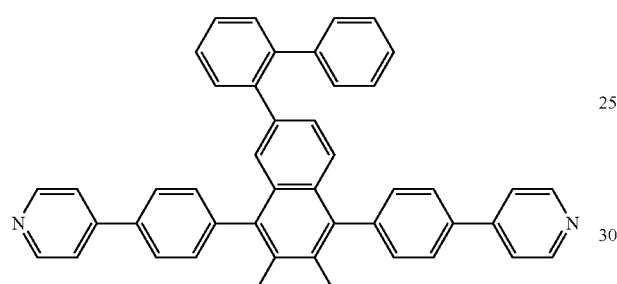
(9-14)
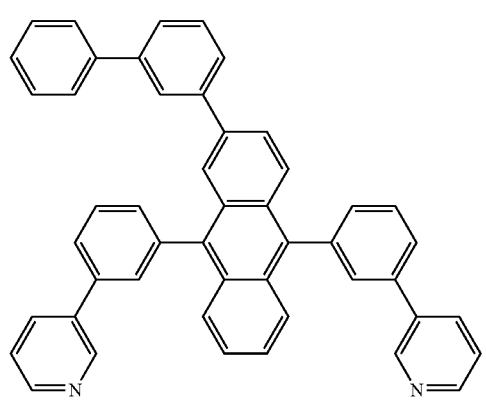
(9-11)
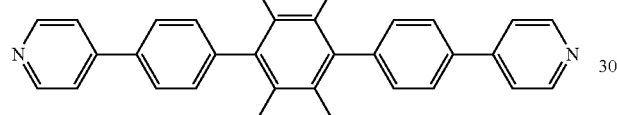
(9-15)
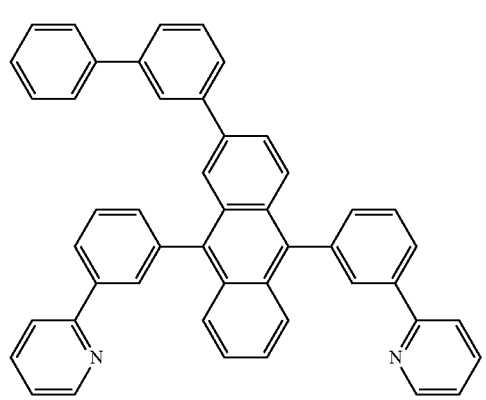
(9-12)
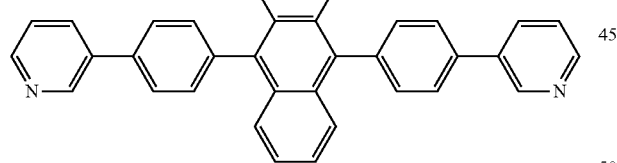
(9-16)
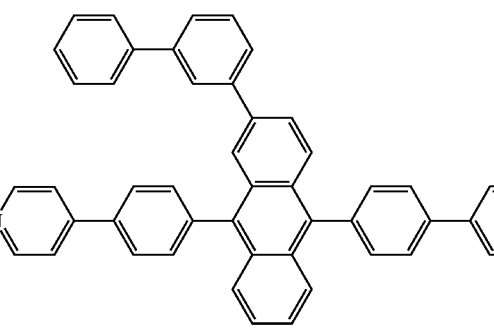
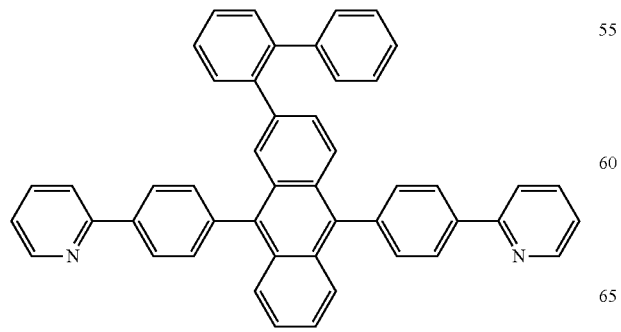

(9-17)
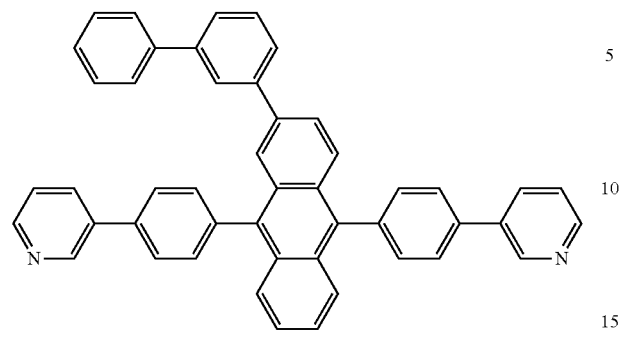
(9-18)
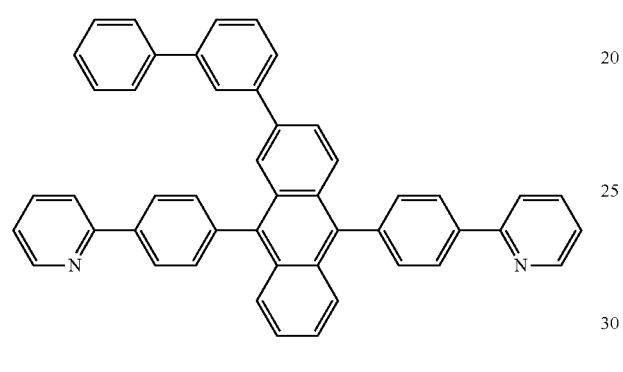
(9-19)
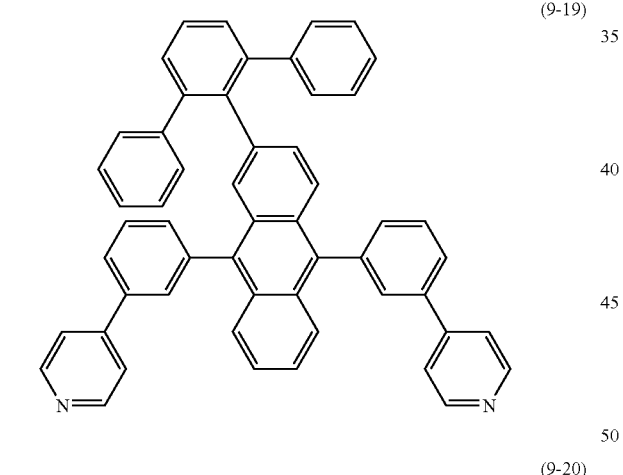
(9-20)
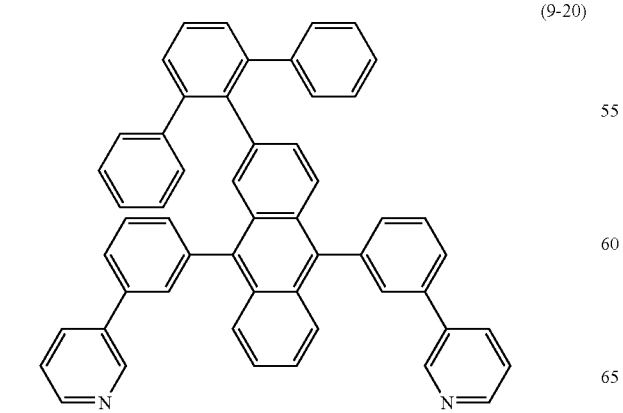
(9-21)
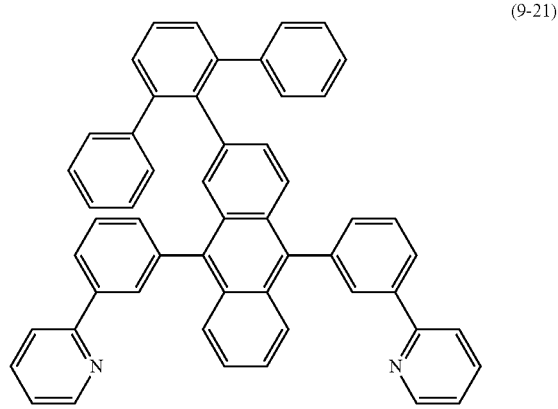
(9-22)
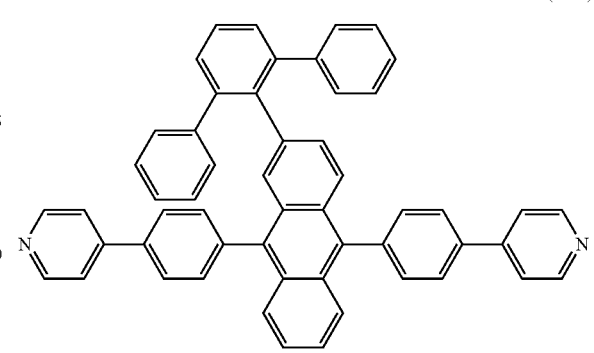
(9-23)
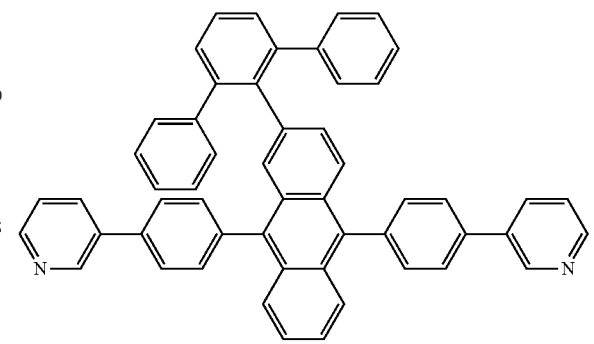
(9-24)

(9-25)
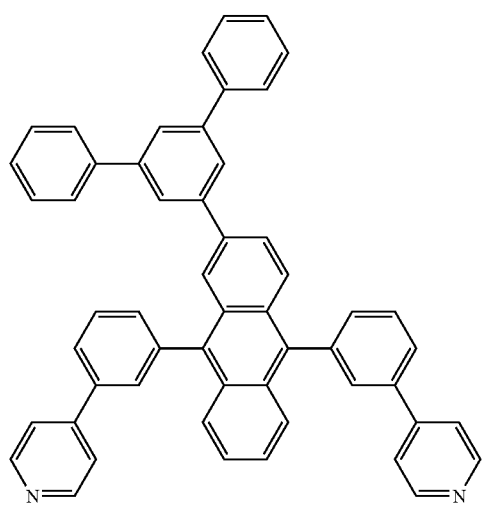
(9-28)
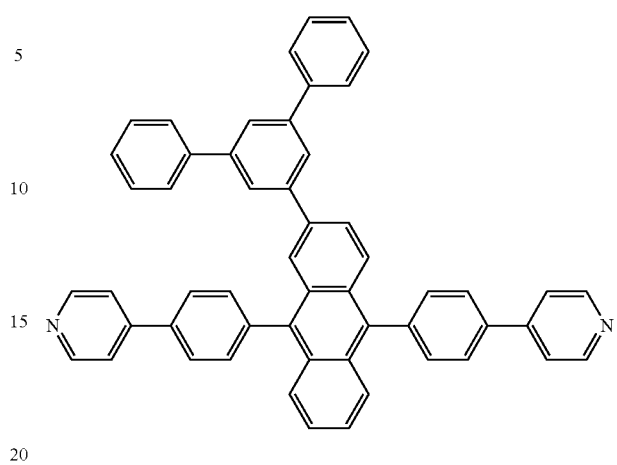
(9-26)
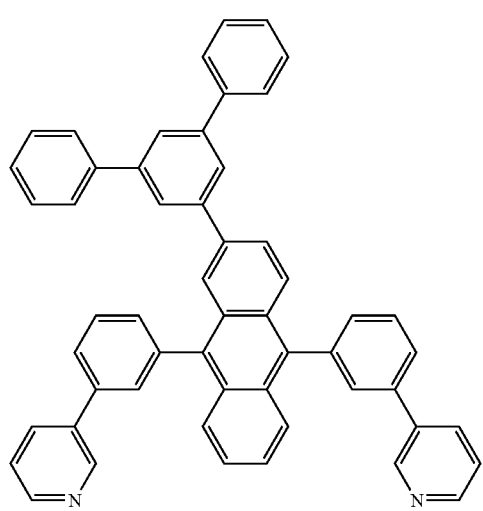
(9-29)
(9-27)
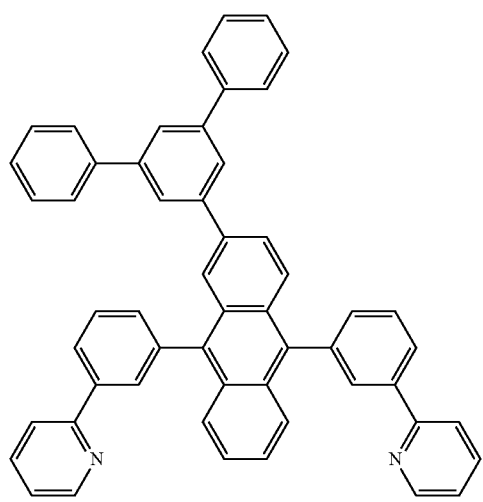
(9-30)
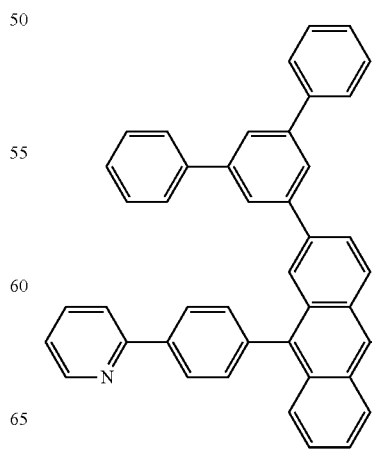

(9-31)
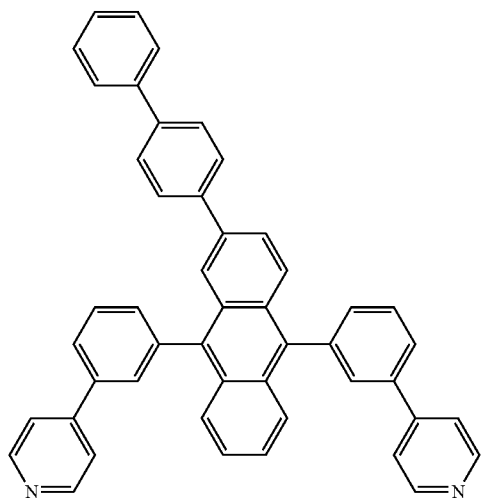
(9-32)
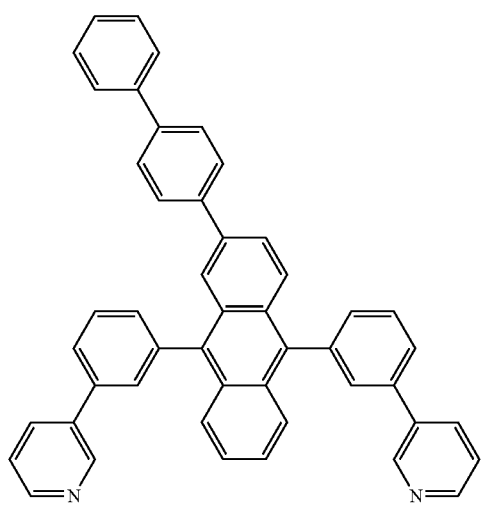
(9-33)
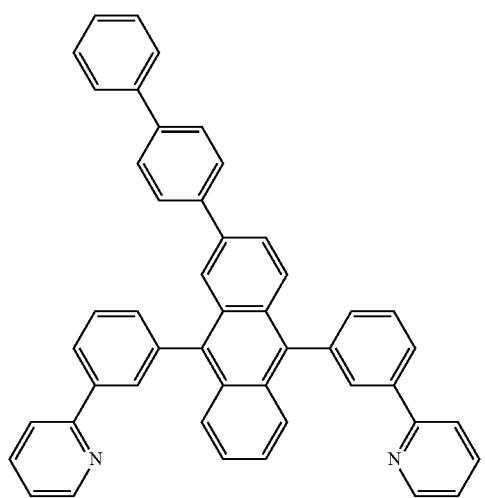
(9-34)
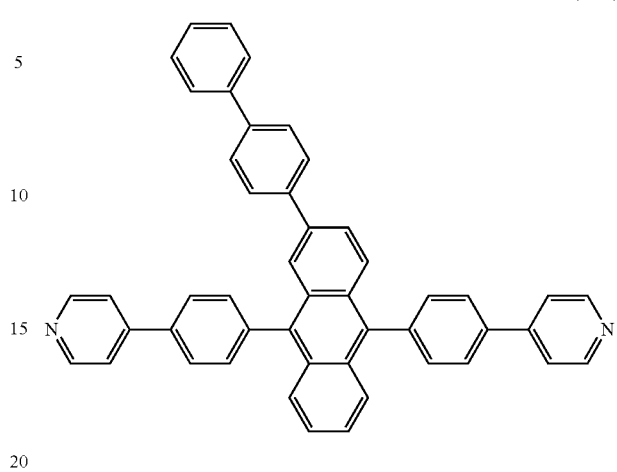
(9-35)
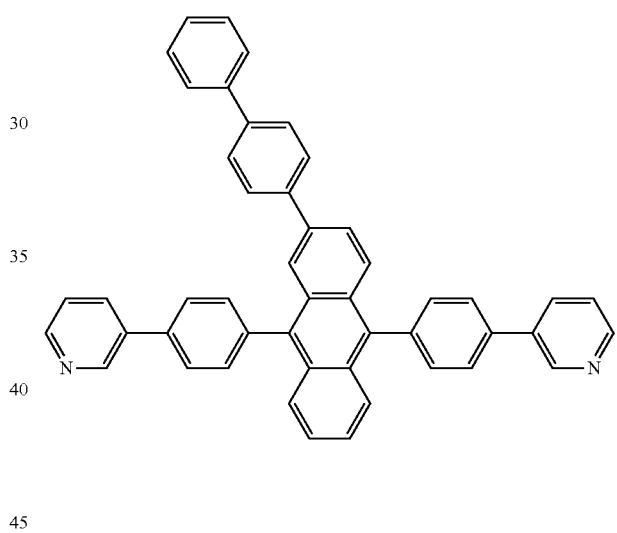
(9-36)
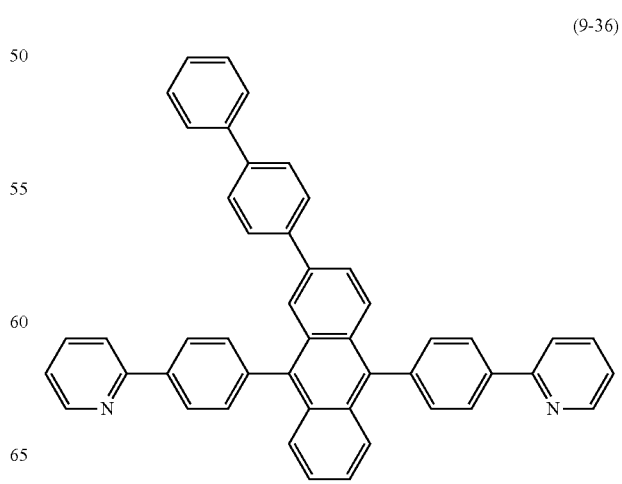

(9-37)
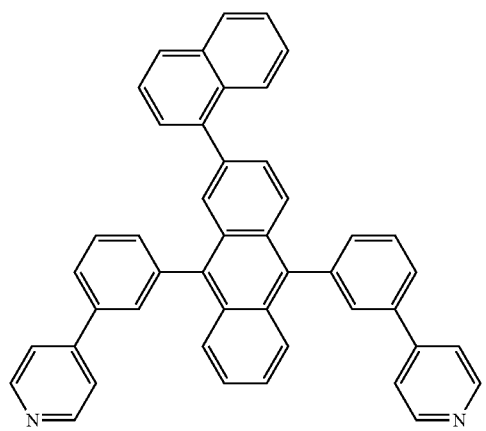
(9-38)
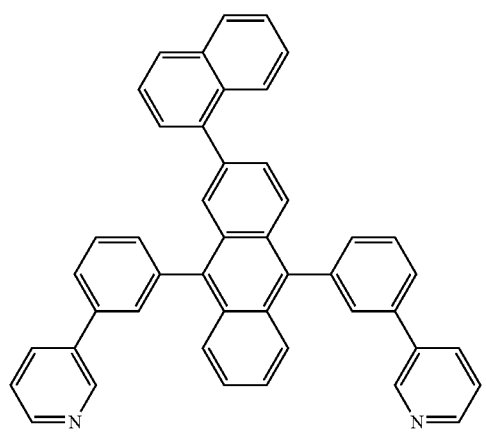
(9-39)
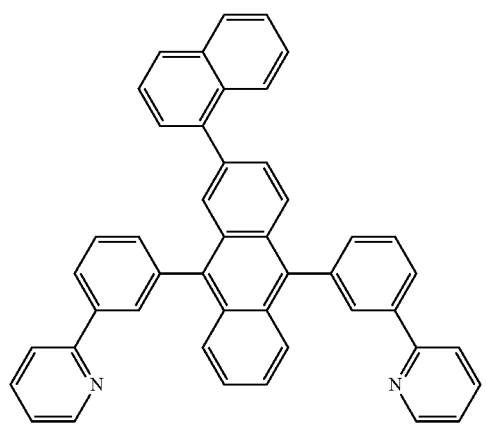
(9-40)
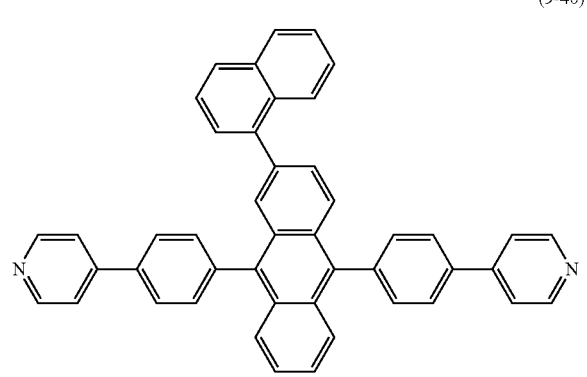
(9-41)
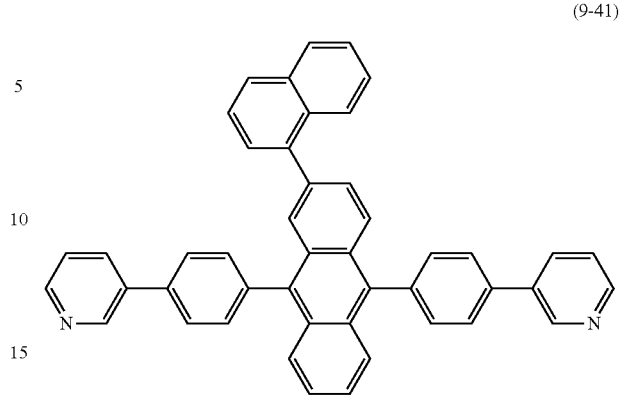
(9-42)
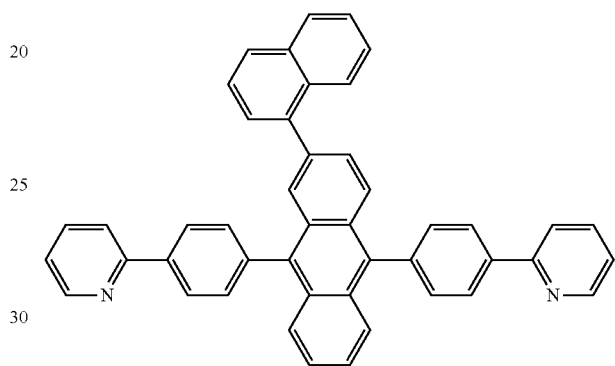
(9-43)
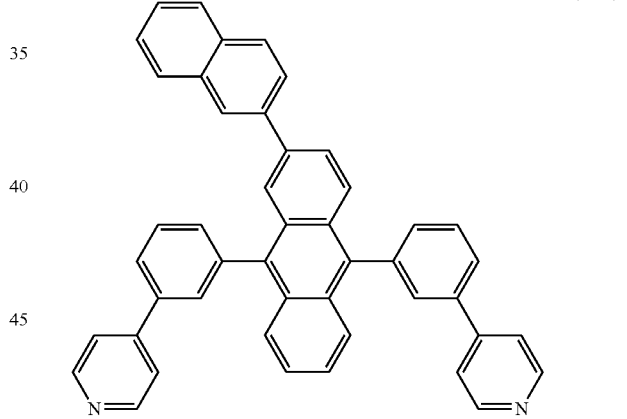
(9-44)
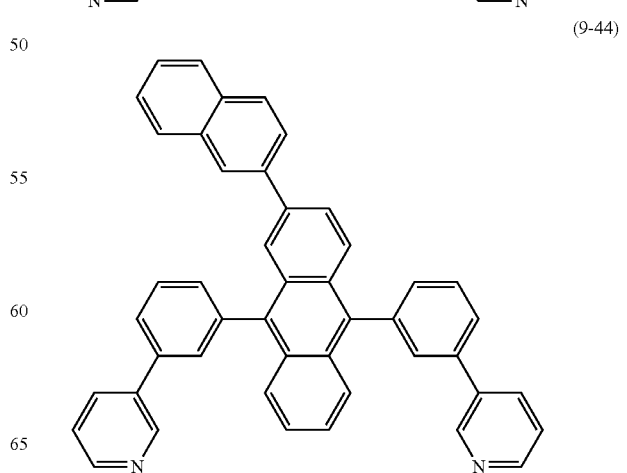

(9-45)
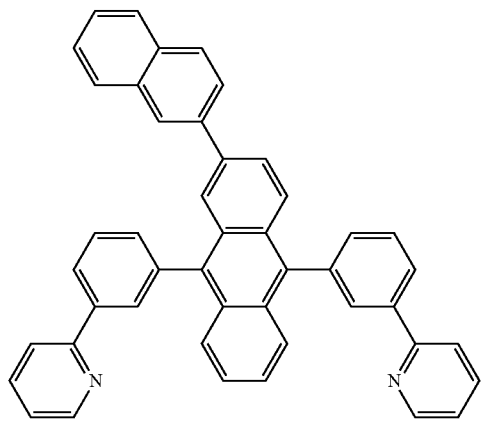
(9-46)
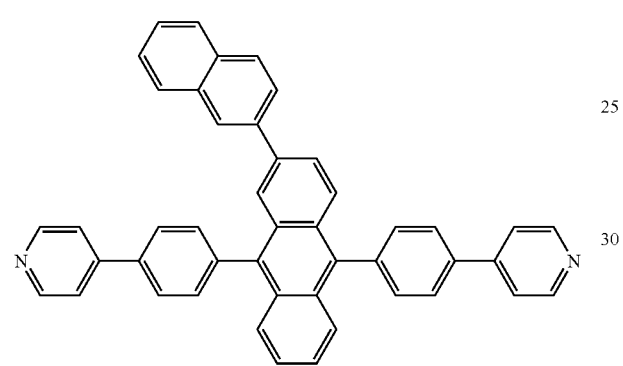
(9-47)
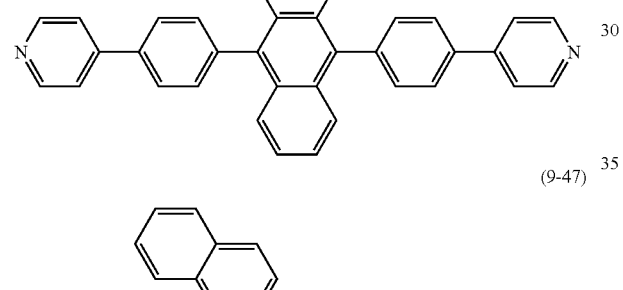
(9-48)
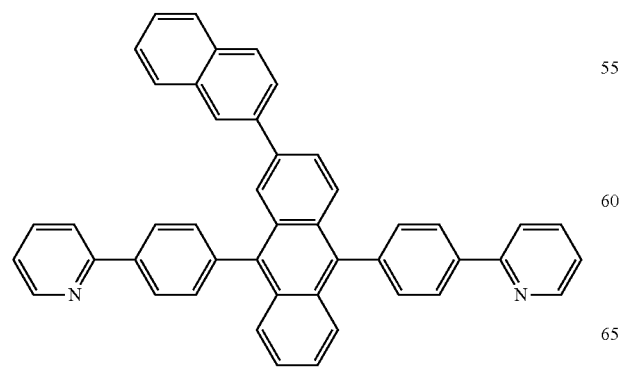
(9-49)
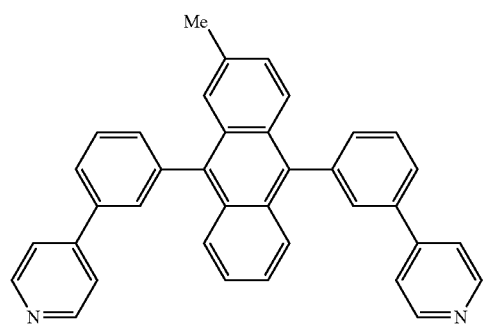
(9-50)
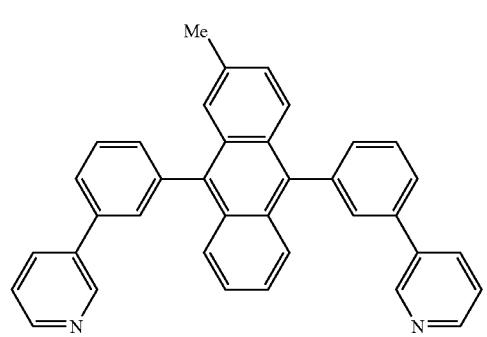
(9-51)
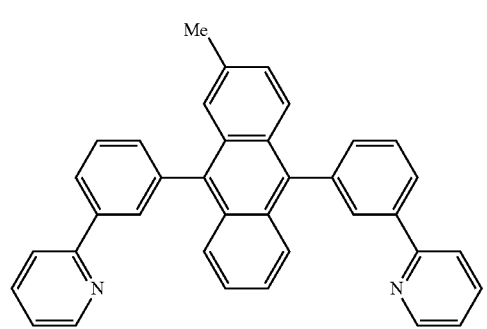
(9-52)
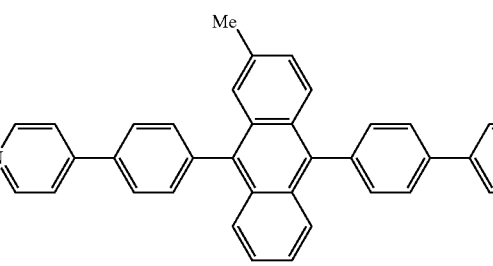
(9-53)
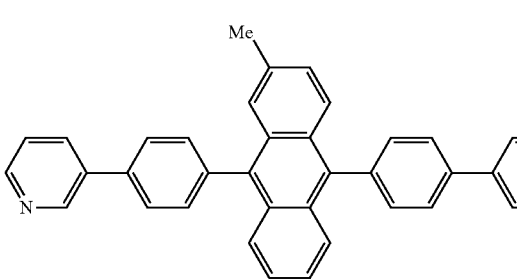

(9-54)
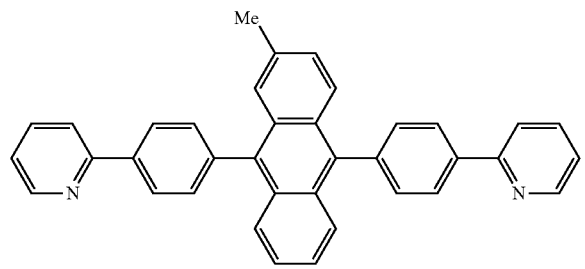
(9-55)
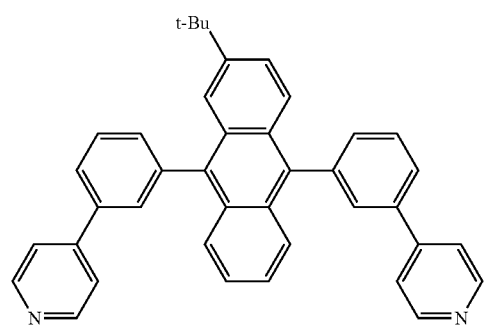
(9-56)
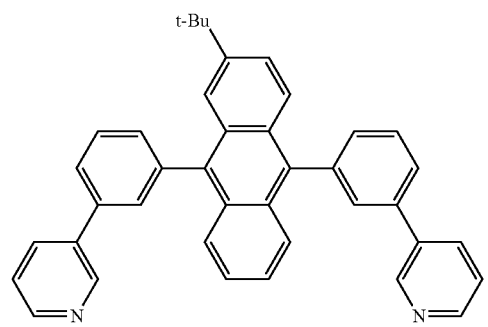
(9-57)
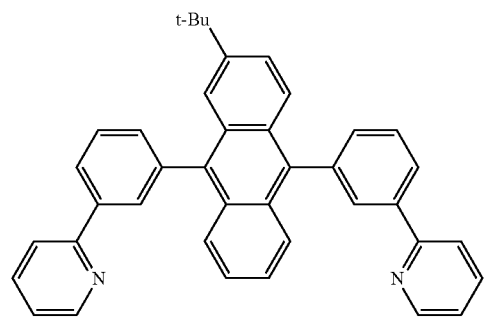
(9-58)
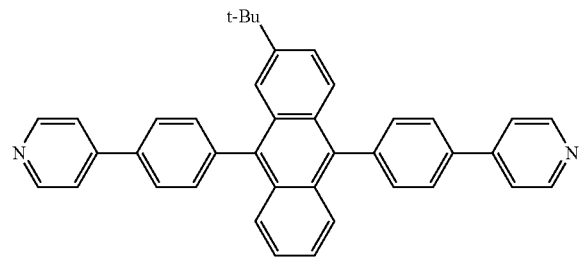
(9-59)
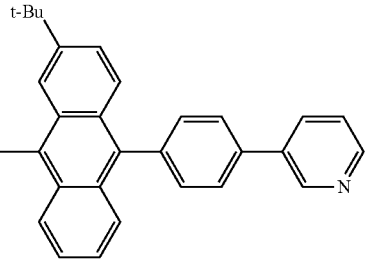
(9-60)
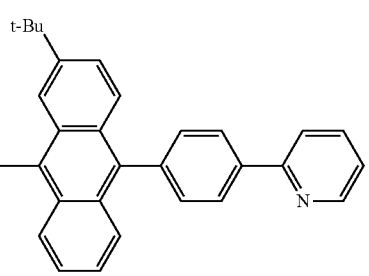
(9-61)
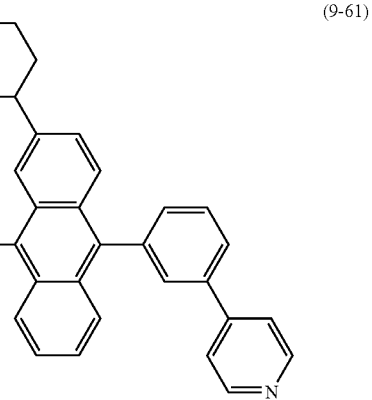
(9-62)
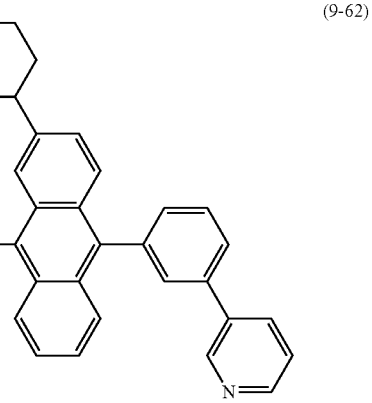

-continued
(9-63)
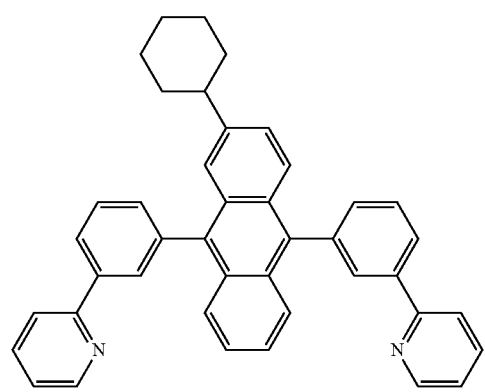
(9-64)
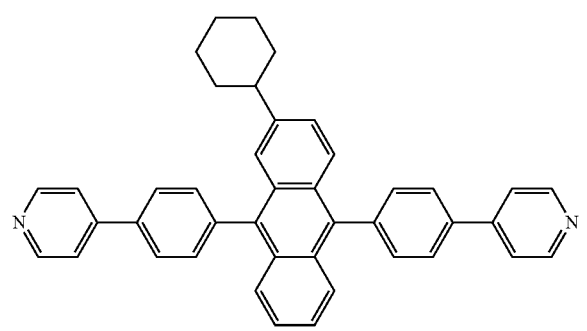
(9-65)
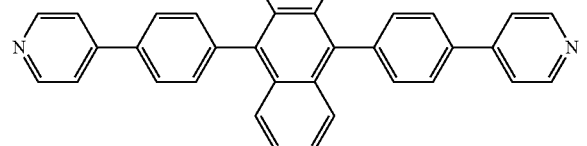
(9-66)
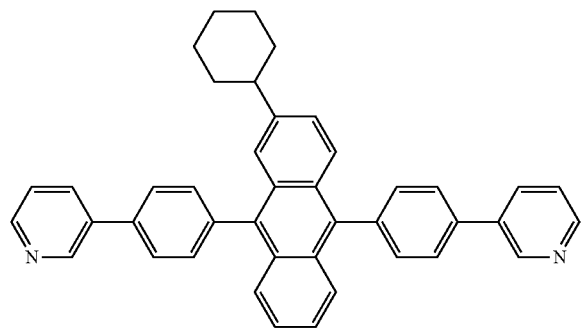
-continued
(9-67)
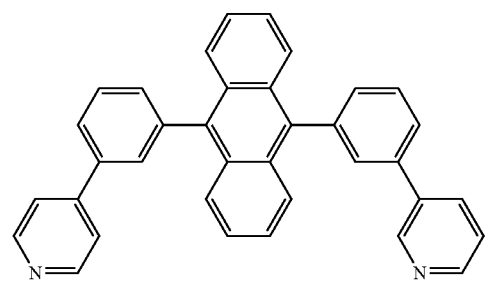
(9-68)
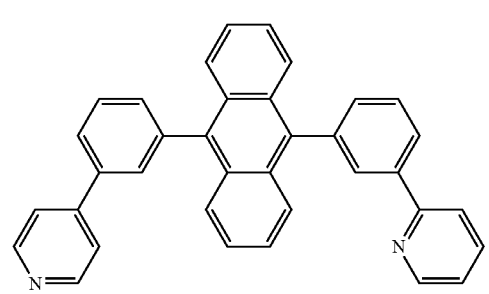
(9-69)
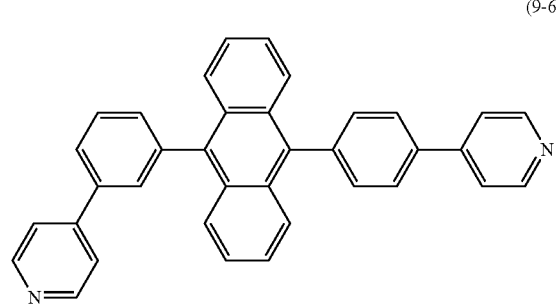
(9-70)
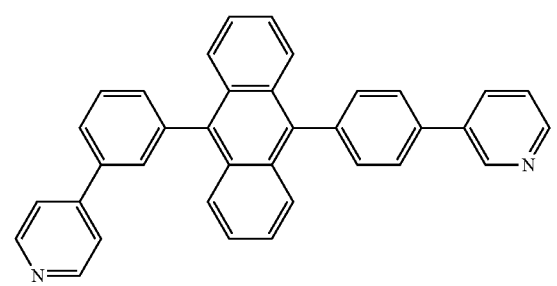
(9-71)
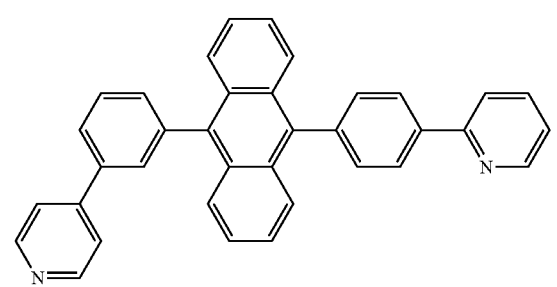

(9-72)
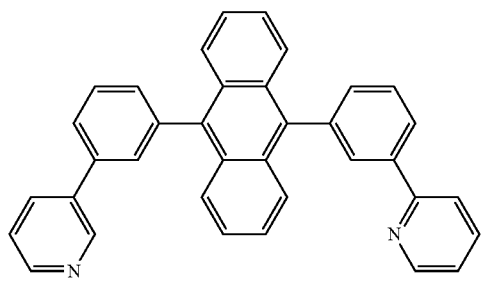
(9-77)
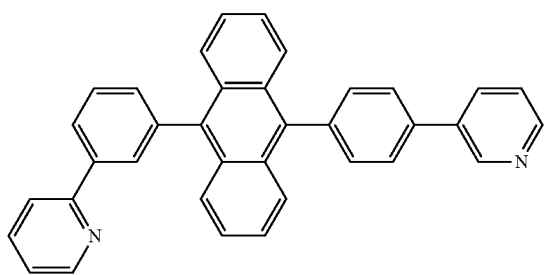
(9-73)
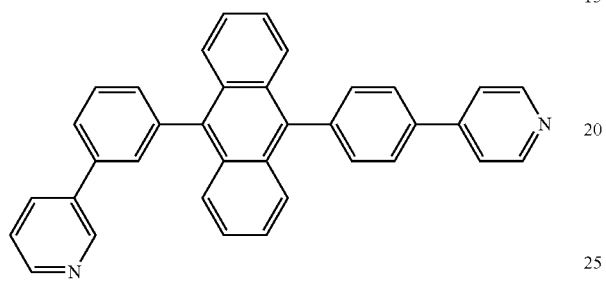
(9-78)
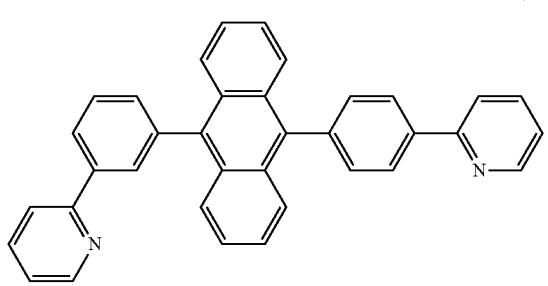
(9-74)
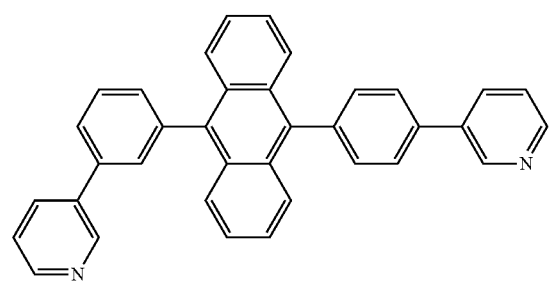
(9-79)
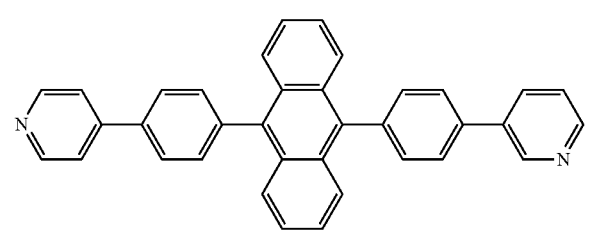
(9-75)
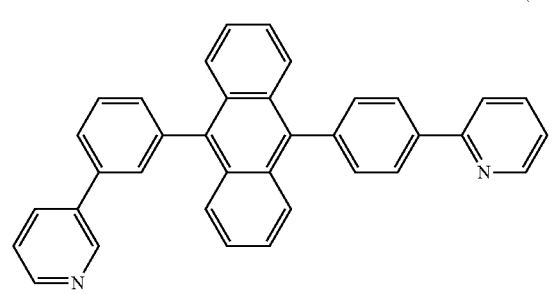
(9-80)
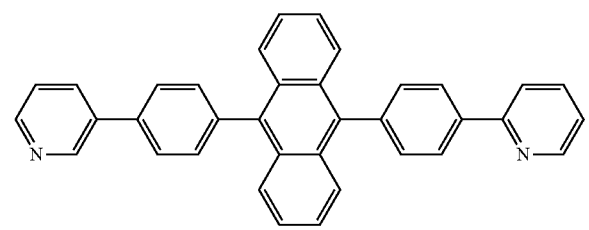
(9-76)
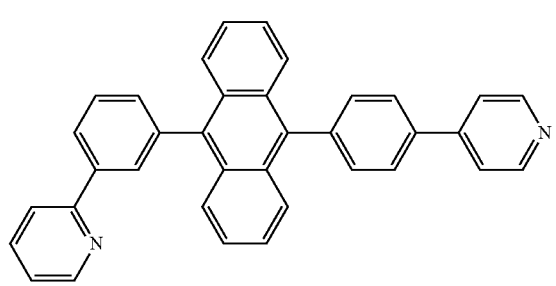
(9-81)
The compounds represented by the formula (10) are typically exemplified by those represented by the formulas (10-1) to (10-17) below.

(10-1)
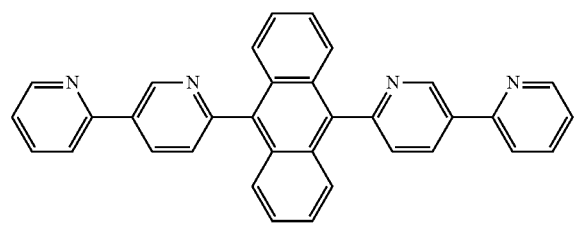
(10-2)
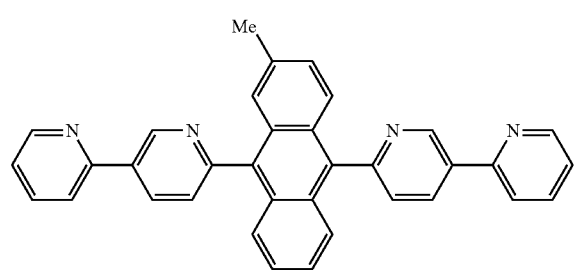
(10-3)
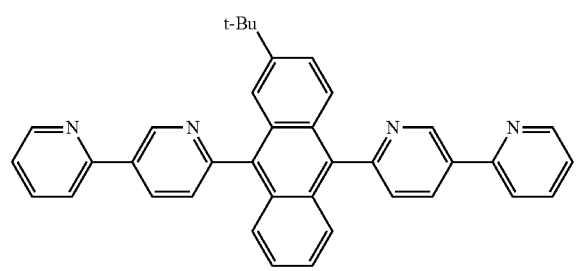
(10-4)
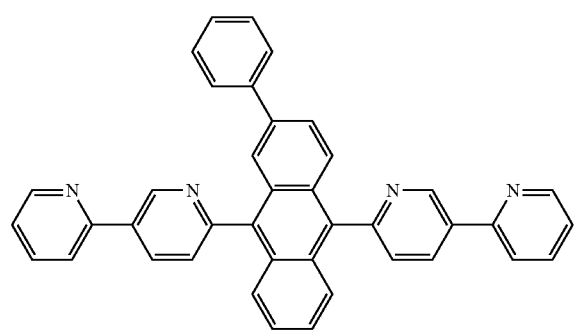
(10-5)
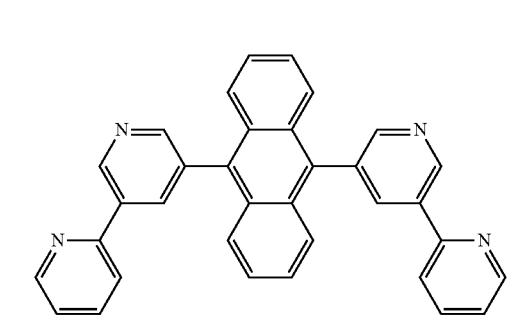
(10-6)
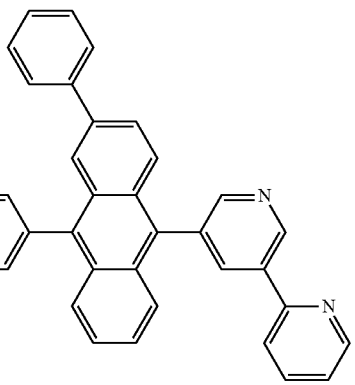
(10-7)
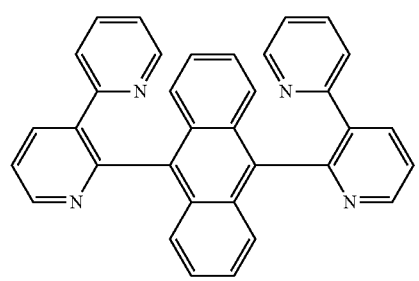
(10-8)
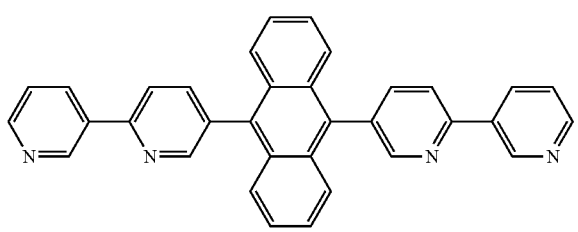
(10-9)
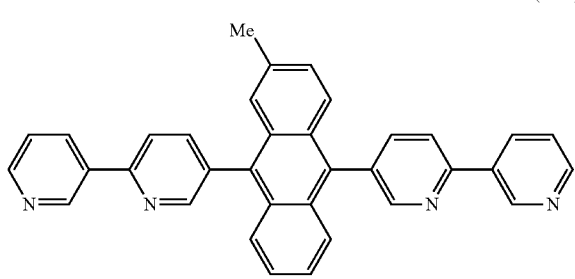
(10-10)
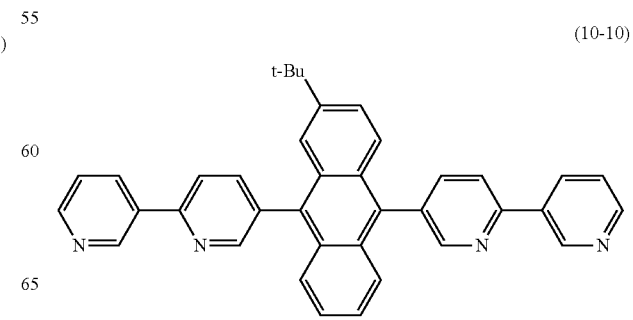

-continued (10-11)
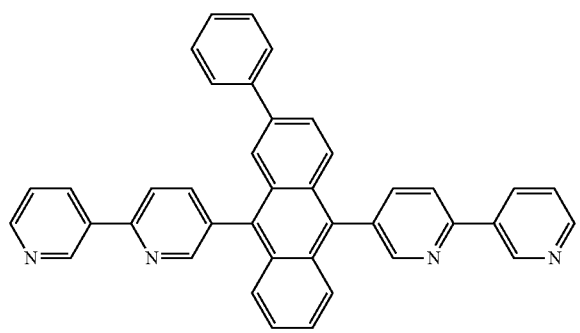

(10-12)
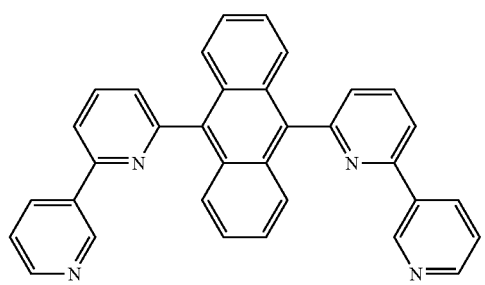

(10-13)
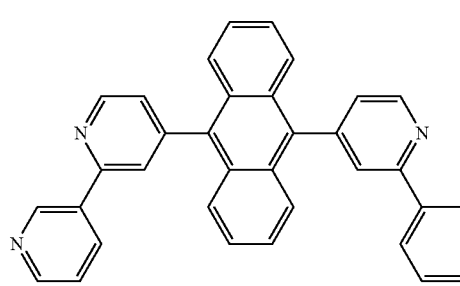

(10-14)
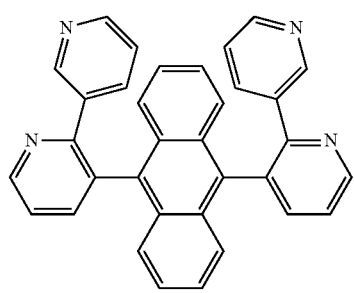

(10-15)
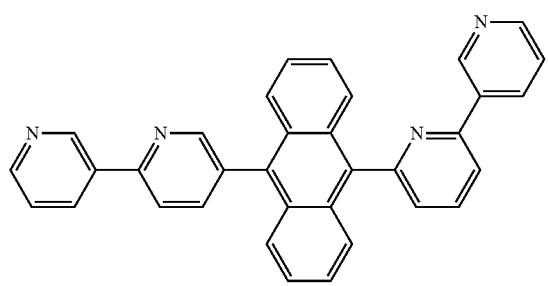

-continued (10-16)

(10-17)
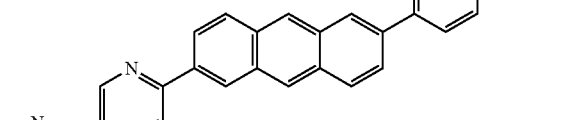

Also, the low-molecular weight compound to be incorporated into the red, green, and blue emitting layers 16CR, 16CG, and 16CB includes pyrazole derivatives represented by the formula (11) below, in addition to those compounds represented by the formulas (8) to (10) above.

(11)

(where R30 to R32 each denotes a hydrogen atom, an aromatic hydrocarbon group formed by condensation from one to three aromatic rings or a derivative thereof, an aromatic hydrocarbon group formed by condensation from one to three aromatic rings each having $C_{1-6}$ hydrocarbon groups or a derivative thereof, or an aromatic hydrocarbon group formed by condensation from one to three aromatic rings each having $C_{6-12}$ aromatic hydrocarbon groups or a derivative thereof.)

In the compound represented by the formula (11), the aromatic hydrocarbon groups represented by R30 to R32 include unrestrictedly phenyl group, 2-methylphenyl group, 3-methylphenyl group, 4-methylphenyl group, 2,4-dimethylphenyl group, 3,4-dimethylphenyl group, 2,4,5-trimethylphenyl group, 4-ethylphenyl group, 4-tert-butylphenyl group, 1-naphthyl group, 2-naphthyl group, 1-anthracenyl group, 2-anthracenyl group, 9-anthracenyl group, and 9-phenanthrenyl group. Incidentally, R30 to R32 may be identical or different.

The compound represented by the formula (11) is typically exemplified by those represented by the formulas (11-1) to (11-5) below which have two or three pyrazole structures in the same molecule.

(11-1)

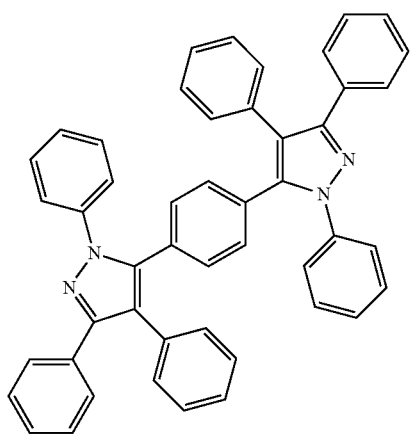

(11-2)

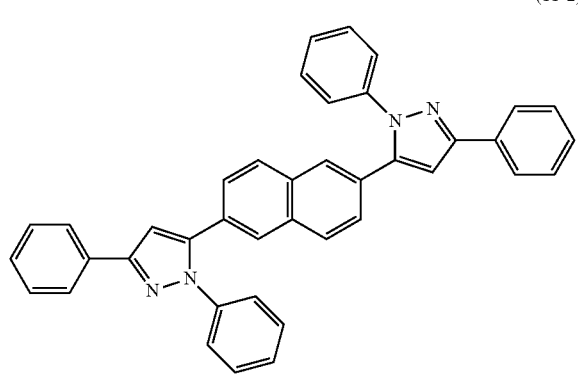

(11-3)

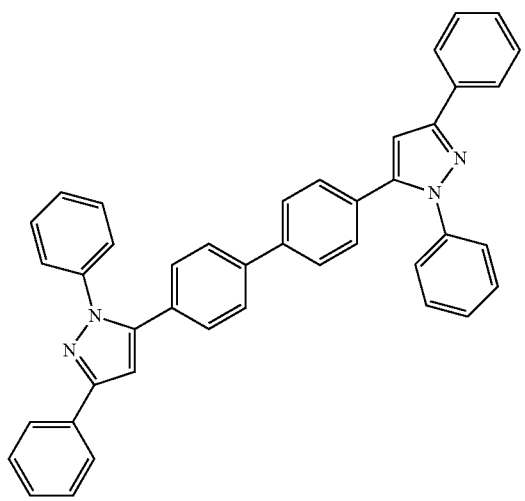

(11-4)

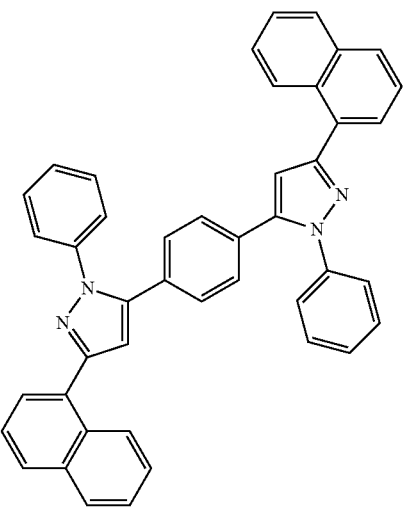

(11-5)

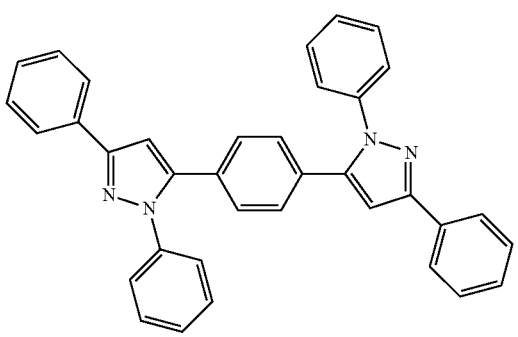

The low-molecular weight compound may be replaced by any phosphorescent material, such as metal complex containing at least one metal element selected from beryllium (Be), boron (B), zinc (Zn), cadmium (Cd), magnesium (Mg), gold (Au), silver (Ag), palladium (Pd), platinum (Pt), aluminum (Al), gadolinium (Ga), yttrium (Y), scandium (Sc), ruthenium (Ru), rhodium (Rh), osmium (Os), and iridium (Ir). Typical but unrestricted examples of such metal complexes are represented by the formulas (12-1) to (12-29) below.

(12-1)

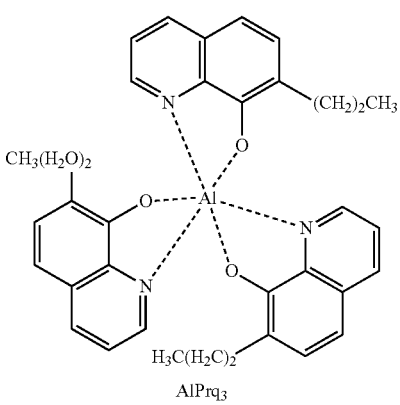

AlPrq$_3$

-continued
(12-2)
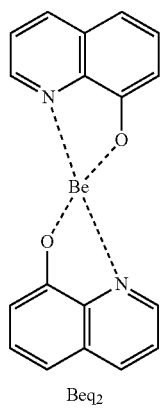
Beq₂
(12-3)
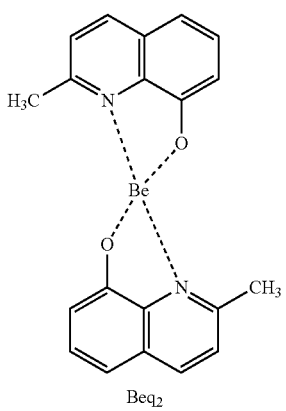
Beq₂
(12-4)
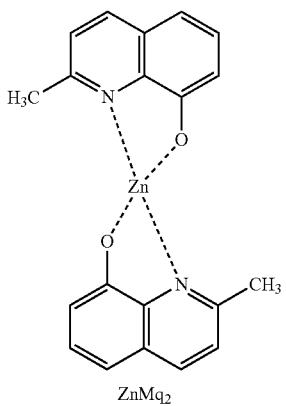
ZnMq₂
(12-5)
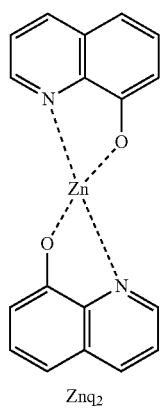
Znq₂
(12-6)
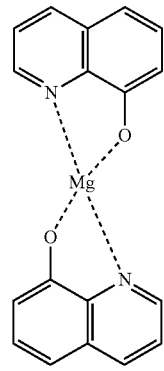
Mgq₂
(12-7)
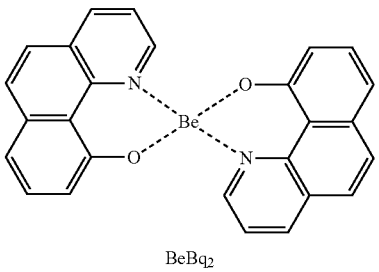
BeBq₂
(12-8)
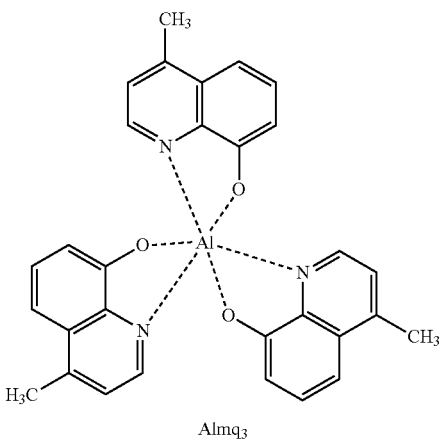
Almq₃
(12-9)
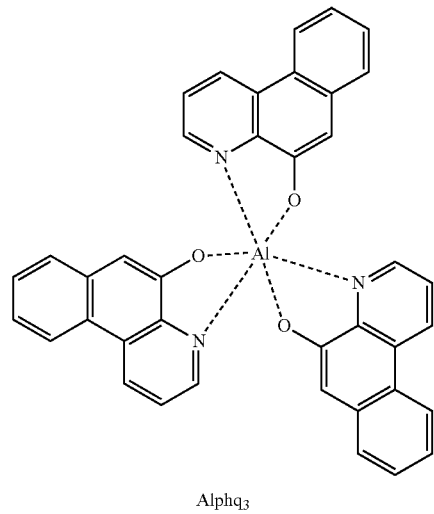
Alphq₃

-continued
(12-10)
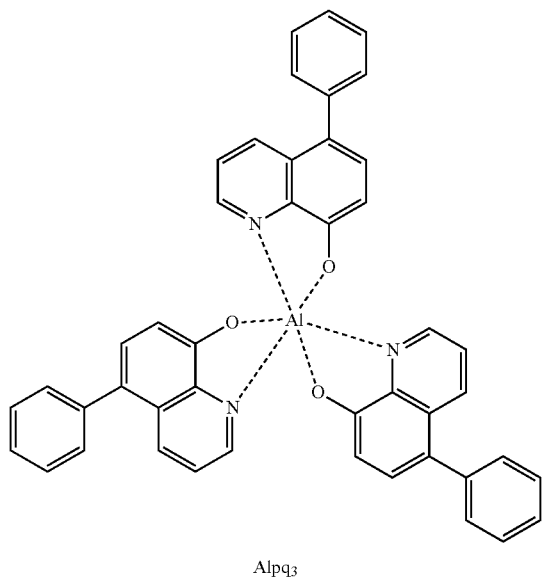
Alpq₃
(12-11)
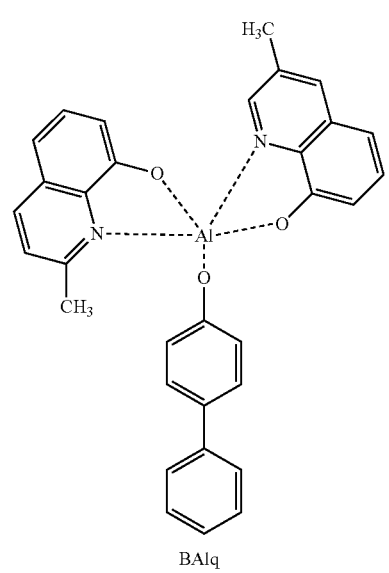
BAlq
(12-12)
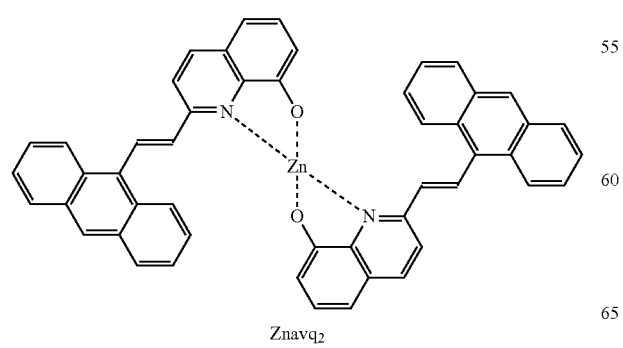
Znavq₂
-continued
(12-13)
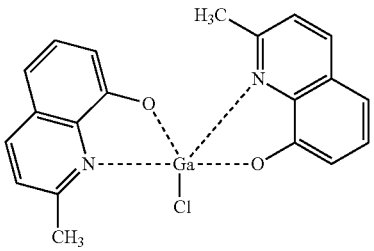
GaMq₂Cl
(12-14)
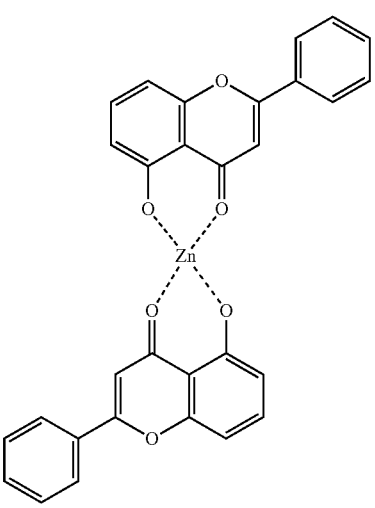
Zn(5Fla)₂
(12-15)
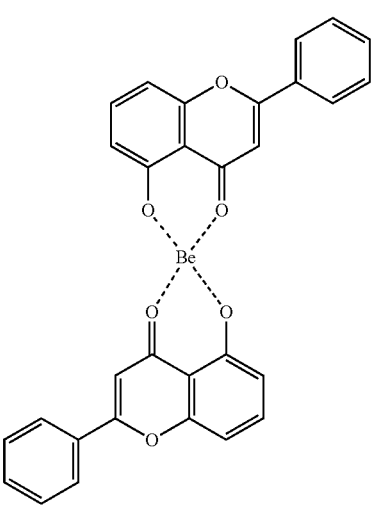
Be(5Fla)₂

(12-16)
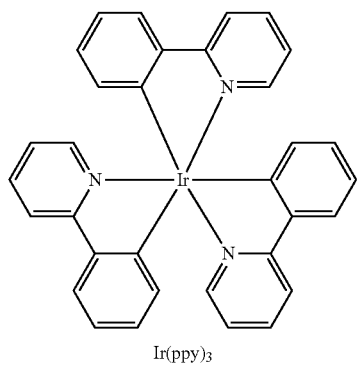
Ir(ppy)₃
(12-17)
Zn(BTZ)₂
(12-18)
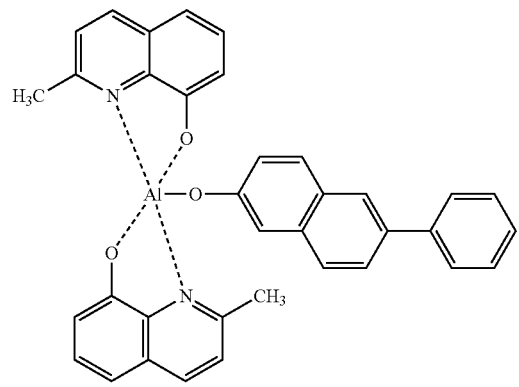
(12-19)
(12-20)
(12-21)
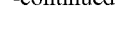 
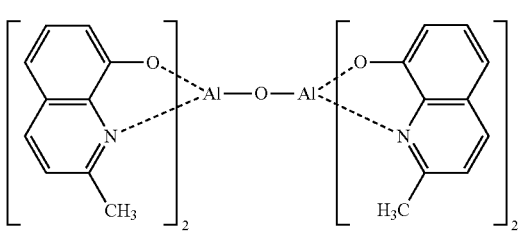
(12-22)
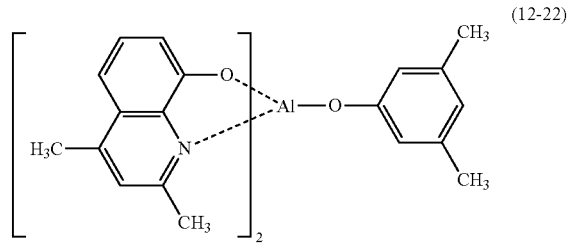
(12-23)
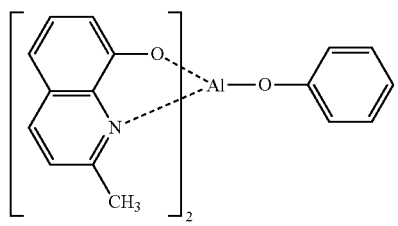
(12-24)
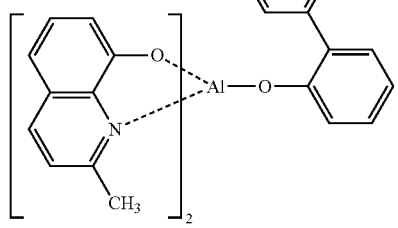
(12-25)
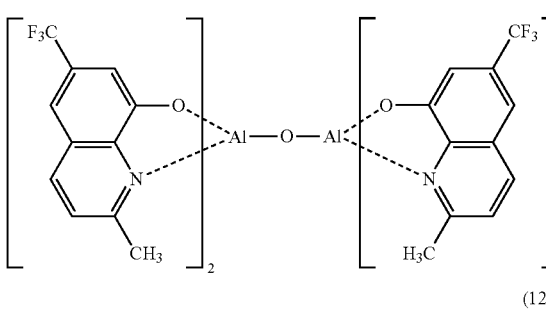
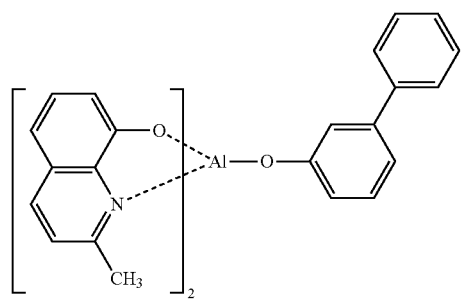
(12-26)
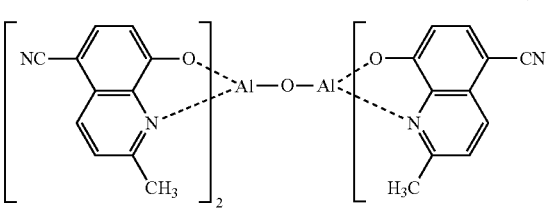
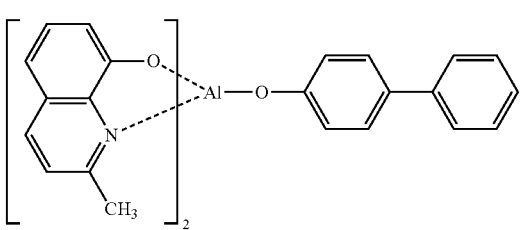

-continued (12-27)
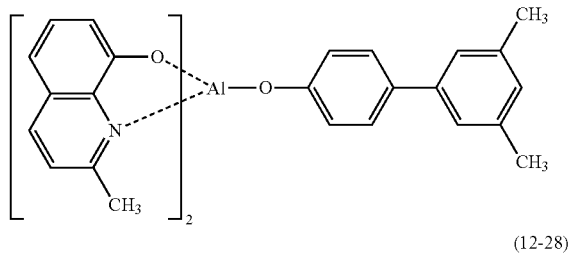

(12-28)
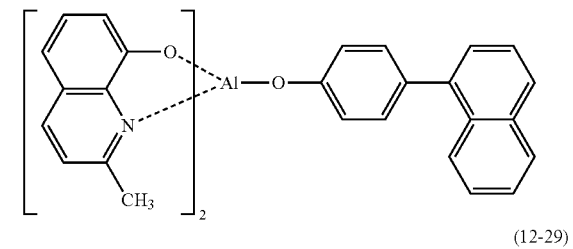

(12-29)
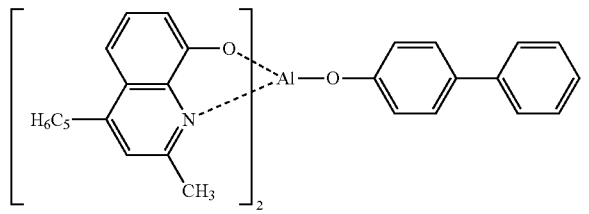

The low-molecular weight material to be incorporated into the red, green, and blue emitting layers 16CR, 16CG, and 16CB is not limited to one species. More than one species may be used in combination.

The electron transporting layer 16D is intended to improve the efficiency of electron transportation into the red, green, and blue emitting layers 16CR, 16CG, and 16CB, and it is formed as a common layer over the entire surface of these layers. The thickness of the electron transporting layer 16D ranges from 5 nm to 300 nm, preferably from 10 nm to 170 nm, depending on the entire structure of the element.

The electron transporting layer 16D should preferably be formed from an organic material highly capable of electron transportation. The improved efficiency of electron transportation into the light emitting layer 16C prevents the red, green, and blue organic EL elements 10R, 10G, and 10B from fluctuating in emission color due to the intensity of electric field which will be mentioned later. An example of the organic material is a nitrogen-containing heterocyclic derivative having an electron mobility no lower than $10^{-6}$ cm$^2$/Vs and no higher than $1.0 \times 10^{-1}$ cm$^2$/Vs.

The organic material for the electron transporting layer 16D is not limited to one species. More than one species may be used together in combination or separately in laminate form. In addition, it may also be incorporated into the electron injecting layer 16E which will be mentioned later.

The electron injecting layer 16E is intended to improve the efficiency of electron injection, and it is formed as a common layer over the entire surface of the electron transporting layer 16D. The electron injecting layer 16E may be formed from lithium oxide (LiO$_2$) or cesium carbonate (Cs$_2$CO$_3$) or a mixture thereof. Additional examples include alkaline earth metals, such as calcium (Ca) and barium (Ba), and alkali metals, such as lithium (Li) and cesium (Ce), and such metal as indium (In) and magnesium (Mg) having a small work function. These metals may be used alone or in combination in the form alloy, oxide, complex oxide, or fluoride for better stability. It is also possible to use the above-mentioned organic compounds represented by the formulas (8-1) to (11-5) as the material for the electron transporting layer 16D.

The upper electrode 17 is a conductive metal film having a thickness of 2 nm to 15 nm. The conductive metal is Al, Mg, Ca, or Na in alloy form. An alloy of magnesium and silver (Mg—Ag alloy) is desirable on account of its good conductivity and its low light absorption in its thin film form. The Mg—Ag alloy is not specifically restricted in the ratio of magnesium to silver. A desirable Mg/Ag ratio is from 20/1 to 1/1 in terms of film thickness. In addition, the upper electrode 17 may also be formed from an alloy of Al and Li (Al—Li alloy).

Moreover, the upper electrode 17 may be a layer formed from a mixture containing such organic emitting materials as aluminum-quinoline complex, styrylamine derivative, and phthalocyanine derivative. In this case, the upper electrode 17 may have an additional layer of MgAg capable of light transmission. Incidentally, in the case of the organic El display device of active matrix drive type, the upper electrode 17 is formed (in the form of film) over the entire surface of the substrate 11 in such a way that it is insulated from the lower electrode 14 by the organic layer 16 and the partition wall 15, and it functions as a common electrode for the red, green, and blue organic EL elements 10R, 10G, and 10B.

The protective film 30, which is for example 2 to 3 µm in thickness, may be formed from either insulating material or conductive material. The insulating material may be an inorganic one in amorphous form, such as amorphous silicon (a-Si), amorphous silicon carbide (a-SiC), amorphous silicon nitride (a-Si$_{1-x}$N$_x$), and amorphous carbon (a-C). Such amorphous inorganic insulating materials give rise to a good protective film with low water permeability because they do not form grains.

The sealing substrate 40 is placed over the upper electrode 17 for the red, green, and blue organic EL elements 10R, 10G, and 10B. It, in conjunction with the adhesion layer (not shown), seals the red, green, and blue organic EL elements 10R, 10G, and 10B. In the case of organic EL display device of top emission type, which emits light upward through the sealing substrate, the sealing substrate 40 is formed from a material such as glass transparent to light generated by the red, green, and blue organic EL elements 10R, 10G, and 10B. The sealing substrate 40 is provided with a color filter and a shielding film as a black matrix (both not shown), which permit the light generated by the red, green, and blue organic EL elements 10R, 10G, and 10B to go out and also absorb external light reflected by the red, green, and blue organic EL elements 10R, 10G, and 10B and wiring arranged thereunder, thereby improving contrast. In the case of organic EL display device of bottom emission type, which emits light downward through the lower electrode, the sealing substrate 40 has nothing to do with transmittance of visible light.

The color filter is composed of red, green, and blue filters (all not shown) which are arranged over the red, green, and blue organic EL elements 10R, 10G, and 10B, respectively. The red, green, and blue filters are tightly arranged side by side in rectangular form. They are formed from plastic resin incorporated with pigment. Selection of an adequate pigment makes it possible to increase or decrease the transmittance of desired light having a wavelength within or without the range of red, green, and blue.

The color filter has a high transmittance for light with a certain wavelength which coincides with the peak wavelength λ of the spectrum of light emerging from the resonating structure. As the result, the color filter transmits only a fraction of external light incident to the sealing substrate 40 which has the same wavelength as the peak wavelength λ of the spectrum of desired light but prevents the remainder of external light from entering the organic EL elements 10R, 10G, and 10B.

The shielding film is a black resin film having an optical density not lower than 1 which is incorporated with a black colorant, or a thin-film filter that produces thin film interference. The black resin film is economically desirable. The thin-film filter is a laminate composed of thin films of metal, metal nitride, or metal oxide. It is intended to attenuate light by means of interference produced by thin films. A typical example is a laminate composed of thin films of chromium (Cr) and chromium (iii) oxide ($Cr_2O_3$) placed one over another.

The organic EL display device 1 mentioned above may be produced in the following way.

Figure 4:
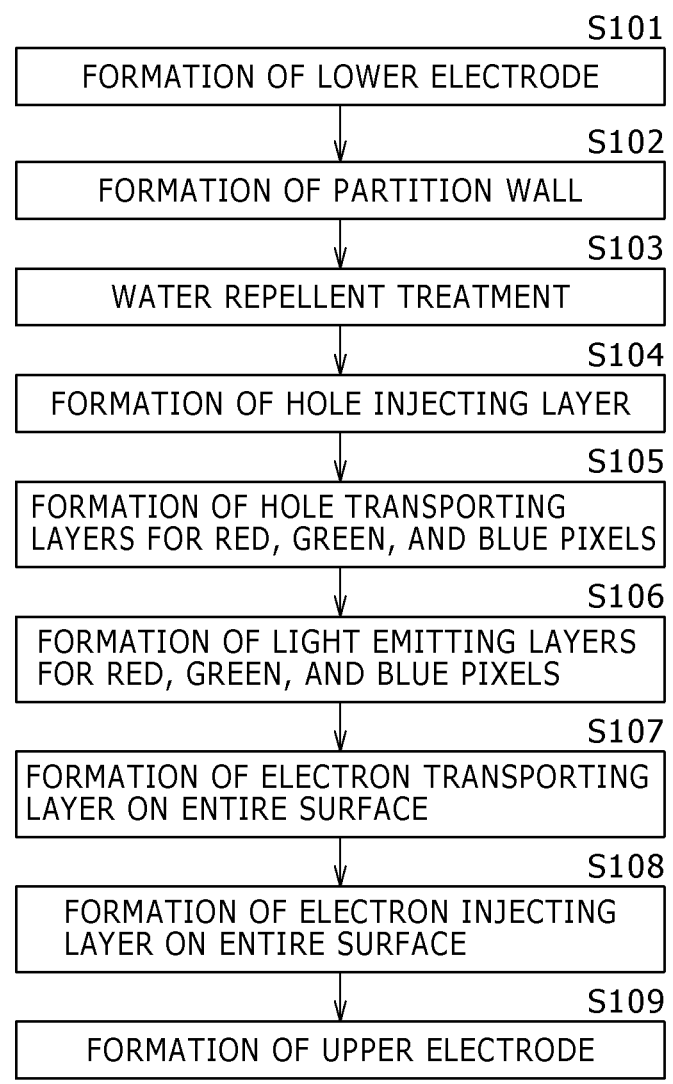
FIG. 4 is a flow chart illustrating the method for production of the organic EL display device shown in FIG. 1.

The organic EL display device is produced according to the flow chart shown in FIG. 4. Individual steps of the production process are sequentially shown in FIGS. 5A to 5G. The first step starts with preparing the substrate 11 from the above-mentioned material, forming thereon the pixel drive circuit 140 including the drive transistor Tr1, and forming a planarized insulating film of photosensitive resin (not shown).

(Step of Forming the Lower Electrodes 14)

Figure 5A:
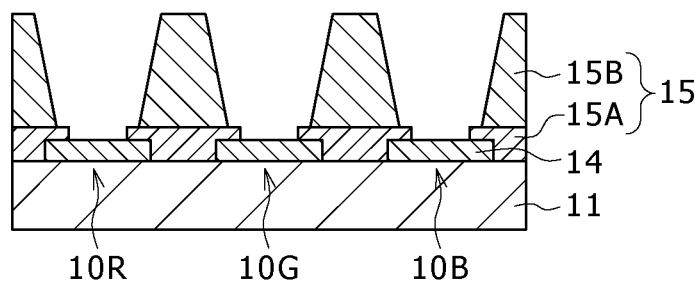
FIGS. 5A to 5G are sectional views sequentially representing the steps of the production process shown in FIG. 4.

In Step S101, the substrate 11 is entirely coated with a transparent conductive film of ITO, which is subsequently patterned to form the lower electrodes 14 individually for the red, green, and blue EL elements 10R, 10G, and 10B, as shown in FIG. 5A. In this step, too, each of the lower electrodes 14 is made to communicate with the drain electrode of the drive transistor Tr1 through a contact hole (not shown) formed in the planarized insulating film (not shown).

(Step of Forming the Partition Walls 15)

In Step S102, the planarized insulating film (not shown) and the lower electrodes 14 are coated with an inorganic insulating material such as $SiO_2$ by CVD (chemical vapor deposition), and the resulting film is patterned by photolithography and etching, so that the lower partition walls 15A are formed, as shown in FIG. 5A.

Subsequently, the lower partition walls 15A are overlaid with the upper partition walls 15B made of the above-mentioned photosensitive material, as shown in FIG. 5A. The upper partition walls 15B are so formed as to surround the emitting region of the pixel. In this way there are obtained the partition walls 15 each composed of the upper partition wall 15B and the lower partition wall 15A in step S102.

After formation of the partition walls 15, that side of the substrate 11 on which the lower electrodes 14 and the partition walls 15 have been formed undergoes oxygen-plasma treatment, so that the surface of the substrate is cleaned of contaminants (organic matter) for improvement in wettability. Specifically, the substrate 11 is heated at about 70 to 80° C. and oxygen plasma treatment is conducted under atmospheric pressure.

(Step of Performing Water-Repellent Treatment)

In Step S103, the plasma treatment is followed by the water repellent treatment, so that the top and side of the upper partition 15B wall decreases in wettability. Specifically, plasma treatment with tetrafluoromethane ($CF_4$) is conducted under atmospheric pressure, followed by cooling to room temperature. In this way the top and side of the upper partition wall 15B is made less wettable.

Incidentally, although the exposed part of the lower electrode 14 and the lower partition wall 15A are slightly affected by the $CF_4$ plasma treatment, they retain the improved wettability achieved by the oxygen plasma treatment because their constituent materials (ITO and $SiO_2$) are incompatible with fluorine.

(Step of Forming the Hole Injecting Layers 16AR, 16AG, and 16AB)

Figure 5B:
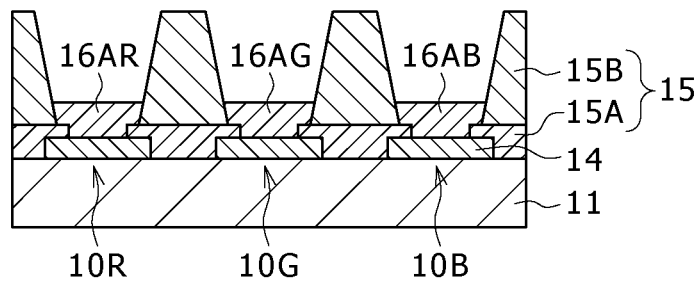

In Step 104 which follows the water repellent treatment, the hole injecting layers 16AR, 16AG, and 16AB are formed as shown in FIG. 5B, each in the region surrounded by the upper partition wall 15B, from the above-mentioned materials by spin coating, drop delivery coating method or the like. In particular, ink jet coating or nozzle coating as drop delivery coating method is desirable for precise allocation of materials.

To form the hole injecting layers 16AR, 16AG, and 16AB, a solution or dispersion of polyaniline, polythiophene, or the like is applied to the exposed part of the lower electrode 14 by ink jet coating, which is followed by heating for drying.

The drying step is further followed by heating at a higher temperature in oxygen or in the atmosphere, so that the conductive polymeric material such as polyaniline and polythiophene becomes more conductive due to oxidization.

Heating in this step should be carried out at 150 to 300° C., preferably 180 to 250° C., for 5 to 300 minutes, preferably 10 to 240 minutes depending on the heating temperature and atmosphere, so that the dried film has a thickness of 5 nm to 100 nm, preferably 8 nm to 50 nm.

(Step of Forming the Hole Transporting Layers 16BR, 16BG, and 16BB)

Figure 5C:
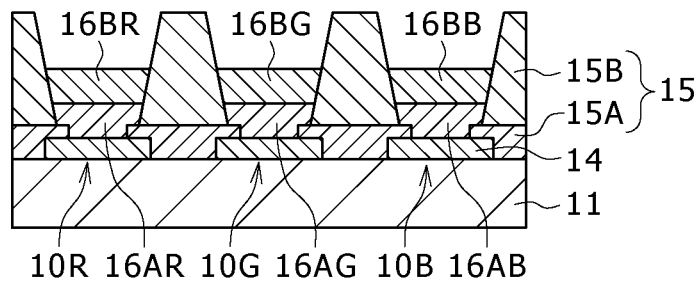

In Step S105 shown in FIG. 5C, the hole transporting layers 16BR, 16BG, and 16BB, each containing the above-mentioned polymeric material, are formed by spin coating method and drop delivery coating method respectively on the hole injecting layers 16AR, 16AG, and 16AB, which have been formed in Step S104. Ink jet coating or nozzle coating as delivery coating method is desirable for precise allocation of materials to the region surrounded by the upper partition walls 15B.

To form the hole transporting layers 16BR, 16BG, and 16BB, a mixed solution or dispersion of the polymeric material and low-molecular weight material is applied respectively to the exposed surfaces of the hole injecting layers 16AR, 16AG, and 16AB by, for example, ink jet coating, which is followed by heating for drying. In this way there are formed the hole transporting layers 16BR, 16BG, and 16BB for the red, green, and blue organic EL elements 10R, 10G, and 10B.

The drying step is further followed by heating at a higher temperature. Drying and subsequent heating should be carried out preferably in an atmosphere composed mainly of nitrogen ($N_2$) substantially free of oxygen and water vapor which are detrimental to the emission efficiency and life of the resulting organic EL display device. The effect of oxygen and water vapor is significant in the heating step. The oxygen concentration should be 0.1 to 100 ppm, preferably not higher than 50 ppm. With an oxygen concentration higher than 100 ppm, the resulting organic EL display device will be poor in emission efficiency and life due to contamination on the interface between thin films formed. However, processing with an oxygen concentration lower than 0.1 ppm is impracticable from the standpoint of equipment cost.

The concentration of water vapor expressed in terms of dew point should be −80° C. to −40° C., preferably not higher than −50° C., more preferably not higher than −60° C. Water vapor with a dew point higher than −40° C. causes contamination to the interface between thin films formed, thereby deteriorating the emission efficiency and life of the resulting organic EL display device. Keeping the concentration of water vapor below a dew point of −80° C. is impracticable in mass production at this point from the standpoint of equipment cost.

The heating temperature in this step should be 100 to 230° C., preferably 100 to 200° C. It should be lower than that in the step of forming the hole injecting layers 16AR, 16AG, and 16AB. The duration of heating should be 5 to 300 minutes, preferably 10 to 240 minutes, depending on the heating temperature and atmosphere. The dried film should have a thickness of 10 nm to 200 nm, preferably 15 nm to 150 nm, depending on the entire structure of the element.

(Step of Forming the Red, Green, and Blue Emitting Layers 16CR, 16CG, and 16CB)

Figure 5D:
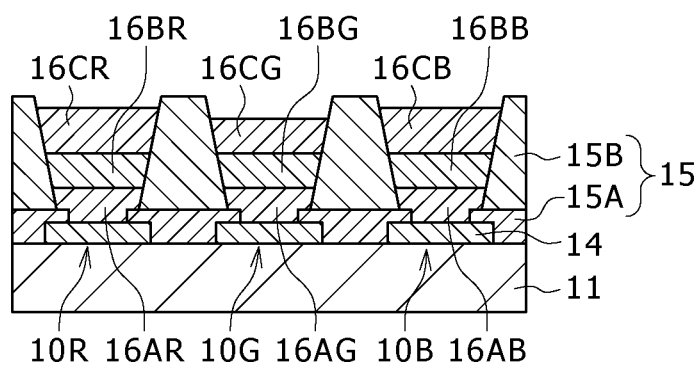

In Step S106 shown in FIG. 5D, the red, green, and blue emitting layers 16CR, 16CG, and 16CB are formed from a mixture of the above-mentioned polymeric material and low-molecular weight material respectively on the hole transporting layers 16BR, 16BG, and 16BB for the red, green, and blue organic EL elements 10R, 10G, and 10B. This step is carried out by spin coating or drop delivery coating. Specifically, it is desirable to conduct ink jet coating or nozzle coating as drop delivery coating for precise allocation of materials to the regions surrounded by the upper partition walls 15B.

To form the red, green, and blue emitting layers 16CR, 16CG, and 16CB, a mixed solution or dispersion of the polymeric material and low-molecular weight material is applied respectively to the exposed surfaces of the hole transporting layers 16BR, 16BG, and 16BB by ink jet coating, for example. The solution or dispersion contains 1 wt % of solute in a 2:8 mixture of xylene and cyclohexylbenzene. This coating step is followed by heat treatment (for drying) in the same way as in the step of forming the hole transporting layers 16BR, 16BG, and 16BB for the red, green, and blue organic EL elements 10R, 10G, and 10B.

Incidentally, in each of the foregoing steps, drying and heating should be carried out separately because the film formed immediately after coating remains highly fluid and vulnerable to thickness variation during drying. Uniform drying under normal pressure without air flow is desirable. The heating step that follows the drying step should be carried out by slow heat application, so that minute residual solvent completely evaporates from the film which has become less fluid and hardened to some extent. Heating in this manner permits rearrangement of the molecules of the emitting material and hole transporting material.

(Step of Forming the Electron Transporting Layer 16D, Electron Injecting Layer 16E, and Upper Electrode 17)

Figure 5E:
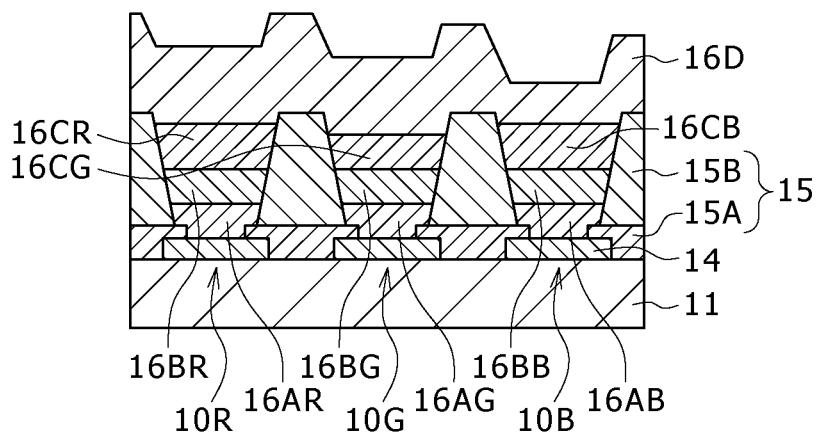
Figure 5F:
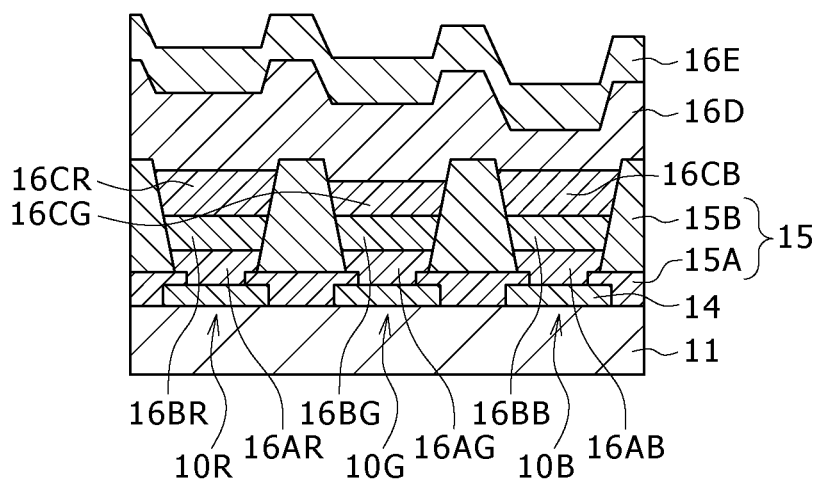
Figure 5G:
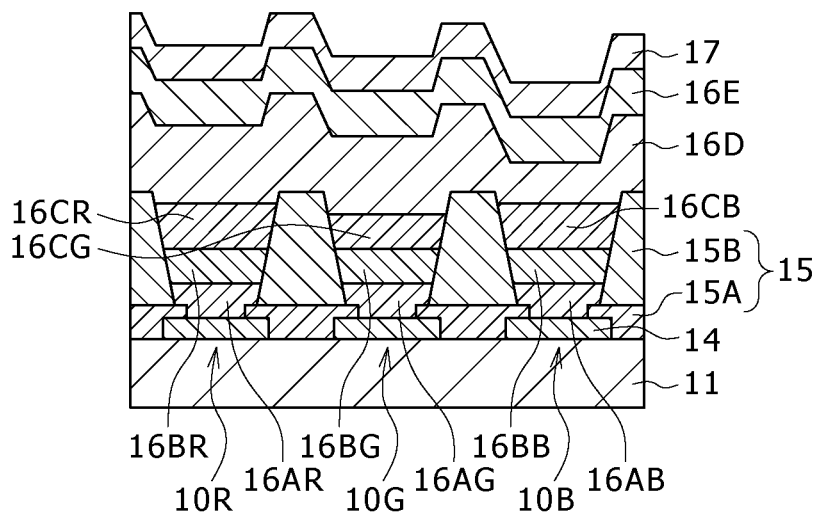

In Steps S107, S108, and S109 as shown in FIGS. 5E, 5F, and 5G, the electron transporting layer 16D, electron injecting layer 16E, and upper electrode 17 are sequentially formed by vapor deposition from the above-mentioned materials on the entire surface of the red, green, and blue light emitting layers 16CR, 16CG, and 16CB, respectively, which have been formed previously.

The upper electrode 17 is covered with the protective layer 30 by vapor deposition or CVD, which affects least the underlying layers on account of small energy of film-forming particles. The protective layer 30 (2 to 3 μm thick) of, for example, amorphous silicon nitride may be formed by CVD at normal temperature so that the organic layer 16 will not degrade to reduce luminance, with other conditions properly adjusted to minimize stress on the film and prevent the protective layer 30 from peeling.

The electron transporting layer 16D, electron injecting layer 16E, upper electrode 17, and protective layer 30 are formed over the entire surface without any mask placed thereon. Moreover, they should preferably be formed continuously in the same film-forming apparatus so that they are not exposed to the atmospheric air during fabrication. Thus the organic layers 16 are saved from deterioration by water vapor in the atmosphere.

In the case where the auxiliary electrode (not shown) is formed simultaneously with the lower electrode 14, the organic layers 16 formed over the entire surface of the auxiliary electrode may be removed by laser abrasion before the upper electrode 17 is formed, so that the upper electrode 17 connects directly with the auxiliary electrode for better contact.

After the formation of the protective layer 30, the sealing substrate 40 formed from the above-mentioned material is covered with the shielding film formed from the above-mentioned material. Next, the red, green, and blue filters (all not shown) are sequentially formed on the sealing substrate 40 by spin coating with an adequate material and patterning by lithography, which is followed by baking.

The protective layer 30 is covered with an adhesive layer (not shown), and the sealing substrate 40 is bonded to the protective layer 30, with the adhesive layer interposed between them. Thus the organic EL display device 1 is completed as shown in FIGS. 1 to 3.

The organic EL display device 1 functions in such a way that each pixel receives a scanning signal from the scanning line drive circuit 130 through the gate electrode of the writing transistor Tr2 and at the same time an image signal from the signal line drive circuit 120 is held in the storage capacity Cs through the transistor Tr2. In other words, the driving transistor Tr1 is turned on and off in response to the signal held in the storage capacity Cs. As the result, the red, green, and blue organic EL elements 10R, 10G, and 10B are supplied with the drive current Id which causes the recombination of holes and electrons for light emission. The thus generated light emerges from the lower electrode 14 and the substrate 11 or from the upper electrode 17, the color filter (not shown), and the sealing substrate 40, depending on whether the organic EL display device is of bottom emission type or top emission type, respectively.

The organic EL element mentioned above differs from the existing one which is poor in efficiency of electron injection from the electron transporting layer into the individual light emitting layers because the light emitting layer is formed from a polymeric material by coating and the electron transporting layer is formed from a low-molecular weight material by vacuum deposition. The reason for this is that there is a difference in energy level between the polymeric material and the low-molecular weight material as mentioned above and the interface of the light emitting layer formed by coating is subject to contamination which hinders electron transportation. Because of these drawbacks, the existing organic EL elements are poor in emission efficiency and short in life. The poor emission efficiency and short life are fatal to the organic EL display device.

The organic EL element according to this embodiment differs from the existing one in that each of the light emitting layers 16C is incorporated with the low-molecular weight material. This structure results in a smaller difference in energy level between the light emitting layer 16C and the electron transporting layer 16D and also an improved efficiency in electron injection from the upper electrode 17 into the light emitting layer 16C. The result is an optimum carrier balance between holes and electrons injected into the each of the light emitting layers 16C and an improved emission efficiency and an extended life.

As mentioned above, in the organic EL display device 1 according to this embodiment, the light emitting layers 16C for different colors are incorporated with the low-molecular weight material for improved efficiency of electron injection from the upper electrode 17 into the light emitting layers 16C. The result is an increased amount of electrons injected into the light emitting layers 16C and the absence of the barrier which occurs on the interface between the light emitting layer 16C and the electron transporting layer 16D because of contamination caused by difference in the method by which they are formed. That is, the method employed in this embodiment solves problems involved in the existing organic EL elements produced by printing process, thereby realizing efficient electron injection, efficient light emission, and extended life. The above-mentioned embodiment permits the production of organic EL display devices having improved emission efficiency and extended life.

Second Embodiment

The second embodiment will be described below. The same constituents as in the first embodiment will be given the same reference numerals and their explanation will be omitted. No diagrams are provided hereunder to illustrate the entire structure of the organic EL display device according to the second embodiment of the present disclosure. As in the first embodiment, the organic EL display device according to the second embodiment has the display region composed of the red, green, and blue EL elements 20R, 20G, and 20B which are arranged in a matrix pattern on the substrate 11. In the display region are the pixel drive circuits.

The red, green, and blue EL elements 20R, 20G, and 20B in the display region constitute a matrix pattern such that one combination of three adjoining different elements forms one pixel.

In the periphery of the display region are the signal line drive circuit and scanning line drive circuit for video display, as in the first embodiment.

Figure 6:
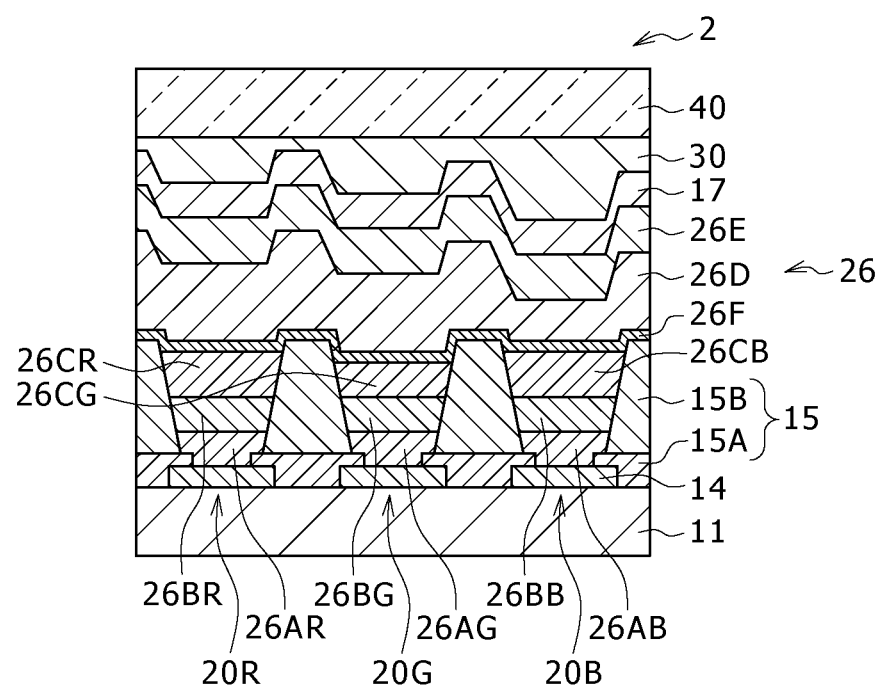
FIG. 6 is a diagram depicting in section the structure of the organic EL display device according to the second embodiment of the present disclosure.

FIG. 6 is a diagram depicting in section the structure of the organic EL display device 2 according to the second embodiment. As in the first embodiment, each of the red organic EL element 20R, the green organic EL element 20G, and the blue organic EL element 20B is composed of the substrate 11, the drive transistor Tr1 of the pixel drive circuit, the planarized insulating film (not shown), the lower electrode 14 as the anode, the partition wall 15, the organic layer 26 which will be mentioned later including the light emitting layers 26C, and the upper electrode 17 as the cathode, which are sequentially arranged upward. The second embodiment is identical with the first one in the structure of the substrate 11, the lower electrode 14, the partition wall 15, the upper electrode 17, the protective film 30, and the sealing substrate 40 (except for the organic layer 26).

The organic EL display device 2 according to the second embodiment differs from the one according to the first embodiment in that there is the hole blocking layer 26F formed between the red, green, and blue emitting layers 26CR, 26CG, and 26CB and the electron transporting layer 26D that covers their entire surface.

To be more specific, the red organic EL element 20R, which is similar to the red organic EL element 10R in the first embodiment, has the organic layer 26 which is composed of the hole injecting layer 26AR, the hole transporting layer 26BR, the red emitting layer 26CR, the hole blocking layer 26F, the electron transporting layer 26D, and the electron injecting layer 26E, which are placed upward one over another from the lower electrode 14 side. The green organic EL element 20G and the blue organic EL element 20G also have the same structure as mentioned above. That is, the organic layers 26 of the green and blue organic EL elements 20G and 20B are composed of the hole injecting layer 26AG (26AB), the hole transporting layer 26BG (26BB), the green emitting layer 26CG (blue emitting layer 26CB), the hole blocking layer 26F, the electron transporting layer 26D, and the electron injecting layer 26E, which are placed upward one over another from the lower electrode 14 side. Of these layers, the hole blocking layer 26F, the electron transporting layer 26D, and the electron injecting layer 26E function as the common layer for the red, green, and blue EL elements 20R, 20G, and 20B.

The hole blocking layer 26F is designed to prevent holes from penetrating from the emitting layers 26C into the electron transporting layer 26D, thereby increasing the possibility of recombination of holes and electrons in the emitting layers 26C. The hole blocking layer 26F serves as the common layer for the red, green, and blue emitting layers 26CR, 26CG, and 26CB. The hole blocking layer 26F should have a thickness of 1 nm to 30 nm, preferably 5 nm to 10 nm, depending on the entire structure of the element.

The hole blocking layer 26F is formed by vapor deposition from a low-molecular weight material, such as monomer. Oligomers and polymers are not desirable because they are liable to decomposition during vapor deposition. More than two species of low-molecular weight materials differing in molecular weight may be used in combination.

The low-molecular weight material to be used for the hole blocking layer 26F is similar to the one used for the electron transporting layer 16D in the first embodiment. It may be a nitrogen-containing heterocyclic derivative having an electron mobility no lower than $10^{-6}$ cm$^2$/Vs and no higher than $1.0 \times 10^{-1}$ cm$^2$/Vs. Its typical examples include carbazole derivatives [formula (5)], benzoimidazole derivatives [formula (8)], pyridylphenyl derivatives [formula (9)], bipyridine derivatives [formula (10)], and pyrazole derivatives [formula (11)]. A preferable material is one in which the gap of energy level between HOMO and LUMO is larger than that of the electron transporting layer 26D, with the typical value of gap being 2.8 to 3.5.

Figure 7:
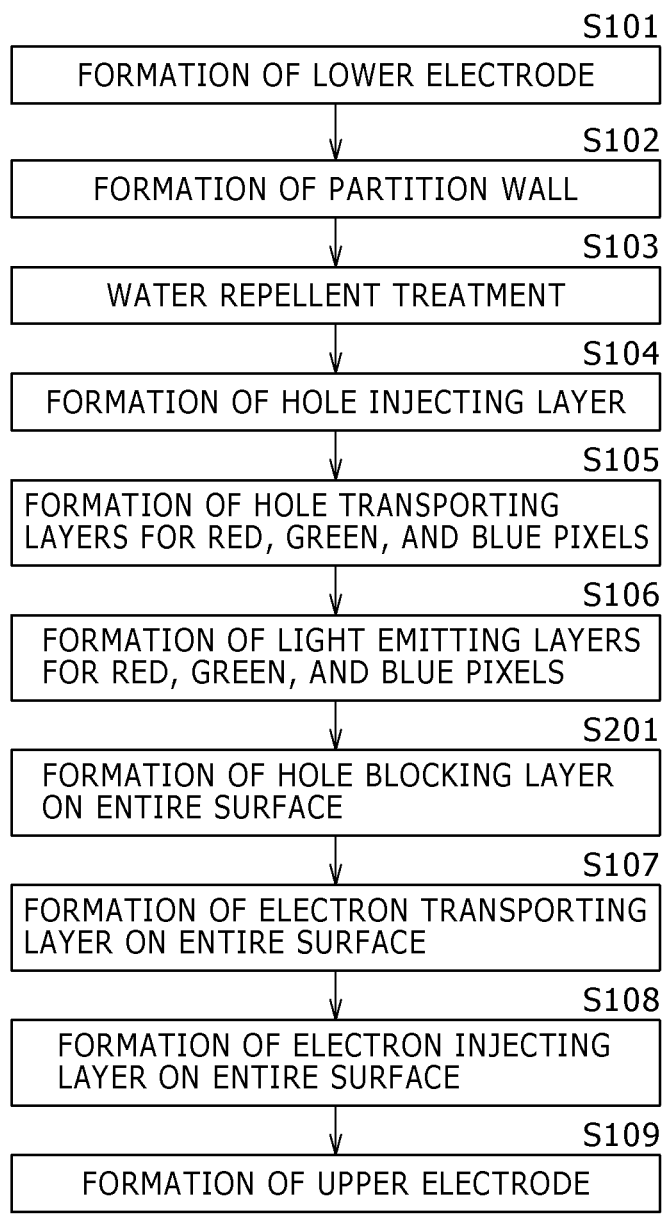
FIG. 7 is a flow chart illustrating the method for production of the organic EL display device shown in FIG. 6.

The organic EL display device 2 is produced according to the flow chart shown in FIG. 7. This flow chart differs from the one for the first embodiment in that Step S201 for forming the hole blocking layer 26F which will be mentioned later is inserted between Step S106 and Step S107.

(Step of Forming the Hole Blocking Layer 26F)

In Step S201, the hole blocking layer 26F (as a common layer) is formed by vapor deposition from the low-molecular weight material mentioned above on the entire surface of the red, green, and blue emitting layers 26CR, 26CG, and 26CB which have been previously formed.

The hole blocking layer 26F is formed over the entire surface without any mask placed thereon, as in the case of the electron transporting layer 16D, electron injecting layer 16E, upper electrode 17, and protective layer 30 formed in the first embodiment. Moreover, it should preferably be formed continuously in the same film-forming apparatus so that it is not exposed to the atmospheric air during fabrication as in the case of the layers 16D, 16E, 17 and 30 in the first embodiment. Thus the organic layer 26 is saved from deterioration by water vapor in the atmosphere.

The second embodiment is advantageous over the first one as proved by its additional effects explained below. That is, the organic EL display device 2 has the hole blocking layer 26F which is formed between the individual emitting layers 26CR, 26CG, and 26CB and the electron transporting layer 26D from a material having a large gap between HOMO level and LUMO level. This hole blocking layer 26F prevents penetration of holes from the emitting layers 26CR, 26CG, and 26CB into the electron transporting layer 26D, thereby increasing the possibility of recombination of holes and electrons in the emitting layers 26C. This leads to a further improvement in emission efficiency in the color organic EL display device with the regularly arranged organic EL elements 20R, 20G, and 20B.

MODULE AND APPLICATION EXAMPLES

The organic EL display device according to the foregoing embodiments will find use in various electronic applications, such as television set, digital camera, video camera, note-type personal computer, and mobile telephone, which are intended to display images or videos resulting from eternally entered or internally generated video signals.

(Module)

Figure 8:
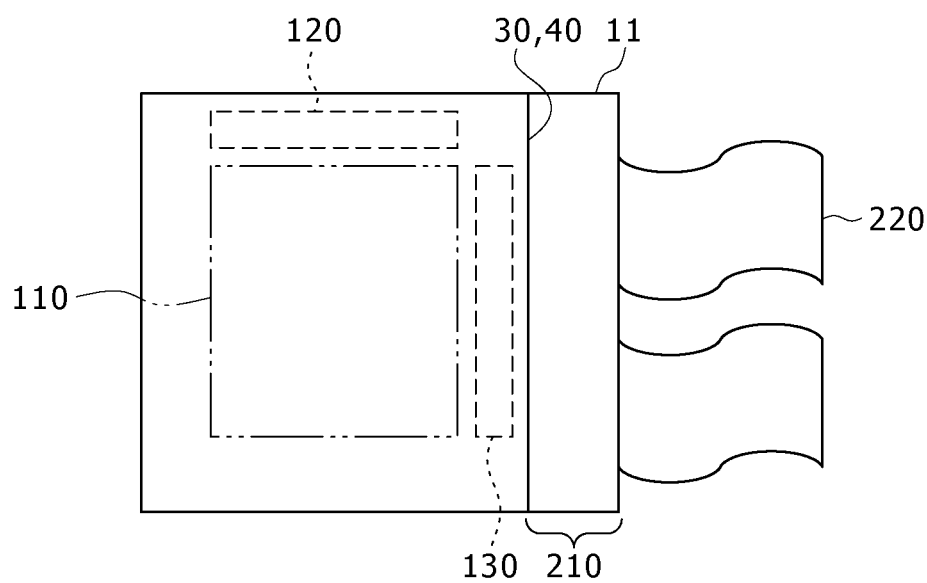
FIG. 8 is a schematic plan view depicting the module containing the display device according to the embodiment mentioned above.

The organic EL display device according to the foregoing embodiments is used as a module as shown in FIG. 8 which is built into a variety of electronic machines and equipment as listed in the application examples 1 to 5 mentioned later. This module has the region 210 at one side thereof which is exposed from the protective layer 30 and the sealing substrate 40. This exposed region permits the wiring from the signal line drive circuit 120 and scanning line drive circuits 130 to extend to the external connecting terminals (not shown). The external connecting terminals permit signal input and output through the flexible printed circuit (FPC) 220 connected thereto.

Application Example 1

Figure 9:
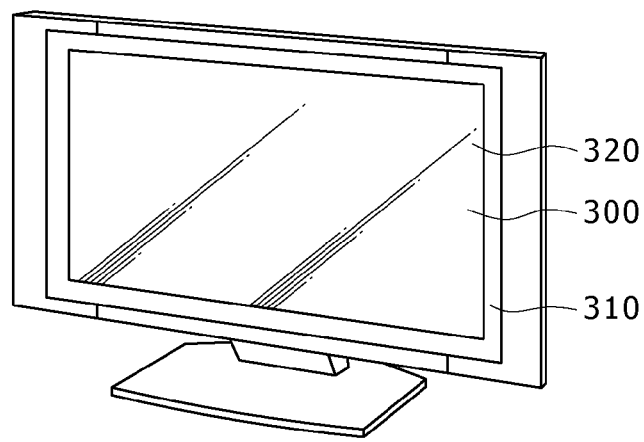
FIG. 9 is a perspective view depicting the appearance of the apparatus as the first example of application of the display device according to the embodiment mentioned above.

FIG. 9 is a perspective view depicting the appearance of a television set to which is applied the organic EL display device according to the embodiment mentioned above. This television set has the video image display unit 300 which is composed of the front panel 310 and the filter glass 320. And this video image display unit 300 is the organic EL display device pertaining to the above-mentioned embodiment.

Application Example 2

Figure 10A:
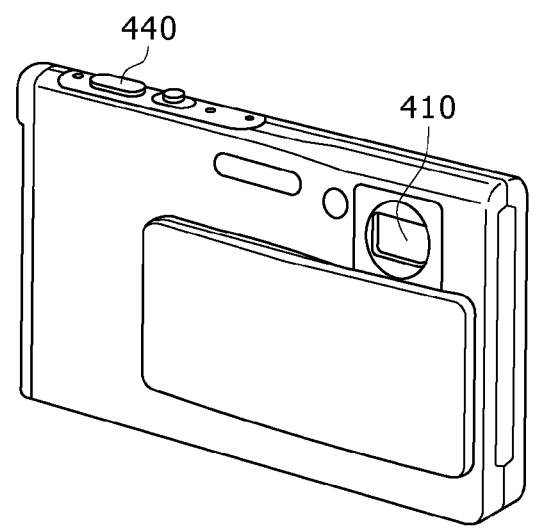
FIG. 10A is a perspective view depicting the front appearance of the apparatus as the second example of application.
Figure 10B:
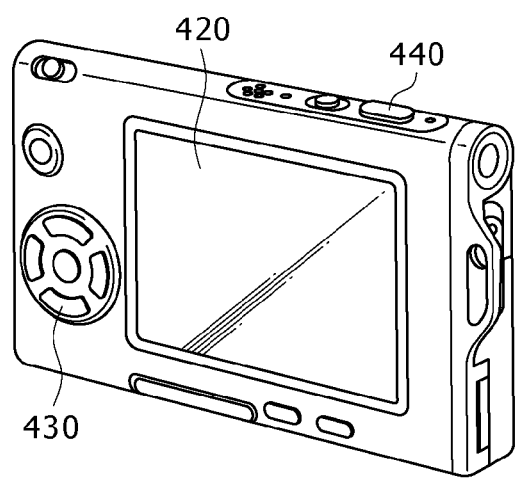
FIG. 10B is a perspective view depicting the rear appearance of the apparatus as the second example of application.

FIGS. 10A and 10B are perspective views depicting the external appearance of a digital camera to which is applied the organic EL display device according to the embodiment mentioned above. This digital camera has the flash 410, the monitor 420, the menu switch 430, and the shutter button 440. This monitor 420 is the organic EL display device pertaining to the above-mentioned embodiment.

Application Example 3

Figure 11:
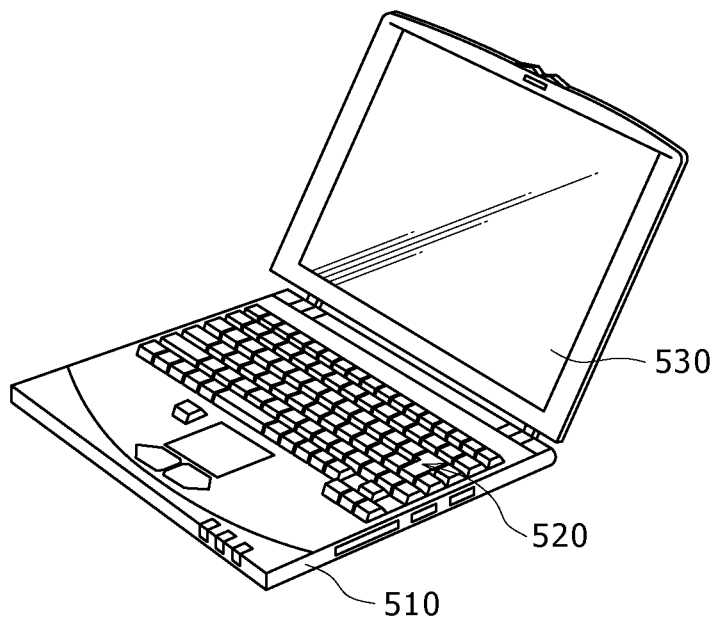
FIG. 11 is a perspective view depicting the appearance of the apparatus as the third example of application.

FIG. 11 is a perspective view depicting the appearance of a note-type personal computer to which is applied the organic EL display device according to the embodiment mentioned above. This note-type personal computer is composed of the main body 510, the key board 520, and the monitor 530 for image display. This monitor 530 is the organic EL display device pertaining to the above-mentioned embodiment.

Application Example 4

Figure 12:
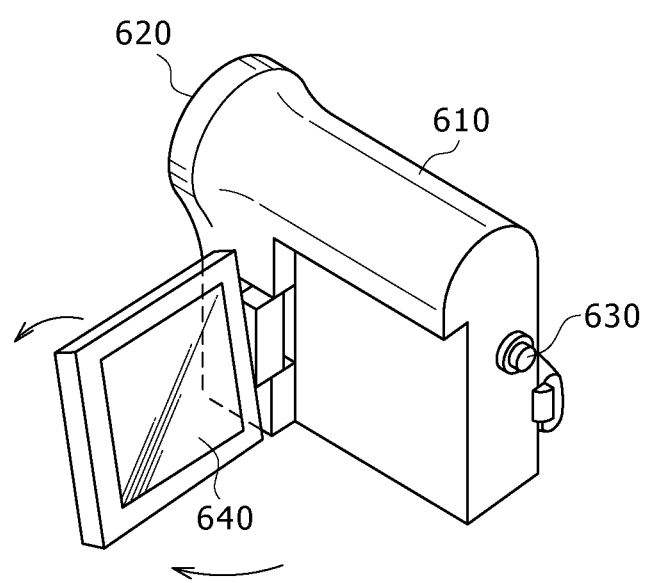
FIG. 12 is a perspective view depicting the appearance of the apparatus as the fourth example of application.

FIG. 12 is a perspective view depicting the appearance of a video camera to which is applied the organic EL display device according to the embodiment mentioned above. This video camera is composed of the main body 610, the imaging lens 620 attached to the front of the main body 610, the start/stop switch 630 for shooting, and the monitor 640. This monitor 640 is the organic EL display device pertaining to the above-mentioned embodiment.

Application Example 5

FIGS. 13A to 13G are diagrams depicting the appearance of a mobile phone to which is applied the organic EL display device according to the embodiment mentioned above. This mobile phone is composed of the upper enclosure 710 and the lower enclosure 720, which are joined together by the hinge 730. It has the display 740, the subdisplay 750, picture light 760, and the camera 770. The display 740 and the subdisplay 750 are the organic EL display device pertaining to the above-mentioned embodiment.

Example 1

This example demonstrates the process of forming the red, green, and blue organic EL elements 10R, 10G, and 10B on the substrate 11 measuring 25 mm by 25 mm.

The substrate 11 is a glass plate (measuring 25 mm by 25 mm). In Step S101, the substrate 11 was coated with a transparent conductive film of ITO (120 nm thick), which serves as the lower electrode 14.

In Step S102, the lower partition wall 15A was formed from an inorganic material (typically $SiO_2$) and the upper partition wall 15B was formed from a plastic material (typically polyimide, acrylic resin, or novolak) thereby forming partition walls 15. In Step 103, the partition walls 15 underwent plasma treatment with a fluorine-based gas (typically $CF_4$) in a plasma apparatus so that its surface was rendered water repellent.

In Step S104, the hole injecting layers 16AR, 16AG, and 16AB were formed from ND1501 (polyaniline made by Nissan Chemical Industries, Ltd.) by nozzle coating in the atmosphere in such a way that the resulting coating film had a thickness of 15 nm. The coating step was followed by heat curing on a hot plate at 220° C. for 30 minutes.

In Step S105, the hole injecting layers 16AR, 16AG, and 16AB were coated by nozzle coating with a 1 wt % solution of the compound represented by the formula (1-1) dissolved in a 1:2 (by weight) mixed solvent of xylene and tetrahydrofuran (THF), so that the hole transporting layers 16BR, 16BG, and 16BB were formed on them. The hole transporting layer 16BR on the red organic EL element 10R is 50 nm thick. The hole transporting layer 16BG on the green organic EL element 10G is 30 nm thick. The hole transporting layer 16BB on the blue organic EL element 10B is 20 nm thick. The coated substrate 11 was heated at 180° C. for 30 minutes under reduced pressure for solvent evaporation.

In Step S106, the hole transporting layer 10BR of the red organic EL element 10R was coated with the red emitting layer 16CR, which was formed by nozzle coating from a solution or ink of a 2:1 (by weight) mixture of the polymeric material RPP (for red color emission) represented by the formula (3-1) containing an iridium complex and the low-molecular weight material represented for example by the formula (4-23), which is dissolved in xylene or a solvent having a higher boiling point than xylene. This coating was carried out to give a 60-nm thick film. The hole transporting layers 16BG and 16BB of the green and blue organic EL elements 10G and 10B were also coated with the green and blue emitting layers 16CG and 16CB, respectively, each of which was formed from a solution or ink of 2:1 (by weight) mixture of the polymeric material GPP (for green color emission) represented by the formula (3-2) or the polymeric material BPP (for blue color emission) represented by the formula (3-3) and the low-molecular weight material represented for example by the formula (4-23), which is dissolved in xylene or a solvent having a higher boiling point than xylene. This coating was carried out to give a 50-nm thick film. This coating process was followed by heating at 130° C. for 30 minutes under reduced pressure for solvent evaporation.

Then, the substrate 11 was placed in a vacuum deposition equipment to form the electron transporting layer 16D and additional layers thereon by vapor deposition.

In Step S107, the red, green, and blue emitting layers 16CR, 16CG, and 16CB were coated with the electron transporting layer 16D (15 nm thick), which was formed by vacuum deposition from the organic material represented by the formula (8-17), for example. In Step S108, the electron injecting layer 16E (0.3 nm thick) was formed from LiF by vapor deposition. In Step S109, the upper electrode 17 (100 nm thick) was formed from aluminum. Finally, the upper electrode 17 was covered with the protective layer 30 (3 μm thick), which was formed from SiN by CVD, and then the entire surface was sealed with an epoxy resin. The thus obtained red, green, and blue organic EL elements 10R, 10G, and 10B in combination gave the full-color organic EL display device (Examples 1-1 to 1-10). In Comparative Examples 1-1 to 1-3, the organic EL display devices were produced in the same way as above except that the emitting layers 16CR, 16CG, and 16CB were not incorporated with the low-molecular weight material.

Example 2

This example demonstrates the process of forming the red, green, and blue organic EL elements 20R, 20G, and 20B on the substrate 11 measuring 25 mm by 25 mm.

The substrate 11 is a glass plate (measuring 25 mm by 25 mm). In Step S101, the substrate 11 was coated with a transparent conductive film of ITO (120 nm thick), which serves as the lower electrode 14.

In Step S102, the lower partition wall 15A was formed from an inorganic material (typically $SiO_2$) and the upper partition wall 15B was formed from a plastic material (typically polyimide, acrylic resin, or novolak) thereby forming the partition walls 15. In Step 103, the partition wall 15 underwent plasma treatment with a fluorine-based gas (typically $CF_4$) in a plasma apparatus so that its surface was rendered water repellent.

In Step S104, the hole injecting layers 26AR, 26AG, and 26AB were formed from ND1501 (polyaniline made by Nissan Chemical Industries, Ltd.) by nozzle coating in the atmosphere in such a way that the resulting coating film had a thickness of 15 nm. The coating step was followed by heat curing on a hot plate at 220° C. for 30 minutes.

In Step S105, the hole injecting layers 26AR, 26AG, and 26AB were coated by nozzle coating with a 1 wt % solution of the compound represented by the formula (1-1) dissolved in a 1:2 (by weight) mixed solvent of xylene and tetrahydrofuran (THF), so that the hole transporting layers 26BR, 26BG, and 26BB were formed on them. The hole transporting layer 26BR on the red organic EL element 20R is 50 nm thick. The hole transporting layer 26BG on the green organic EL element 20G is 30 nm thick. The hole transporting layer 26BB on the blue organic EL element 20B is 20 nm thick. The coated substrate 11 was heated at 180° C. for 30 minutes under reduced pressure for solvent evaporation.

In Step S106, the hole transporting layer 20BR of the red organic EL element 20R was coated with the red emitting layer 26CR, which was formed by nozzle coating from a solution or ink of a 2:1 (by weight) mixture of the polymeric material RPP (for red color emission) represented by the formula (3-1) containing an iridium complex and the low-molecular weight material represented for example by the formula (4-13), which is dissolved in xylene or a solvent having a higher boiling point than xylene. This coating was carried out to give a 60-nm thick film. The hole transporting layers 26BG and 26BB of the green and blue organic EL elements 20G and 20B were also coated with the green and blue emitting layers 26CG and 26CB, respectively, each of which was formed from a solution or ink of 2:1 (by weight) mixture of the polymeric material GPP (for green color emission) represented by the formula (3-2) or the polymeric material BPP (for blue color emission) represented by the formula (3-3) and the low-molecular weight material represented for example by the formula (4-13), which is dissolved in xylene or a solvent having a higher boiling point than xylene. This coating was carried out to give a 50-nm thick film. This coating process was followed by heating at 130° C. for 30 minutes under reduced pressure for solvent evaporation.

Then, the substrate 11 was placed in a vacuum deposition equipment to form the hole blocking layer 26F and additional layers thereon by vapor deposition.

In Step S201, the hole blocking layer 26F (10 nm thick) was formed by vacuum deposition from BCP represented by the formula (13), which is a phenanthroline derivative or 2,9-dimethyl-4,7-diphenyl-1,10-phenanthroline. In Step 107, the hole blocking layer 26F was coated with the electron transporting layer 26D (15 nm thick), which was formed by vacuum deposition from the organic material represented by the formula (7-17). In Step S108, the electron injecting layer 26E (0.3 nm thick) was formed from LiF by vapor deposition. In Step S109, the upper electrode 17 (100 nm thick) was formed from aluminum. Finally, the upper electrode was covered with the protective layer 30 (3 μm thick), which was formed from SiN by CVD, and then the entire surface was sealed with an epoxy resin. The thus obtained red, green, and blue organic EL elements 20R, 20G, and 20B in combination gave the full-color organic EL display device (Example 2-1).

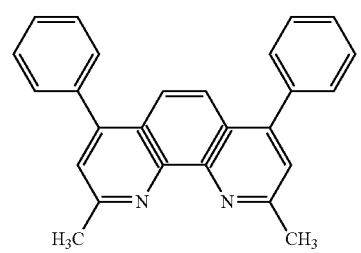

(13)

The organic EL display devices 1 and 2 produced respectively in Examples 1 and 2 were tested for the performance of the red, green, and blue organic EL elements 10R, 10G, and 10B and the red, green, and blue organic EL elements 20R, 20G, and 20B in terms of drive voltage (V) for constant current with a current density of 10 mA/cm$^2$, emission efficiency (cd/A), and chromaticity coordinates (x, y). They were also tested in terms of luminance half life (h) after DC (direct current) driving at a current density of 20 mA/cm$^2$. Incidentally, the foregoing tests were carried out at 23±0.5° C.

Table 1 shows the composition of each layer in Examples 1-1 to 1-10 and 2 and Comparative Examples 1-1 to 1-3. Table 2 shows the results of measurements in Examples 1-1 to 1-10 and 2 and Comparative Examples 1-1 to 1-3.

electron injection, with the result of Comparative Example 1-2 taken into consideration. As a result, emitting efficiency and life are improved. However, it is still poorer than the sample in Comparative Example 1-1, with its electron transporting layer producing no effect at all.

As compared with the sample in Comparative Example 1-1, the samples in Examples 1-1 to 1-10 are much improved in emitting efficiency and life. This result is due to the fact that the low-molecular weight material is incorporated into the emitting layers 16CR, 16CG, and 16CB for individual colors which are formed from the polymeric material. The low-molecular weight material lowers the barrier for electron injection from the electron transporting layer 16D (formed from a low-molecular weight material) into the

TABLE 1

| | Blue emitting layer Low-molecular weight material | Green emitting layer Low-molecular weight material | Red emitting layer Low-molecular weight material | Electron transporting hole blocking layer | Electron transporting layer | Electron injecting layer |
|---|---|---|---|---|---|---|
| Example 1-1 | Formula 4-23 | Formula 4-23 | Formula 4-23 | — | Formula 8-17 | LiF |
| Example 1-2 | Formula 5-6 | Formula 5-6 | Formula 5-6 | — | Formula 8-17 | LiF |
| Example 1-3 | Formula 6-4 | Formula 6-4 | Formula 6-4 | — | Formula 8-17 | LiF |
| Example 1-4 | Formula 7-20 | Formula 7-20 | Formula 7-20 | — | Formula 8-17 | LiF |
| Example 1-5 | Formula 8-15 | Formula 8-15 | Formula 8-15 | — | Formula 8-17 | LiF |
| Example 1-6 | Formula 9-4 | Formula 9-4 | Formula 9-4 | — | Formula 8-17 | LiF |
| Example 1-7 | Formula 10-1 | Formula 10-1 | Formula 10-1 | — | Formula 8-17 | LiF |
| Example 1-8 | Formula 11-1 | Formula 11-1 | Formula 11-1 | — | Formula 8-17 | LiF |
| Example 1-9 | Formula 12-11 | Formula 12-11 | Formula 12-11 | — | Formula 8-17 | LiF |
| Example 1-10 | Formula 5-14 | Formula 5-14 | Formula 5-14 | — | Formula 8-17 | LiF |
| Comparative Example 1-1 | — | — | — | — | — | Ba |
| Comparative Example 1-2 | — | — | — | — | Alq3 | LiF |
| Comparative Example 1-3 | — | — | — | — | Formula 8-17 | LiF |
| Example 2 | Formula 4-13 | Formula 4-13 | Formula 4-13 | BCP | Formula 8-17 | LiF |

TABLE 2

| | Blue organic EL element | | | | Green organic EL element | | | | Red organic EL element | | | |
|---|---|---|---|---|---|---|---|---|---|---|---|---|
| | Drive Voltage (V) | Efficiency (cd/A) | Chromaticity | Luminance half life (h) | Drive voltage (V) | Efficiency (cd/A) | Chromaticity | Luminance half life (h) | Drive voltage (V) | Efficiency (cd/A) | Chromaticity | Luminance Half life (h) |
| Example 1-1 | 4.6 | 5.9 | 0.14, 0.16 | 30 | 5.5 | 35.4 | 0.23, 0.66 | 70 | 6.5 | 13.1 | 0.64, 0.33 | 135 |
| Example 1-2 | 4.5 | 6.0 | 0.14, 0.16 | 33 | 5.6 | 35.7 | 0.23, 0.66 | 90 | 6.4 | 12.8 | 0.64, 0.33 | 125 |
| Example 1-3 | 4.6 | 6.1 | 0.14, 0.16 | 27 | 5.5 | 35.7 | 0.23, 0.65 | 80 | 6.6 | 12.9 | 0.64, 0.33 | 140 |
| Example 1-4 | 4.5 | 6.0 | 0.14, 0.16 | 26 | 5.5 | 36.3 | 0.23, 0.66 | 80 | 6.5 | 12.9 | 0.64, 0.33 | 138 |
| Example 1-5 | 4.4 | 6.1 | 0.14, 0.16 | 33 | 5.6 | 36.0 | 0.23, 0.66 | 80 | 6.5 | 13.1 | 0.64, 0.33 | 109 |
| Example 1-6 | 4.4 | 6.1 | 0.14, 0.16 | 30 | 5.5 | 36.0 | 0.23, 0.66 | 75 | 6.5 | 12.9 | 0.64, 0.33 | 111 |
| Example 1-7 | 4.6 | 5.9 | 0.14, 0.16 | 30 | 5.6 | 36.6 | 0.23, 0.66 | 80 | 6.4 | 12.8 | 0.64, 0.33 | 124 |
| Example 1-8 | 4.5 | 5.9 | 0.14, 0.16 | 32 | 5.5 | 37.0 | 0.23, 0.66 | 83 | 6.5 | 12.9 | 0.64, 0.33 | 128 |
| Example 1-9 | 4.4 | 5.9 | 0.14, 0.16 | 28 | 5.4 | 36.9 | 0.23, 0.66 | 85 | 6.6 | 12.6 | 0.64, 0.33 | 130 |
| Example 1-10 | 4.5 | 6.2 | 0.14, 0.16 | 26 | 5.5 | 36.6 | 0.23, 0.66 | 85 | 6.6 | 12.5 | 0.64, 0.33 | 122 |
| Comp. Example 1-1 | 6.1 | 5.2 | 0.14, 0.16 | 17 | 7.2 | 30.2 | 0.23, 0.65 | 52 | 8.2 | 10.1 | 0.64, 0.33 | 70 |
| Comp. Example 1-2 | 5.5 | 2.7 | 0.14, 0.16 | 5 | 6.5 | 20.1 | 0.23, 0.66 | 12 | 7.2 | 7.4 | 0.64, 0.33 | 15 |
| Comp. Example 1-3 | 5.0 | 4.0 | 0.14, 0.16 | 13 | 6.1 | 24.0 | 0.23, 0.66 | 30 | 7.0 | 9.3 | 0.64, 0.33 | 50 |
| Example 2 | 4.5 | 6.5 | 0.14, 0.16 | 40 | 5.6 | 41.2 | 0.23, 0.66 | 125 | 6.4 | 14.1 | 0.64, 0.33 | 150 |

The following is noted from Table 2. The sample in Comparative Example 1-1 is a related-art organic EL element which has emitting layers formed from polymeric materials only and has no electron transporting layer, whereas the sample in Comparative Example 1-2 has the electron transporting layer formed from Alq3. As the result, the latter is much poorer in emitting efficiency and life than the former. A probable reason for this is insufficient electrons injected from the upper electrode into the emitting layer. The sample in Comparative Example 1-3 has the electron transporting layer which is formed from, in place of Alq3, the material represented by formula (8-17) capable of efficient emitting layers 16CR, 16CG, and 16CB for individual colors. An additional effect is a reduction in drive voltage.

Moreover, the sample in Example 2, which has the hole blocking layer 26F, achieved improvement in emitting efficiency and life (more than twice as long as the sample in Comparative Example 1-1).

The above-mentioned effect was produced not only by the low-molecular weight material used in Examples 1-1 to 1-10 and Example 2 but also by other low-molecular weight materials represented by the formulas (4-1) to (12-29). Incidentally, in Examples 1-1 to 1-10 and Example 2, nozzle coating was used to form the hole injecting layers 16AR, 16AG, 16AB, 26AR, 26AG, 26AB, the hole transporting layers 16BR, 16BG, 16BB, 26BR, 26BG, 26BB, and the emitting layers 16CR, 16CG, 16CB, 26CR, 26CG, 26CB; however, this coating method may be replaced by any of ink jet coating, spin coating, slit coating, offset printing, flexographic printing, gravure printing, and letterpress printing. Spray coating which sprays organic EL materials through a fine mask is another way of forming the organic EL display device that produces the same effect as the sample in the foregoing examples.

The present disclosure has been described above by way of the first and second embodiments and examples, which are not intended to restrict the scope thereof. The present disclosure will be variously changed and modified within the scope thereof.

The individual layers described above are not restricted in materials, thickness, forming method, and forming conditions. Any other materials, thickness, forming method, and forming conditions may be used.

In the foregoing embodiments and examples, improvement in efficiency of electron injection was achieved by adding a low-molecular weight material to the red, green, and blue emitting layers 26CR, 26CG, and 26CB. However, the same effect can be produced by providing the hole blocking layer 26F between each of the emitting layers 26CR, 26CG, and 26CB and the electron transporting layer 26D instead of adding the low-molecular weight material.

Although the structure of the organic EL elements 10R, 10G, and 10B (or 20R, 20G, and 20B) was specifically described in the foregoing embodiments and examples, they do not necessarily need all the layers mentioned and they may have additional layers. For example, the emitting layer 16C (or 26C) may be formed by coating directly on the hole injecting layer 16A (or 26A), without the hole transporting layer 16B (or 26B) formed between them.

In the foregoing embodiments and examples, a coating method was employed to form the red, green, and blue emitting layers 16CR, 16CG, and 16CB (or 26CR, 26CG, and 26CB) for their corresponding organic EL elements 10R, 10G, and 10B (or 20R, 20G, and 20B). This method may be modified such that the blue emitting layer 16CB (or 26CB) as a common layer is formed by vapor deposition over the entire surface of the red emitting layer 16CR (or 26CR), the green emitting layer 16CG (or 26CG), and the blue hole transporting layer 16BB (or 26BB).

Moreover, in the foregoing embodiments and examples, the electron transporting layer 16D (or 26D) is a single layer formed from one species of material. However, it may be a composite layer formed from two or more different materials or laminate layer formed from different materials. In addition, the foregoing embodiments and examples are intended to show the display device equipped with the red, green, and blue organic EL elements. However, the present disclosure may be applied to a display device including blue organic EL elements and yellow organic EL elements. It may also be applied to an organic EL element emitting white color. The color of emitting light is not restricted.

Moreover, the foregoing embodiments and examples are intended to show the display device of active matrix type. However, the present disclosure may also be applied to any display device of passive matrix type. In addition, the pixel drive circuit for active matrix may have any other structure than mentioned in the foregoing embodiments and examples. It may have additional capacitor elements and transistors according to need. In this case, the modification of the pixel drive circuit may need additional drive circuits for the signal line drive circuit 120 and the scanning line drive circuit 130 mentioned above.

The present application contains subject matter related to that disclosed in Japanese Priority Patent Application JP 2010-249205 filed in the Japan Patent Office on Nov. 5, 2010, the entire content of which is hereby incorporated by reference.

What is claimed is:

1. An organic electroluminescence display device comprising:
   a substrate;
   a plurality of lower electrodes on said substrate, each lower electrode corresponding to a respective red, green or blue light organic electroluminescence element;
   a respective hole injecting layer on each lower electrode containing a first low-molecular weight material;
   a respective hole transporting layer on each hole injecting layer;
   a respective red light organic light emitting layer, green light organic light emitting layer, and blue light organic light emitting layer on each hole transporting layer and corresponding to a respective red, green or blue light organic electroluminescence element;
   an electron transporting layer formed as a common layer on said organic light emitting layers associated with said plurality of lower electrodes;
   an electron injecting layer on said electron transporting layer and formed as a layer in common to all of the light emitting layers;
   an upper electrode on said electron injecting layer and formed as a layer in common to all of the light emitting layers; and
   a respective partition wall associated with each lower electrode and being separate from said hole injecting layer, said hole transporting layer, said electron transporting layer, and said electron injecting layer, said partition wall separating said hole injecting layer, said hole transporting layer, and said organic light emitting layer for each lower electrode,
   wherein,
      each of the red light organic emitting layer, a green light organic emitting layer, and a blue light organic emitting layer comprises (a) a polymeric guest material and (b) a second low-molecular weight host material with a molecular weight from 300 to 10,000 and having an energy value of a lowest unoccupied molecular orbital (i) greater than an energy value of the lowest unoccupied molecular orbital of the red light organic emitting layer and the green light organic emitting layer and (ii) less than an energy value of the lowest unoccupied orbital layer of the electron transporting layer,
      the weight ratio range of the polymeric guest material to the second low-molecular weight host material is from 20:1 to 1:1, both inclusive,
      the electron transporting layer comprises a third low molecular weight material, and
      the first low molecular weight material can be the same as or different from the second low-molecular weight host material.

2. The organic electroluminescence display device according to claim 1, further comprising:
   a hole blocking layer between said organic light emitting layers associated with said plurality of lower electrodes and said electron injecting/transporting layer.

3. The organic electroluminescence display device according to claim 1, wherein each of said organic light emitting layers associated with said plurality of lower electrodes contains said second low-molecular weight host material together with its respective polymeric guest material and said second low-molecular weight host material is a compound having a molecular weight no lower than 300 and no higher than 10,000.

4. The organic electroluminescence display device according to claim 3, wherein said polymeric guest material and said second low-molecular weight host material contained in each of said organic light emitting layers have respective molecular weights whose ratio, of the former to the latter, is no lower than 10.

5. The organic electroluminescence display device according to claim 1, wherein said second low-molecular weight host material is a compound represented by the formula (1) below:

(1)

where A1 to A3 each represent an aromatic hydrocarbon group, a heterocyclic group, or derivatives thereof.

6. The organic electroluminescence display device according to claim 1, wherein:

said second low-molecular weight host material is a compound, which is represented by the formula (2) below:

(2)

where (a) Z represents a nitrogen-containing hydrocarbon group or a derivative thereof, (b) L1 represents a divalent group formed from one to four aromatic rings joined together or a derivative thereof, and (c) A4 and A5 each represent an aromatic hydrocarbon group or an aromatic heterocyclic group or a derivative thereof, provided that A4 and A5 may form a cyclic structure as they join together; and said second low-molecular weight host material is not a compound represented by formula 1:

(1)

where A1 to A3 each represent an aromatic hydrocarbon group, a heterocyclic group, or derivatives thereof.

7. The organic electroluminescence display device according to claim 1, wherein:

said second low-molecular weight host material is a compound which is represented by the formula (3) below:

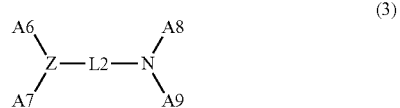

(3)

where (a) L2 represents a divalent group formed from two to six aromatic rings joined together, or a derivative thereof, (b) Z represents a nitrogen-containing hydrocarbon group or a derivative thereof, and (c) A6 to A9 each represent an aromatic hydrocarbon group or a heterocyclic group or a group formed from one to ten derivatives thereof joined together; and said second low-molecular weight host material is not a compound represented by formula 1:

(1)

where A1 to A3 each represent an aromatic hydrocarbon group, a heterocyclic group, or derivatives thereof.

8. The organic electroluminescence display device as defined in claim 1, wherein said second low-molecular host weight material is a compound represented by the formula (4) below:

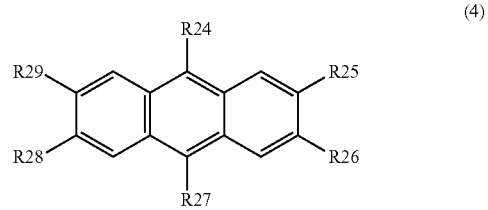

(4)

where R24 to R29 each denotes a hydrogen atom, halogen atom, hydroxyl group, cyano group, nitro group, a carbonyl group-containing group with a carbon number no larger than 20, a group having a carbonyl ester group, alkyl group, alkenyl group, or alkoxyl group, or a derivative thereof; a silyl group-containing group with a carbon number no larger than 30, a group having aryl groups, a group having heterocyclic groups, or a group having amino groups, or a derivative thereof.

9. The organic electroluminescence display device as defined in claim 1, wherein said second low-molecular weight host material is a compound represented by the formula (5) below:

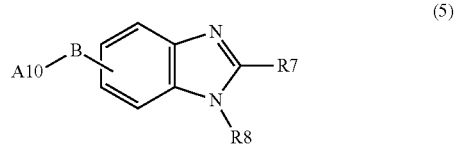

(5)

where A10 denotes a hydrogen atom, halogen atom, $C_{1-20}$ alkyl group, $C_{6-60}$ hydrocarbon group having a polycyclic aromatic hydrocarbon group formed by condensation from 3 to 40 aromatic rings, or nitrogen-containing heterocyclic group, or a derivative thereof, B denotes a single bond, or a divalent aromatic cyclic group or a derivative thereof; and R7 and R8 each independently denotes a hydrogen atom, halogen atom, $C_{1-20}$ alkyl group, $C_{6-60}$ aromatic hydrocarbon group, nitrogen-containing heterocyclic group, or $C_{1-20}$ alkoxyl group, or a derivative thereof.

10. The organic electroluminescence display device as defined in claim 1, wherein said second low-molecular weight host material is a compound represented by the formula (6) below:

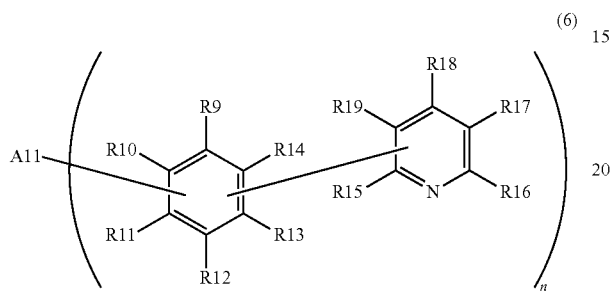

where A11 denotes an n-valent group formed by condensation from two to five aromatic rings, typically n-valent acene aromatic ring formed by condensation from three aromatic rings, or a derivative thereof; R9 to R14 each independently denotes a hydrogen atom, halogen atom, or a free valance linking to any one of A11 or R15 to R19; R15 to R19 each independently denotes a hydrogen atom, halogen atom, or a free valance linking to any one of R9 to R14; and n is an integer of 2 or above, with then pyridylphenyl groups being identical or different.

11. The organic electroluminescence display device as defined in claim 1, wherein said second low-molecular weight host material is a compound represented by the formula (7) below:

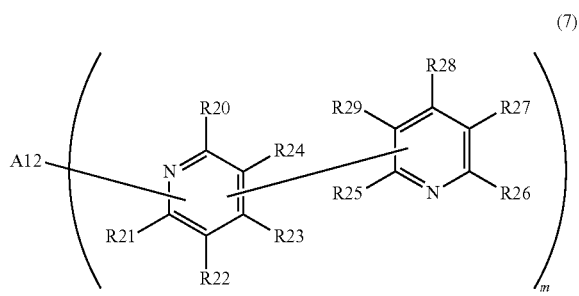

where A12 denotes an m-valent group formed by condensation from two to five aromatic rings, typically m-valent acene aromatic ring formed by condensation from three aromatic rings, or a derivative thereof; R20 to R24 each independently denotes a hydrogen atom, halogen atom, or a free valance linking to any one of A12 or R25 to R29; R25 to R29 each independently denotes a hydrogen atom, halogen atom, or a free valance linking to any one of R20 to R24; and m is an integer of 2 or above, with the m bipyridyl groups being identical or different.

12. The organic electroluminescence display device as defined in claim 1, wherein said second low-molecular weight host material is a compound represented by the formula (8) below:

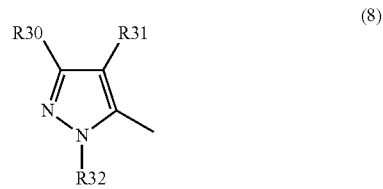

where R30 to R32 each denotes a hydrogen atom, an aromatic hydrocarbon group formed by condensation from one to three aromatic rings or a derivative thereof, an aromatic hydrocarbon group formed by condensation from one to three aromatic rings each having $C_{1-6}$ hydrocarbon groups or a derivative thereof, or an aromatic hydrocarbon group formed by condensation from one to three aromatic rings each having $C_{6-12}$ aromatic hydrocarbon groups or a derivative thereof.

13. The organic electroluminescence display device as defined in claim 1, wherein said second low-molecular weight host material is one which contains as a metal element capable of forming a complex one species selected from beryllium (Be), boron (B), zinc (Zn), cadmium (Cd), magnesium (Mg), gold (Au), silver (Ag), palladium (Pd), platinum (Pt), aluminum (Al), gadolinium (Ga), yttrium (Y), scandium (Sc), ruthenium (Ru), rhodium (Rh), osmium (Os), and iridium (Ir).

14. The organic electroluminescence display device according to claim 2, wherein said hole blocking layer is formed from a compound which has an electron mobility no lower than $1.0 \times 10^{-6}$ cm²/Vs and no higher than $1.0 \times 10^{-1}$ cm²/Vs.

15. The organic electroluminescence display device according to claim 2, wherein said hole blocking layer has an energy gap no lower than 3.0 and no higher than 3.8 between highest occupied molecular orbital and lowest unoccupied molecular orbital.

16. The organic electroluminescence display device according to claim 1, wherein said organic electroluminescence element is one of a red organic electroluminescence element, a green organic electroluminescence element, a blue electroluminescence element, a yellow organic electroluminescence element, and a white organic electroluminescence element.

17. The organic electroluminescence display device according to claim 1, wherein said partition wall includes a first portion made of an insulating material and a second portion made of a photosensitive resin.

18. The organic electroluminescence display device according to claim 1, wherein said partition wall is formed such that said partition wall demarcates an emission region of said organic electroluminescence element.

19. The organic electroluminescence display device according to claim 18, wherein said partition wall surrounds said emission region.

20. The organic electroluminescence display device according to claim 1, wherein each of said first low molecular weight host material and said second low molecular weight host material has a molecular weight no greater than 10,000.

21. The organic-electroluminescence display device of claim 1, wherein the electron transporting layer has an electron mobility of no lower than $10^{-6}$ cm$^2$/Vs and no higher than $1.0 \times 10^{-1}$ cm$^2$/Vs.

\* \* \* \* \*